(12) United States Patent
Lakoduk et al.

(10) Patent No.: US 8,714,667 B2
(45) Date of Patent: May 6, 2014

(54) CONFIGURABLE ENCLOSURE FOR ELECTRONICS COMPONENTS

(75) Inventors: Harold Dean Lakoduk, Ramsey, MN (US); Scott Allen Schramske, Shoreview, MN (US); Tim Gordon Lange, Champlin, MN (US); Kent Gregory Messing, Elk River, MN (US); Ronald Mathew Wacker, Foreston, MN (US); Robert Marvin Kalstabakken, Cambridge, MN (US); Steve Jerome Johnson, Mahtomedi, MN (US); Sheldon Odell Modrow, Champlin, MN (US); Joseph David Ricke, Arden Hills, MN (US)

(73) Assignee: Hoffman Enclosures, Inc., Anoka, MN (US)

( * ) Notice: Subject to any disclaimer, the term of this patent is extended or adjusted under 35 U.S.C. 154(b) by 75 days.

(21) Appl. No.: 12/243,858

(22) Filed: Oct. 1, 2008

(65) Prior Publication Data

US 2009/0134755 A1 May 28, 2009

Related U.S. Application Data

(60) Provisional application No. 60/976,573, filed on Oct. 1, 2007.

(51) Int. Cl.
*A47B 47/00* (2006.01)
(52) U.S. Cl.
USPC .......................... 312/263; 312/265.5; 312/310
(58) Field of Classification Search
USPC ........ 312/265.1–265.6, 263, 223.2, 310, 291, 312/293.1–293.2; 211/26
See application file for complete search history.

(56) References Cited

U.S. PATENT DOCUMENTS

| | | | |
|---|---|---|---|
| 2,148,449 A | | 2/1939 | Edwards |
| 2,877,919 A | | 3/1959 | Kobryner |
| 3,188,524 A | * | 6/1965 | Williams ...................... 361/724 |
| 3,654,663 A | | 4/1972 | Algotsson |
| 3,725,746 A | * | 4/1973 | Carroll .......................... 361/624 |
| 3,912,348 A | | 10/1975 | Seymour |
| 4,263,472 A | | 4/1981 | Maheu |
| 4,603,452 A | | 8/1986 | Paciorek |
| 5,001,602 A | * | 3/1991 | Suffi et al. ...................... 361/724 |
| 5,170,550 A | | 12/1992 | Cox et al. |
| 5,272,279 A | | 12/1993 | Filshie |

(Continued)

FOREIGN PATENT DOCUMENTS

| | | | |
|---|---|---|---|
| DE | 29805374 U1 | 9/1999 | |
| DE | 102006020504 | 10/2007 | |
| EP | 0951120 | 10/1999 | |
| WO | WO 2005034302 A2 * | 4/2005 | ............... H02B 1/01 |

*Primary Examiner* — Hanh V Tran
(74) *Attorney, Agent, or Firm* — Quarles & Brady LLP

(57) ABSTRACT

Enclosures for electronic components and methods for manufacturing the same are shown. In one embodiment, the enclosure includes a first sidewall, a second sidewall, a third sidewall, and a fourth sidewall defining an interior space of the enclosure. A first mounting channel and a second mounting channel can be coupled to each one of the first sidewall, the second sidewall, the third sidewall, and the fourth sidewall. A side channel can be removably coupled to the first mounting channel and the second mounting channel. A mounting panel can be removably coupled to the side channel, the mounting panel providing a flat surface extending away from the side channel towards a sidewall opposite a sidewall nearest the side channel and adapted to support electronic components.

13 Claims, 54 Drawing Sheets

(56) References Cited

U.S. PATENT DOCUMENTS

| | | | | |
|---|---|---|---|---|
| 5,329,086 | A | 7/1994 | De Matteis et al. | |
| 5,364,178 | A * | 11/1994 | Hofman et al. | 312/263 |
| 5,419,629 | A | 5/1995 | Korinsky | |
| D360,345 | S | 7/1995 | Swan et al. | |
| 5,509,703 | A | 4/1996 | Lau et al. | |
| 5,545,841 | A | 8/1996 | Wilfinger et al. | |
| 5,568,362 | A | 10/1996 | Hansson | |
| 5,664,448 | A | 9/1997 | Swan et al. | |
| 5,769,006 | A | 6/1998 | Allaer | |
| 5,894,106 | A | 4/1999 | Schwenk et al. | |
| 5,944,209 | A | 8/1999 | Daoud | |
| 6,005,188 | A | 12/1999 | Teichler et al. | |
| 6,036,290 | A * | 3/2000 | Jancsek et al. | 312/265.4 |
| 6,044,193 | A * | 3/2000 | Szentesi et al. | 385/134 |
| 6,091,024 | A | 7/2000 | Korhonen | |
| 6,101,773 | A | 8/2000 | Chau et al. | |
| 6,107,567 | A | 8/2000 | Blalock | |
| 6,111,195 | A | 8/2000 | Hand et al. | |
| 6,114,624 | A | 9/2000 | Ghafourlan et al. | |
| 6,121,549 | A | 9/2000 | Korhonen | |
| 6,123,400 | A * | 9/2000 | Nicolai et al. | 312/265.1 |
| 6,155,434 | A * | 12/2000 | Benner et al. | 211/26.2 |
| 6,179,144 | B1 | 1/2001 | Abroy et al. | |
| 6,185,098 | B1 * | 2/2001 | Benavides | 312/265.5 |
| 6,202,860 | B1 * | 3/2001 | Ludwig | 211/26 |
| 6,206,494 | B1 | 3/2001 | Benner et al. | |
| 6,238,029 | B1 * | 5/2001 | Marzec et al. | 312/265.3 |
| 6,283,565 | B1 * | 9/2001 | Kohler et al. | 312/326 |
| 6,285,565 | B1 | 9/2001 | Aberg et al. | |
| 6,291,767 | B1 | 9/2001 | Beecher, II et al. | |
| 6,348,655 | B1 | 2/2002 | Wright | |
| 6,373,721 | B2 * | 4/2002 | Lecinski et al. | 361/826 |
| 6,374,912 | B1 | 4/2002 | LaGrotta et al. | |
| 6,431,668 | B1 * | 8/2002 | Reddicliffe | 312/334.5 |
| 6,452,805 | B1 | 9/2002 | Franz et al. | |
| 6,467,640 | B1 | 10/2002 | Hung | |
| 6,469,247 | B1 | 10/2002 | Dodds et al. | |
| 6,513,770 | B1 | 2/2003 | Franz et al. | |
| 6,561,602 | B1 * | 5/2003 | Sevier et al. | 312/265.1 |
| 6,580,030 | B1 | 6/2003 | Horne | |
| 6,642,446 | B2 | 11/2003 | Dodds et al. | |
| 6,727,429 | B1 | 4/2004 | Koessler | |
| 6,769,551 | B2 * | 8/2004 | Rafferty et al. | 211/26 |
| 6,788,786 | B1 * | 9/2004 | Kessler et al. | 379/413.04 |
| 6,808,240 | B2 * | 10/2004 | Altena | 312/265.4 |
| 6,814,417 | B2 * | 11/2004 | Hartel | 312/265.2 |
| 6,838,616 | B2 | 1/2005 | Harrison et al. | |
| 6,842,349 | B2 | 1/2005 | Wrycraft et al. | |
| 6,929,336 | B2 | 8/2005 | Liu et al. | |
| 6,964,463 | B1 * | 11/2005 | Hindle et al. | 312/291 |
| 7,109,414 | B2 | 9/2006 | Reynolds | |
| 7,179,991 | B2 | 2/2007 | Chen et al. | |
| 7,188,916 | B2 | 3/2007 | Silvestro et al. | |
| 7,205,475 | B2 | 4/2007 | Jiang et al. | |
| 7,378,591 | B2 | 5/2008 | Dinh | |
| 2006/0157264 | A1 | 7/2006 | Cardenas et al. | |
| 2006/0185875 | A1 | 8/2006 | Habel et al. | |
| 2006/0191697 | A1 | 8/2006 | Cardenas et al. | |
| 2006/0231278 | A1 | 10/2006 | Cardenas | |
| 2006/0254795 | A1 | 11/2006 | Thrift et al. | |
| 2007/0175648 | A1 | 8/2007 | Francisquini | |
| 2007/0181328 | A1 | 8/2007 | Dinh | |

* cited by examiner

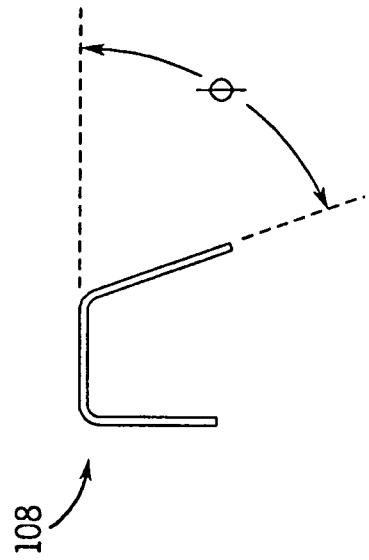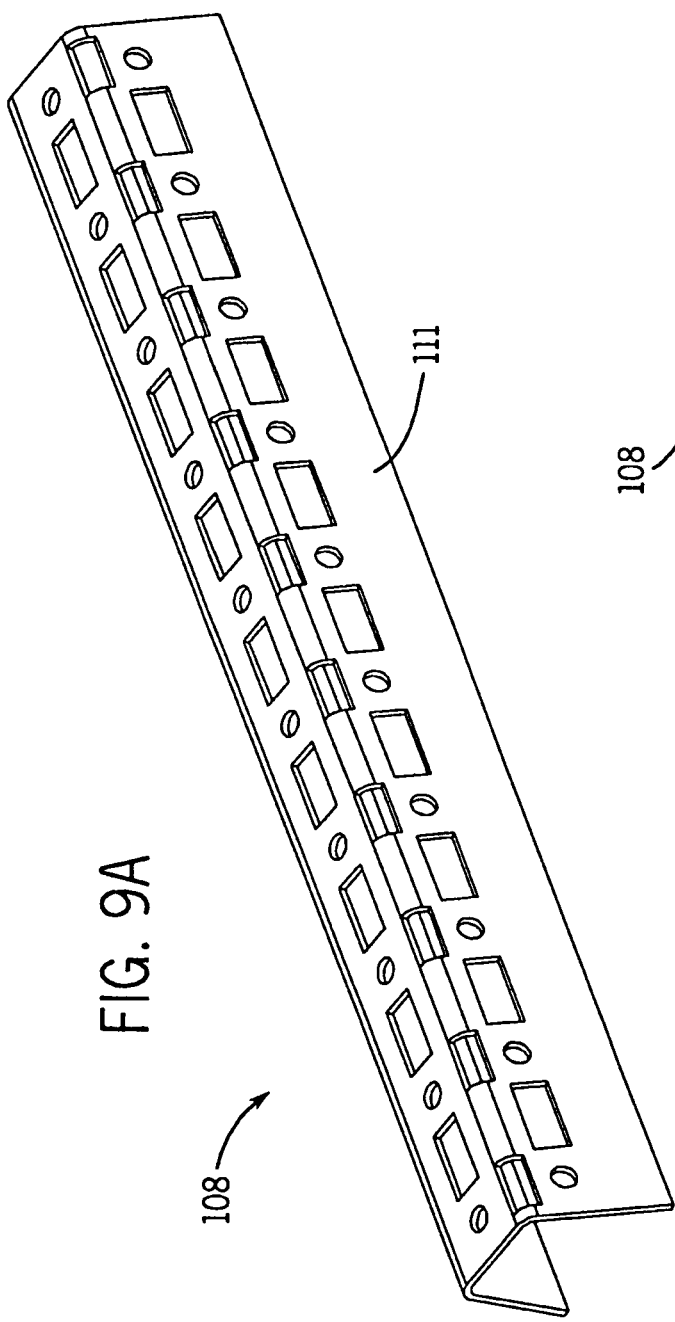

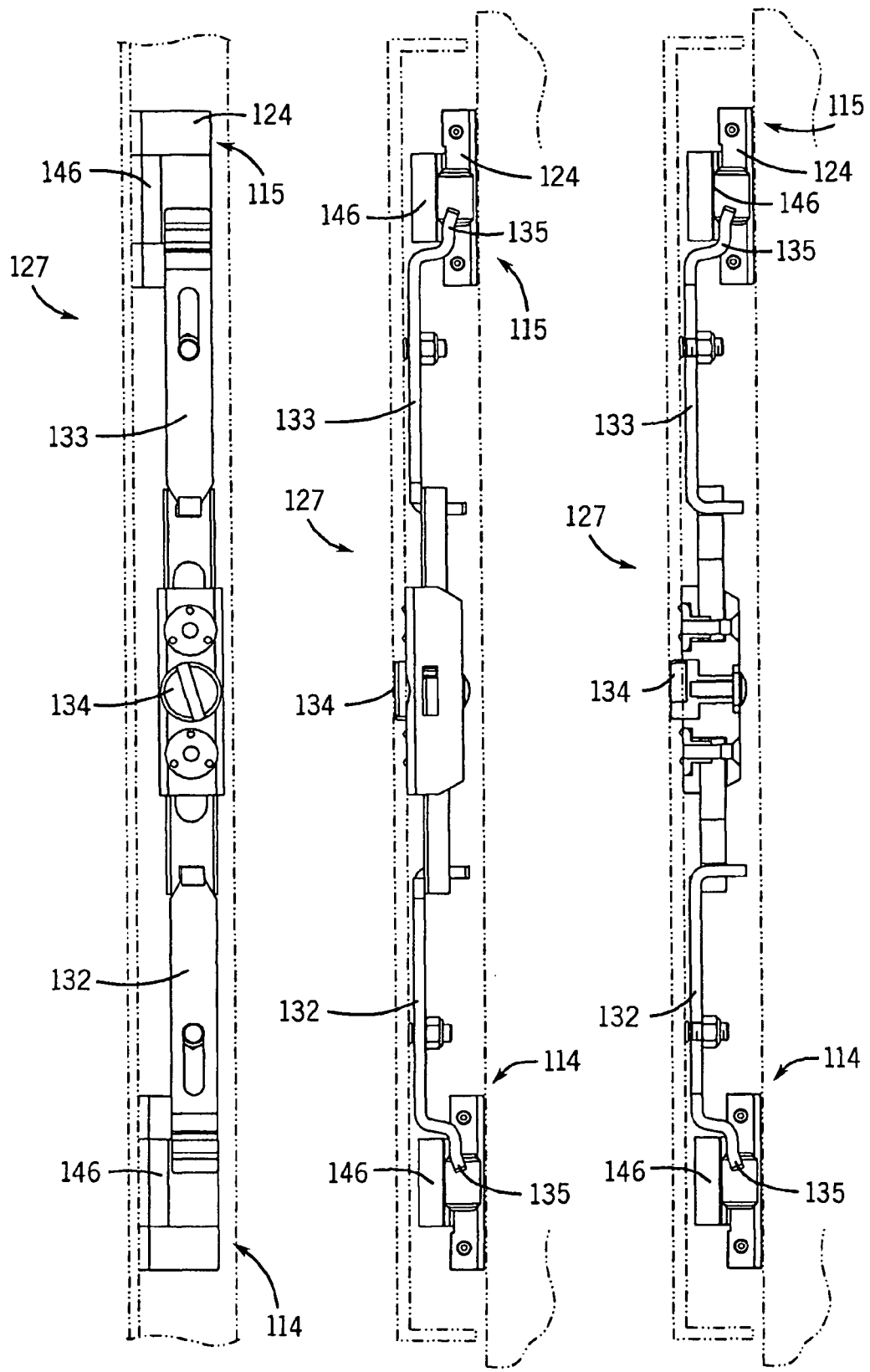

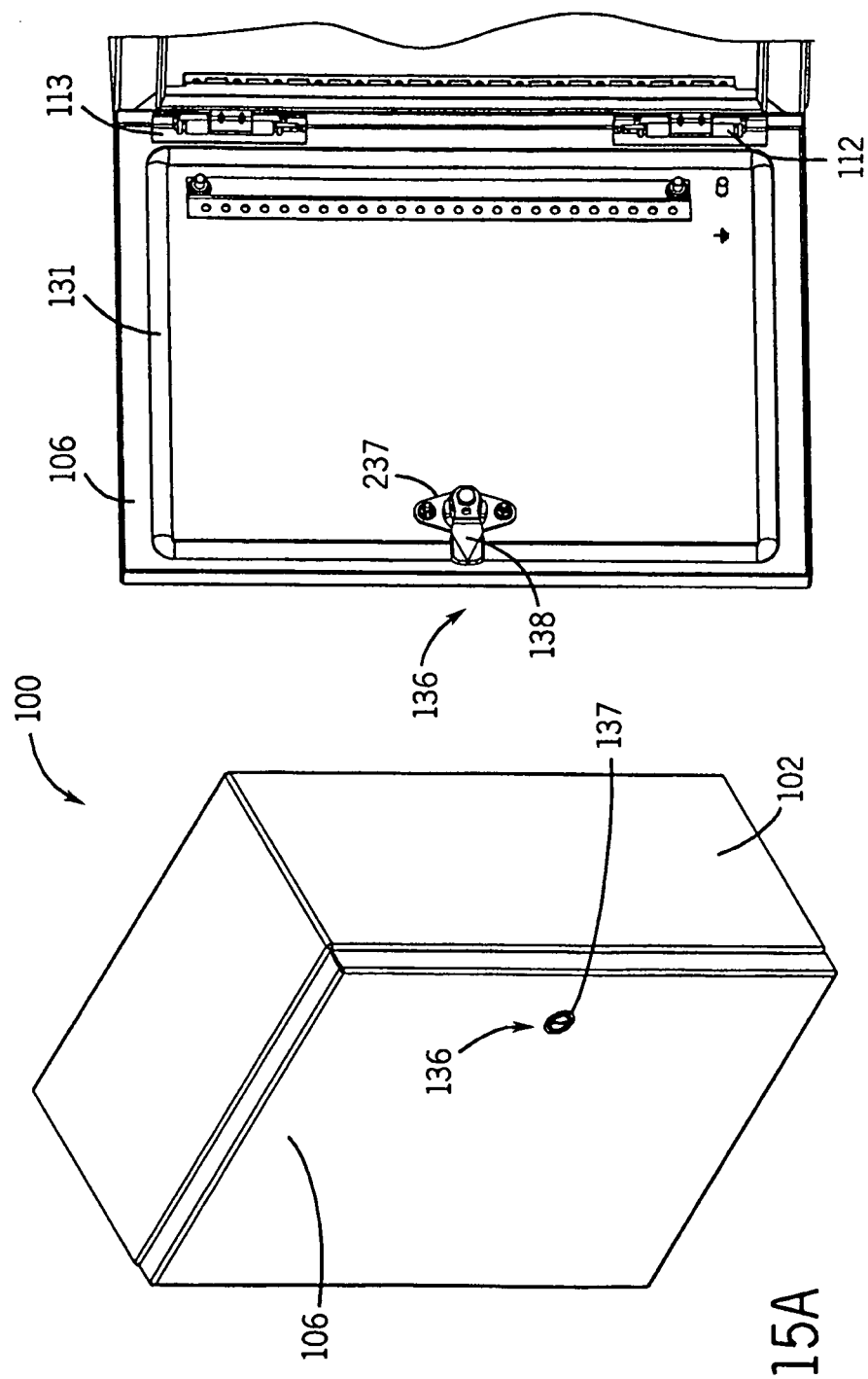

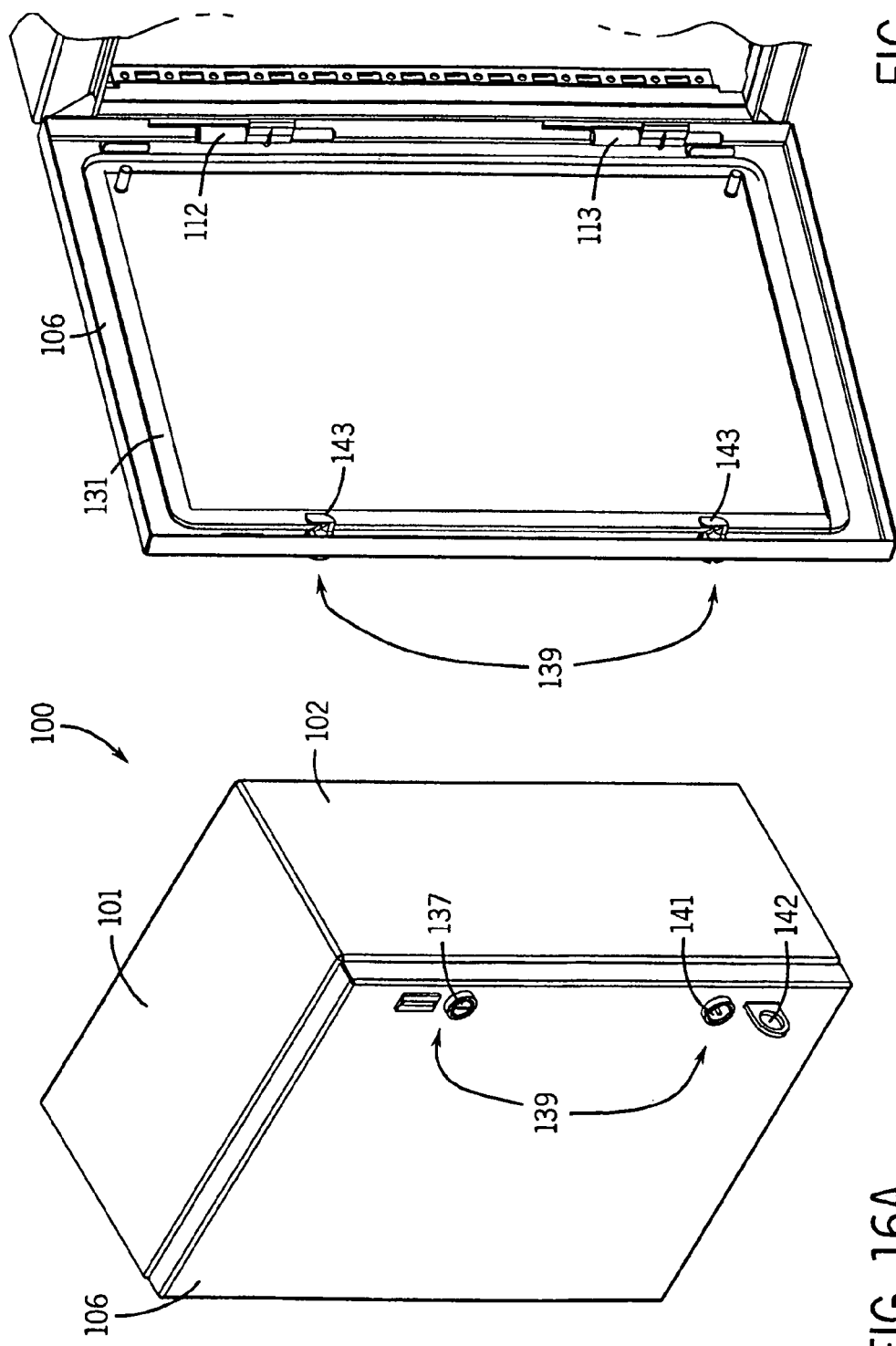

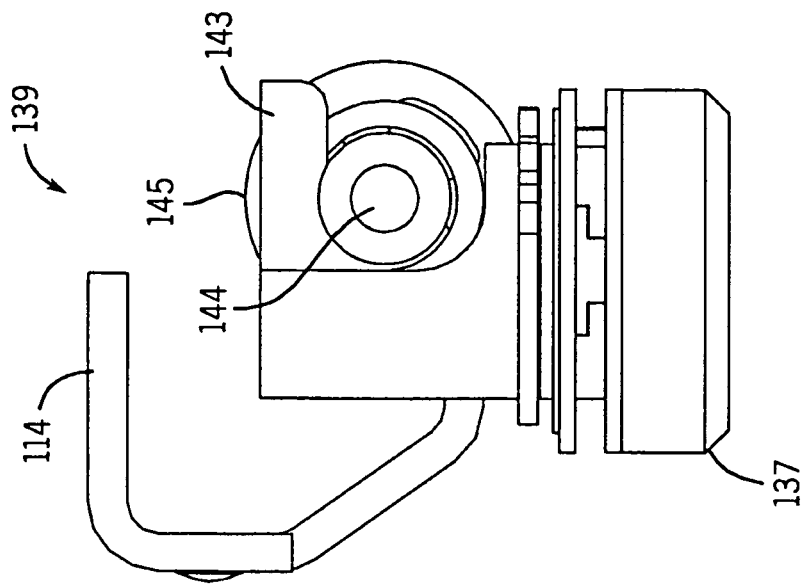
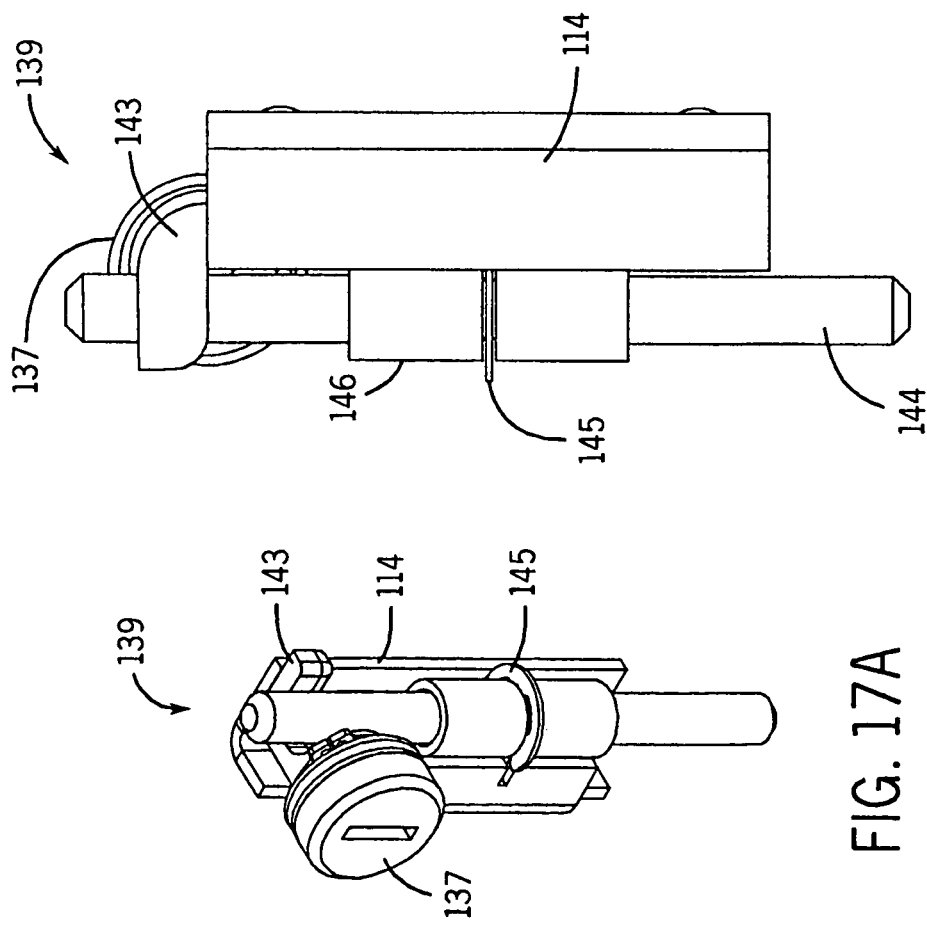

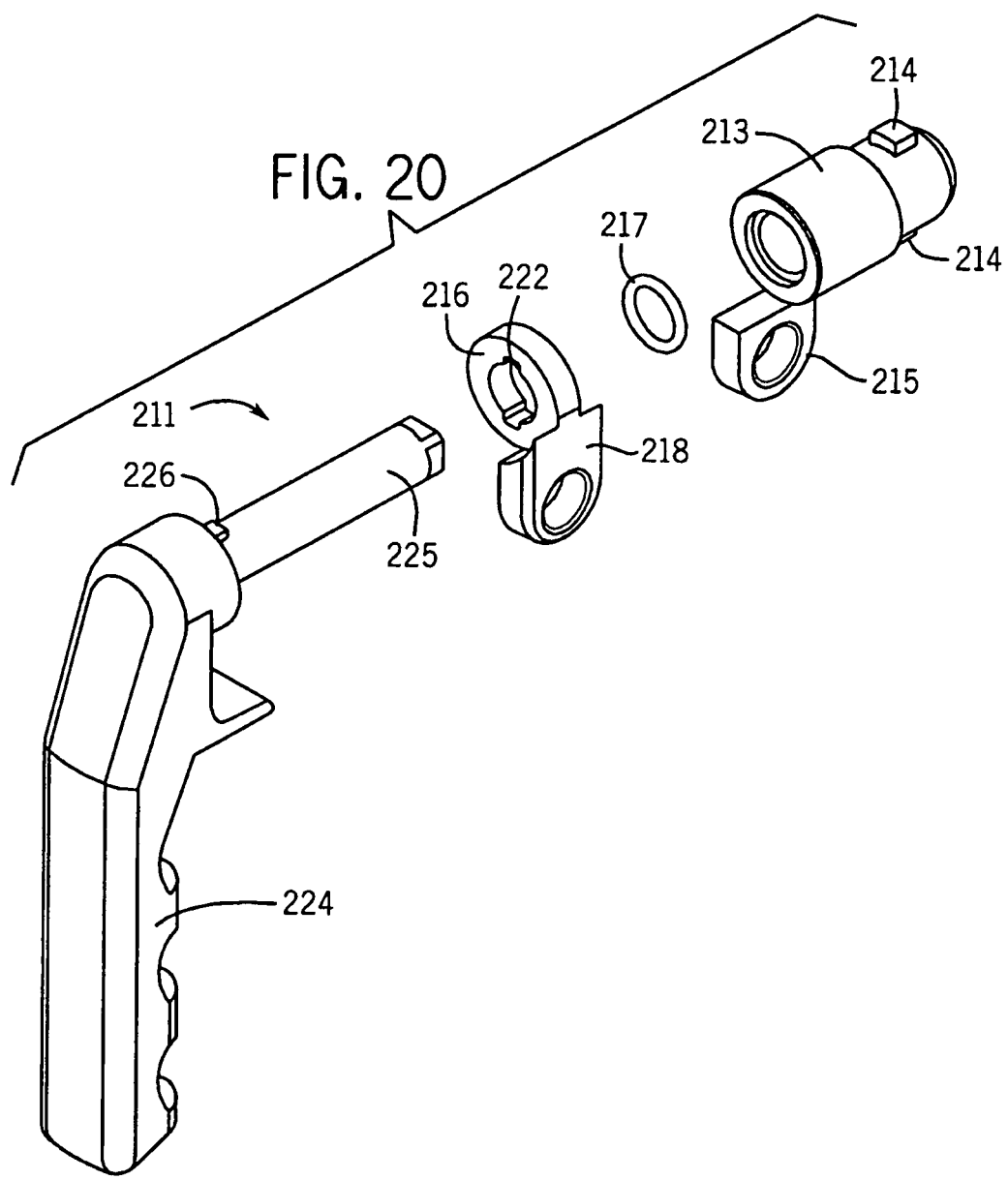

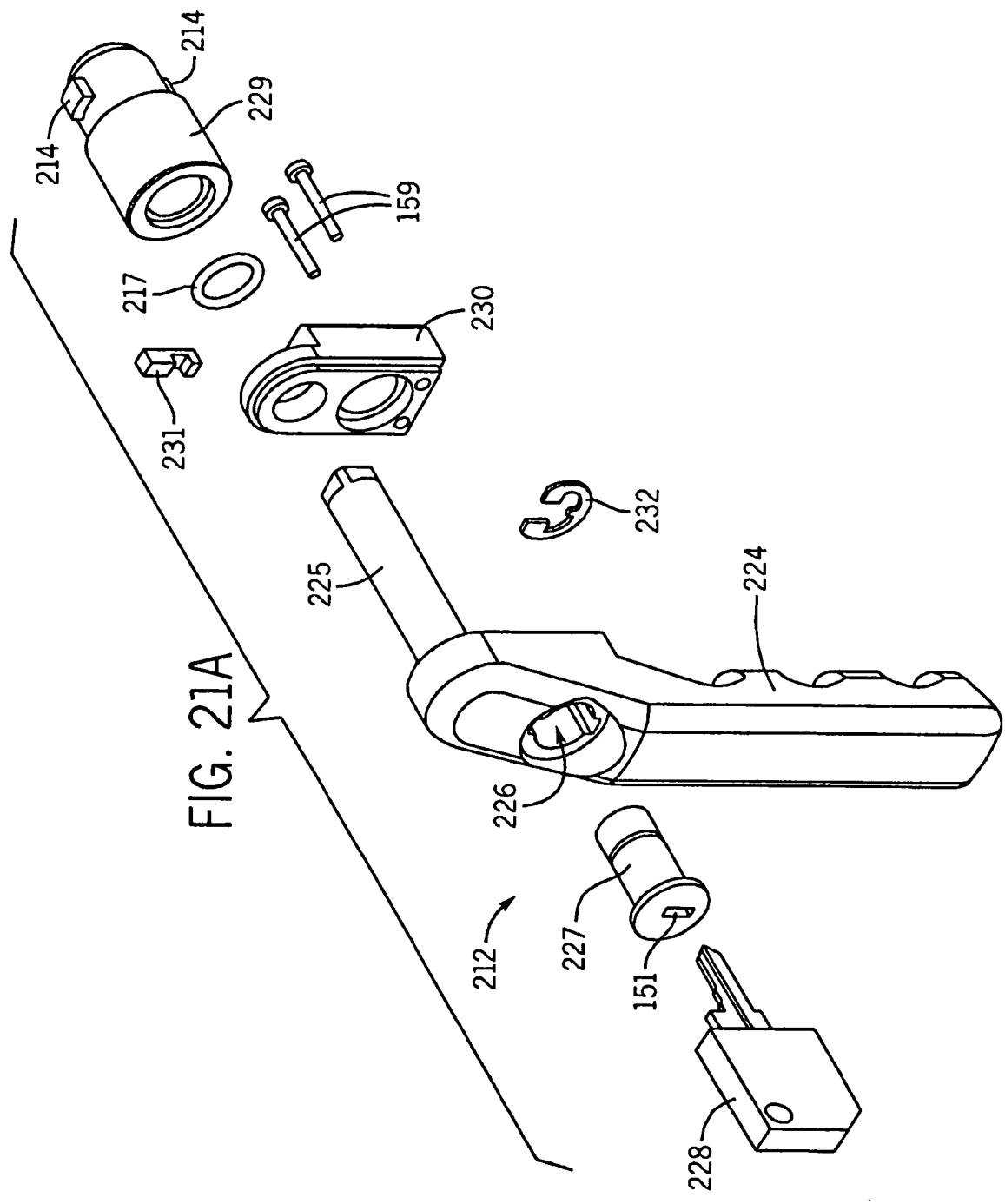

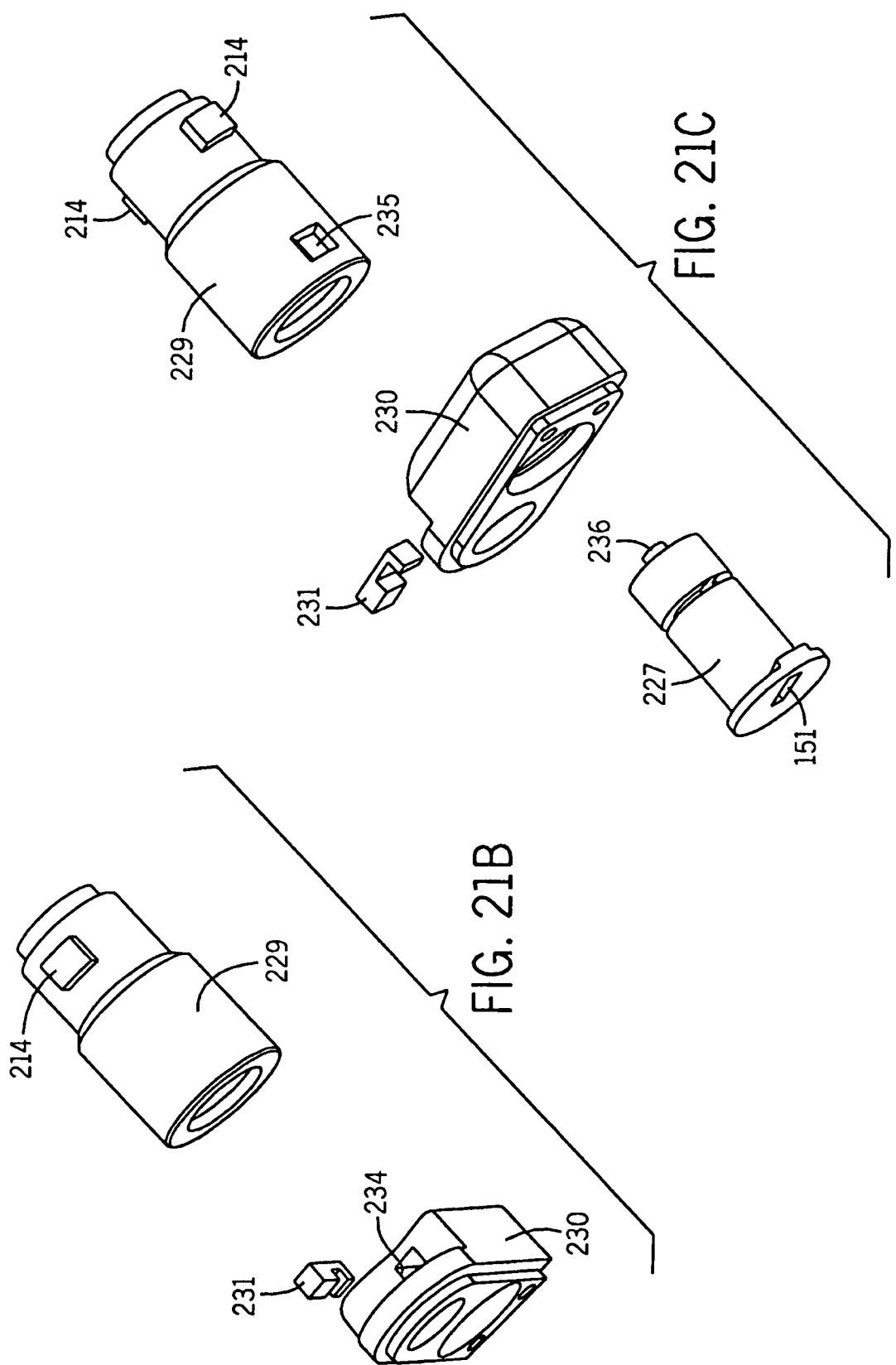

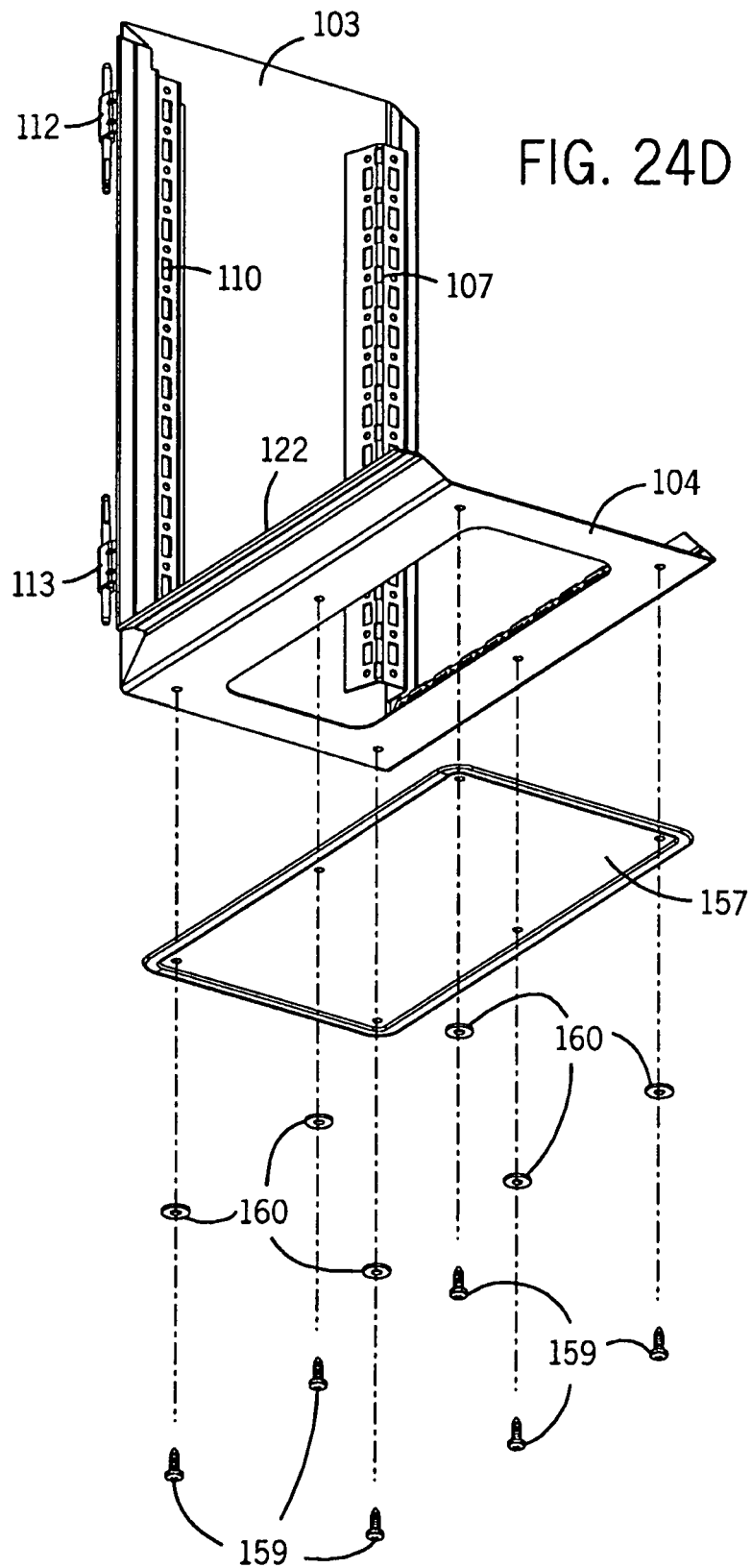

CONFIGURABLE ENCLOSURE FOR ELECTRONICS COMPONENTS

RELATED APPLICATIONS

This application claims priority to U.S. Provisional Application No. 60/976,573 filed on Oct. 1, 2007. The entire disclosure of the prior application is considered part of the accompanying application and is hereby incorporated therein by reference.

BACKGROUND

In the field of electronics enclosures, conventional methods of manufacturing the enclosures often result in a substantial amount of leftover and wasted scrap metal. FIG. 1 illustrates a sheet of sheet metal 50 prior to being cut and formed into an enclosure. One of the more common conventional methods of manufacture involves first cutting the sheet metal 50 into a "cross" shape and then forming the enclosure therefrom. For example, in FIG. 1, the cross shape is formed by cutting sections A, C, G, and I out of sheet metal 50. Thereafter, sections B, D, F, and H are folded up to form the sidewalls of the enclosure, with section E serving as the backwall. Sections A, C, G, and I are therefore scrap and likely thrown away. Thus, using this method, as much as 4/9 (or approximately 44%) of the original piece of sheet metal 50 is tossed aside as scrap.

In addition to inefficient methods of manufacture, conventional "off-the-shelf" enclosures themselves generally do not allow for convenient configuration or customization. For example, most enclosures typically consist of a box having five fixed walls and a door. Thus, a user with particular needs is faced with essentially two options: (1) special-order a custom enclosure from a manufacturer, or (2) modify a stock enclosure to suit the user's needs. Special-ordering custom enclosures can be undesirable from a cost standpoint, as most manufacturers charge a premium for custom orders.

Modifying a stock enclosure is not ideal either. For instance, in order to mount electronics within a stock enclosure, the user is typically required to drill holes or cut openings into the enclosure and then mount the electronics with a combination of nuts, bolts, and standoffs. Drilling or cutting openings into the enclosures is often undesirable because it creates a security vulnerability in the enclosure and compromises the structural integrity of the enclosure in general. Moreover, some outdoor applications require the enclosure to be watertight. Cutting and drilling into the enclosure simply adds more openings through which water may leak that therefore require sealing.

Thus, conventional electronics enclosures do not provide for convenient configurability while at the same time maintaining structural integrity.

SUMMARY

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

Described herein is technology for, among other things, enclosures for electronic components and methods for manufacturing the same. In one embodiment, the enclosure includes first and second sidewalls formed from a single elongated piece of sheet metal. The first sidewall, the second sidewall, a third sidewall, and a fourth sidewall define an interior space of the enclosure. At least one of the first and second sidewalls includes an edge region folded inwardly relative to the interior space to form a mounting channel. The enclosure further includes a backwall coupled with first edges of the sidewalls and a door hingedly coupled with a second edge of at least one of the sidewalls.

BRIEF DESCRIPTION OF THE DRAWINGS

The accompanying drawings, which are incorporated in and form a part of this specification, illustrate embodiments of the invention and, together with the description, serve to explain the principles of embodiments of the invention:

FIG. 9A is an perspective view of a mounting channel.

FIG. 9B is an end view of the mounting channel of FIG. 9A.

FIG. 14A is a top view of a latching mechanism in the locked position.

FIG. 14B is a side view of the latching mechanism of FIG. 14A in the locked position.

FIG. 14C is a side view of the latching mechanism of FIGS. 14A-14B in the unlocked position.

FIG. 15A is a perspective view the enclosure of FIG. 8 including an alternative latching mechanism, in accordance with various embodiments of the invention.

FIG. 15B is an perspective view of the latching mechanism as depicted in FIG. 15A.

FIG. 16A is a perspective view the enclosure of FIG. 8 having another alternative latching mechanism, in accordance with various embodiments of the invention.

FIG. 16B is an perspective view of the latching mechanism as depicted in FIG. 16A.

FIG. 17A is an perspective view of the latching mechanism of FIGS. 16A-16E.

FIG. 17B is a side view of the latching mechanism of FIGS. 16A-17A.

FIG. 17C is a top view of the latching mechanism of FIGS. 16A-17B.

FIG. 20 is an exploded parts view of another alternative locking mechanism, in accordance with various embodiments of the invention.

FIG. 21A is an exploded parts view of another alternative locking mechanism, in accordance with various embodiments of the invention.

FIG. 21B is first perspective views of some parts of the locking mechanism of FIG. 21A.

FIG. 21C is second perspective views of some parts of the locking mechanism of FIG. 21A.

FIG. 24D is an exploded parts view of the gland plate of FIGS. 24A-24C.

DETAILED DESCRIPTION

Figure 1:
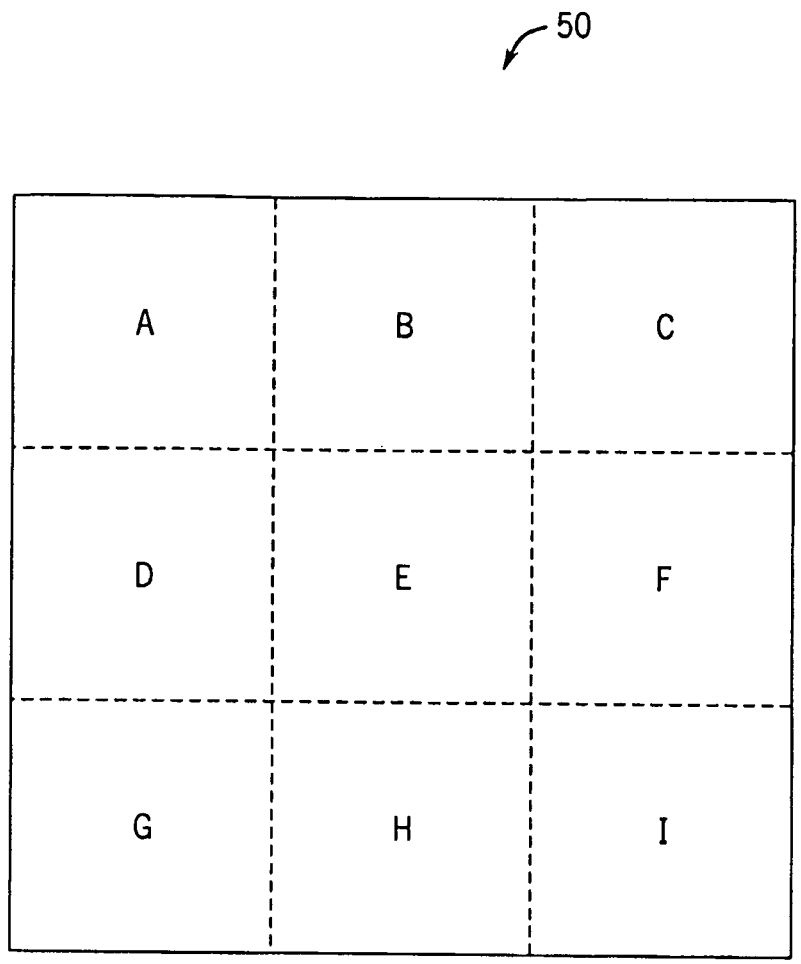
FIG. 1 is a schematic illustration of a sheet of sheet metal prior to being cut and formed by conventional methods into an enclosure.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

Generally speaking, embodiments of the invention provide for highly configurable electronics enclosures and methods for manufacturing the same. The enclosures in accordance with various embodiments include one or more built-in mounting channels, which may be used to mount electronic components or additional mounting devices at various locations within the enclosure. A given mounting channel may be formed from the same piece of sheet metal as the adjacent sidewall, for example, by folding an edge region of the sheet metal back over itself.

FIGS. 2-7 illustrate various steps throughout a process for manufacturing an enclosure 10 for electronic components, in accordance with various embodiments of the invention. While various steps are illustrated in FIGS. 2-7, such steps are exemplary. Moreover, even though the steps of FIGS. 2-7 may be described in a particular order, such order is also exemplary. Thus, processes in accordance with embodiments of the invention may be performed which include additional steps not described herein, which exclude one or more of the steps described herein, or which perform the steps described in different orders.

Figure 2:
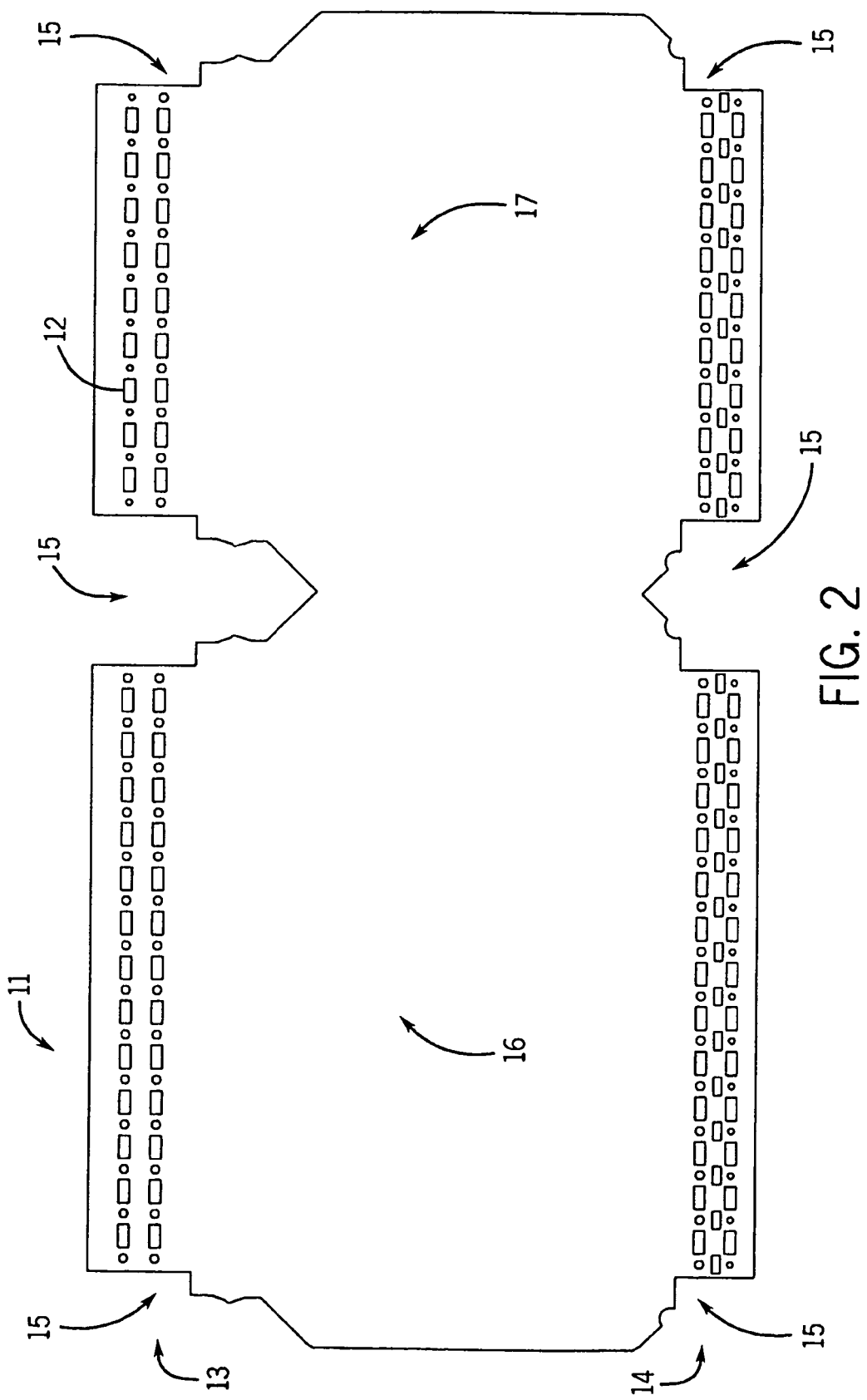
FIG. 2 is a top view of a piece of sheet metal having a plurality of notches and apertures formed in edge regions thereof, in accordance with various embodiments of the invention.
Figure 3:
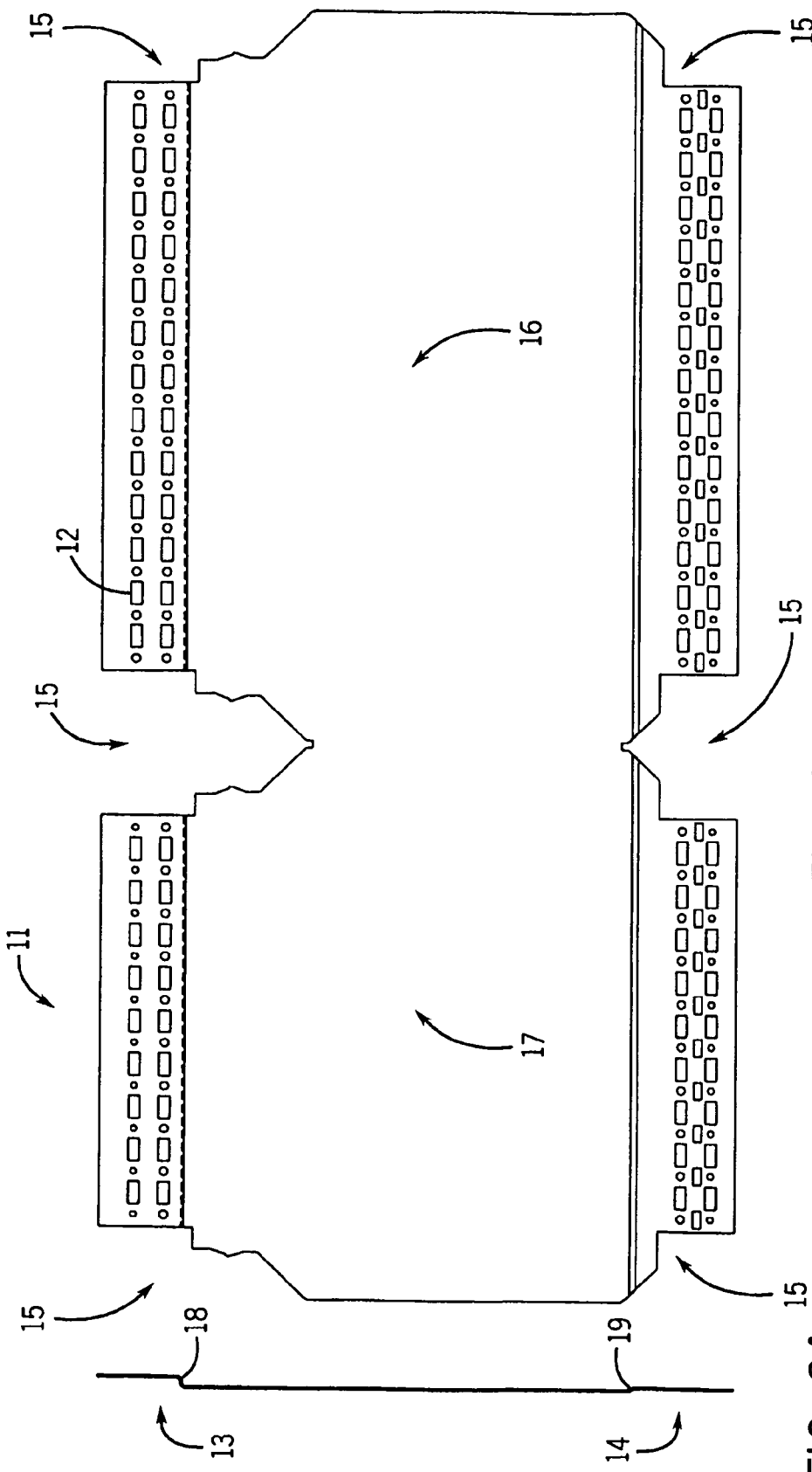
FIG. 3A is a side view of the sheet metal from FIG. 2 including first and second folds.
FIG. 3B is a top view of the sheet metal from FIG. 2 including first and second folds.
Figure 4:
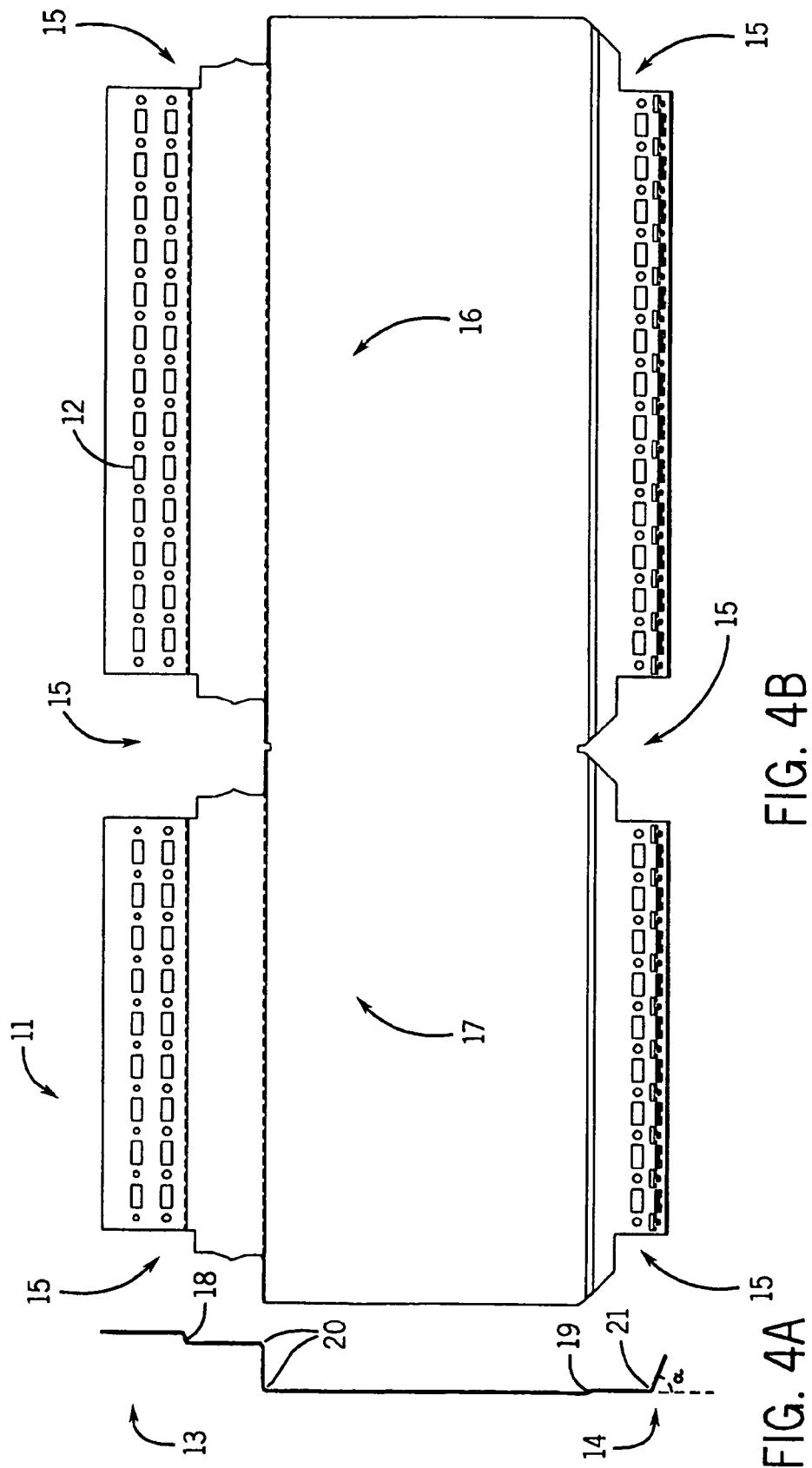
FIG. 4A is a side view of the sheet metal from FIG. 3 including third and fourth folds.
FIG. 4B is a top view of the sheet metal from FIG. 3 including third and fourth folds.
Figure 5:
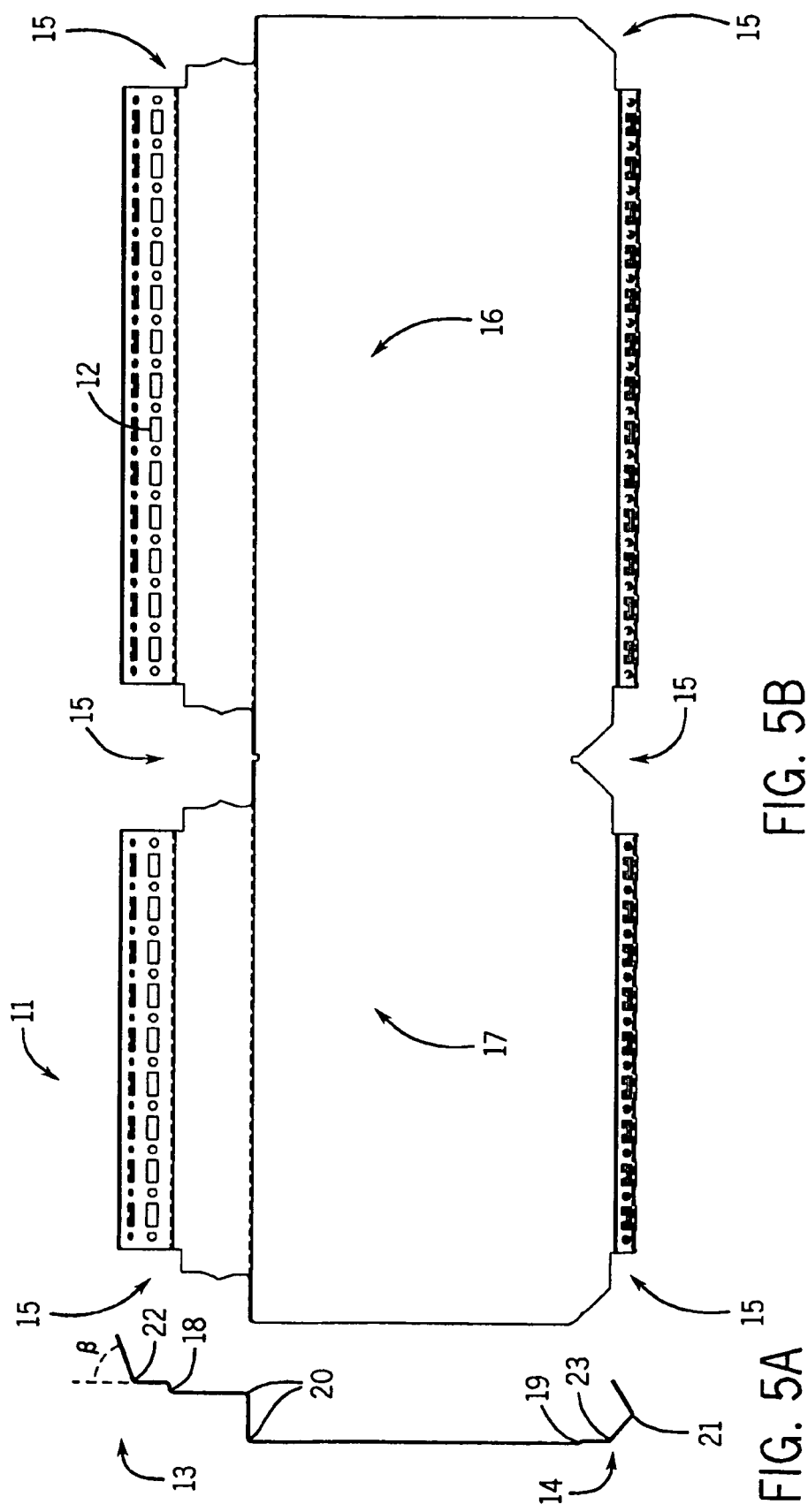
FIG. 5A is a side view of the sheet metal from FIG. 4 including fifth and sixth folds.
FIG. 5B is a top view of the sheet metal from FIG. 4 including fifth and sixth folds.
Figure 6:
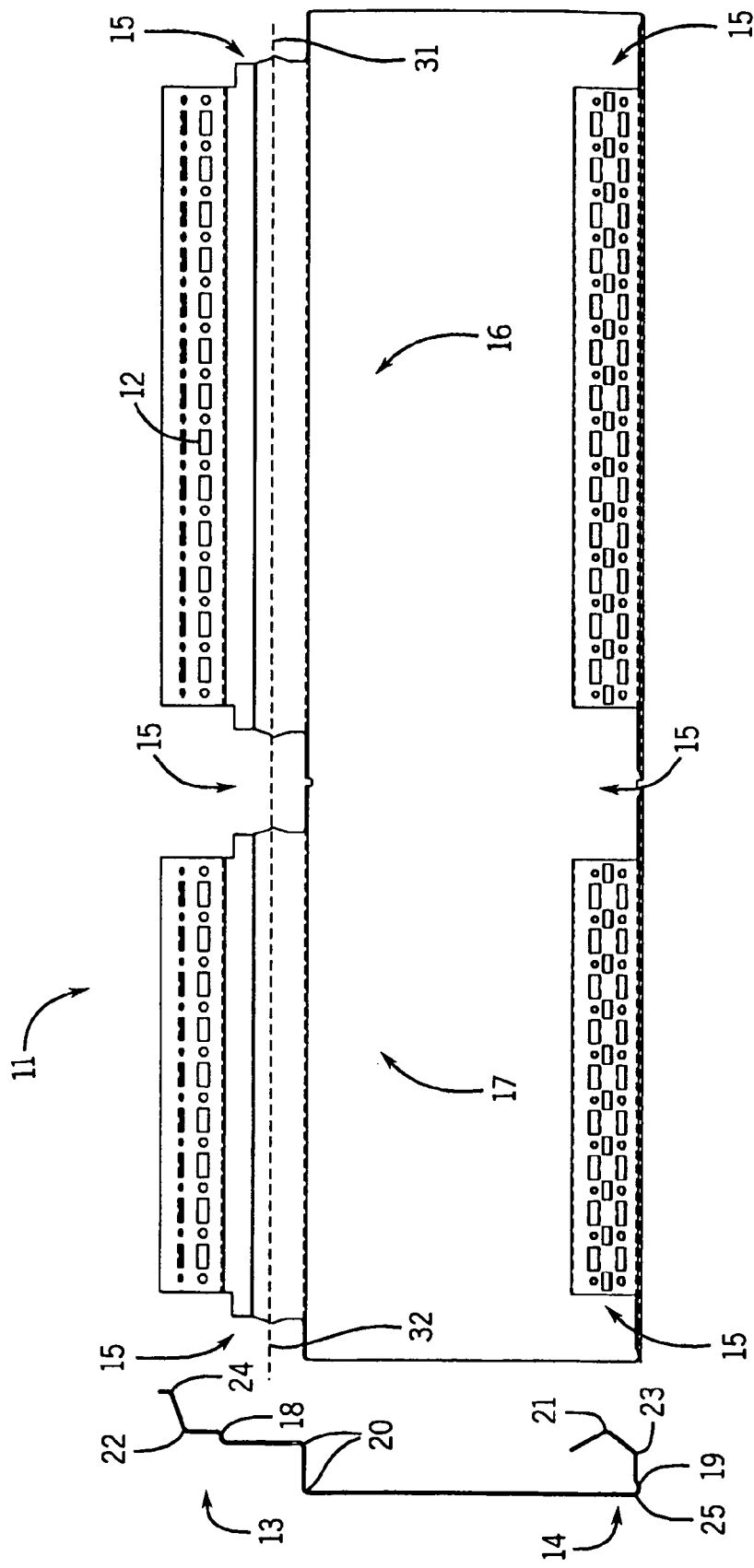
FIG. 6A is a side view of the sheet metal from FIG. 5 including seventh and eighth folds.
FIG. 6B is a top view of the sheet metal from FIG. 5 including seventh and eighth folds.

First referring to FIG. 2, an elongated piece of sheet metal 11 is depicted therein. In preparation of forming the sheet metal 11 into the enclosure 10, various apertures 12 of different shapes and sizes are formed in one or more edge regions 13, 14 of the sheet metal 11. The apertures 12 can eventually serve as mounting locations along a mounting channel 27, 28, 29, 30, where various electronic components and other hardware may be mounted. Additionally, notches 15 can be cut or punched out of the edge regions 12, 13 so that the yet to be formed mounting channels 27, 28, 29, 30 do not interfere with folding the sheet metal 11 into different walls 16, 17.

FIGS. 3B, 4B, 5B, and 6B show top views of the sheet metal 11 at various points in a manufacturing process, in accordance with an embodiment, and FIGS. 3A, 4A, 5A, and 6A show respective side views of the sheet metal 11.

As shown in FIGS. 3A-B, a first fold 18 and a second fold 19 are performed respectively upon first 13 and second 14 edge regions of the sheet metal 11, just inside of the apertures 12. In the various instances described herein describing the sheet metal as being "folded," such folding may be achieved, for example, with the use of a pressing machine and a corresponding die, but is not limited as such.

With reference to FIGS. 4A-B, a third fold 20 and a fourth fold 21 are respectively performed upon the first 13 and second 14 edge regions. In one embodiment the fourth fold 21 folds the sheet metal 11 to an angle α, as shown. In some embodiments, the angle α is approximately 70 degrees.

As shown in FIGS. 5A-B, a fifth fold 22 is performed on the first edge region 13 and a sixth fold 23 is performed on the second edge region 14. In one embodiment, the fifth fold 22 folds the sheet metal 11 to an angle β, as shown. In some embodiments, the angle β is approximately 70 degrees.

With reference to FIGS. 6A-B, a seventh fold 24 and an eighth fold 25 are respectively performed on the first 13 and second 14 edge regions of the sheet metal 11. In particular, the eighth fold 25 involves folding the second edge region 14 back over itself. Additionally, a ninth fold (not shown) is performed along axis 31, in which the first edge region 13 is folded back over itself so as to form an outward extending flange 26 and the mounting channels 27, 28 corresponding to the first edge region 13. The second edge region 14 may also be pressed down so as to form the mounting channels 29, 30 corresponding to the second edge region 14.

Figure 7:
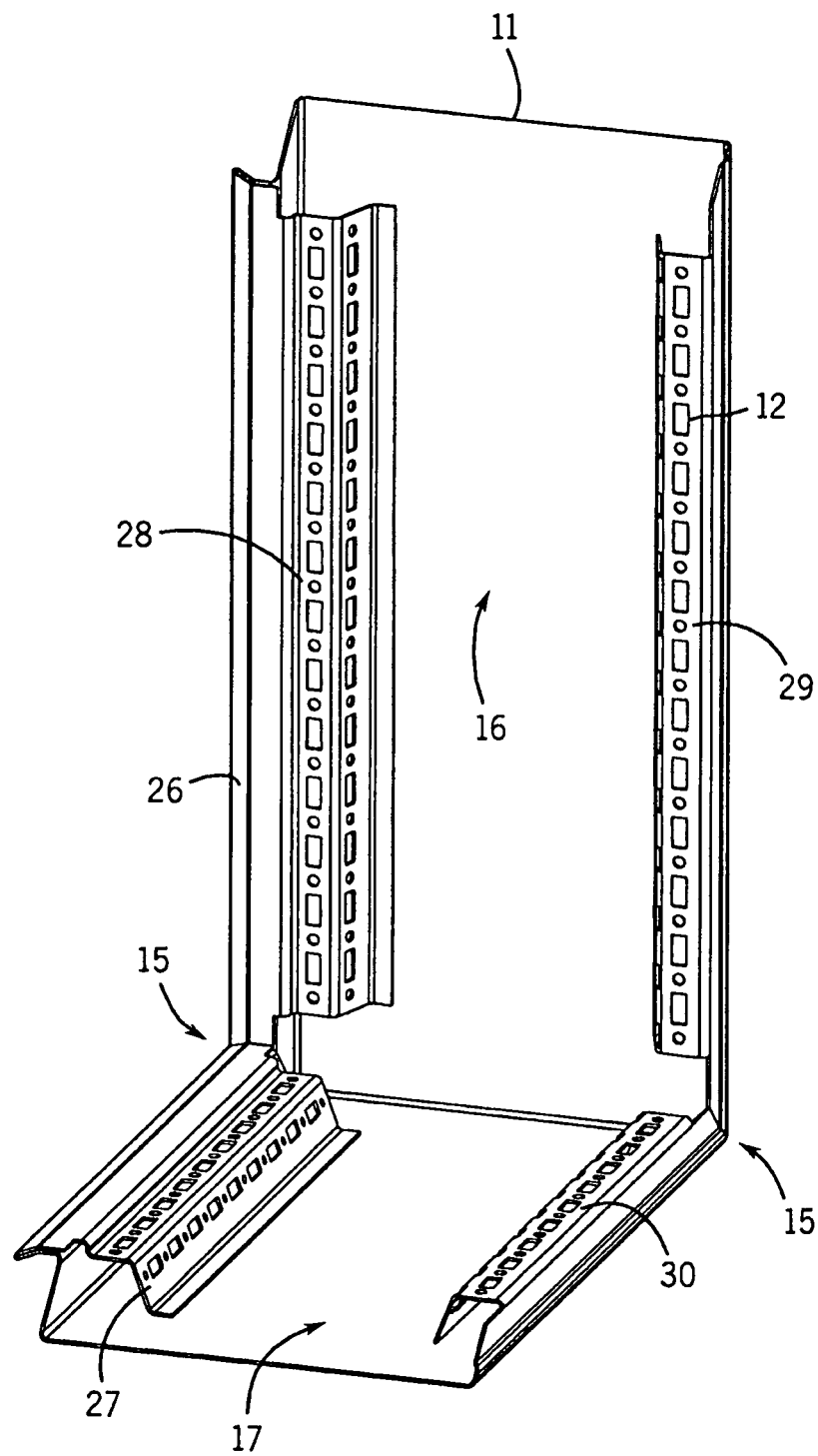
FIG. 7 illustrates the sheet metal from FIG. 6 folded to form a first and second sidewall.

As shown in FIG. 7, after the mounting channels 27-30 have been folded in from the edge regions 13, 14 of the sheet metal 11, the sheet metal 11 may then be folded at one or more of the notches 15 so as to form adjacent walls 16, 17.

Although FIGS. 2-7 illustrate forming two walls (i.e., 16 and 17) of the enclosure 10 from a single piece of sheet metal 11, similar and/or other appropriate steps may be performed on a piece of sheet metal that is, for example, twice as long, so as to form all four walls of an enclosure from the piece of sheet metal. Thereafter, the two walls that are not physically connected may then be fused together. Thus, a single sheet of sheet metal may serve to form four adjacent walls of the enclosure, as well as the mounting channels of the enclosure.

Figure 8:
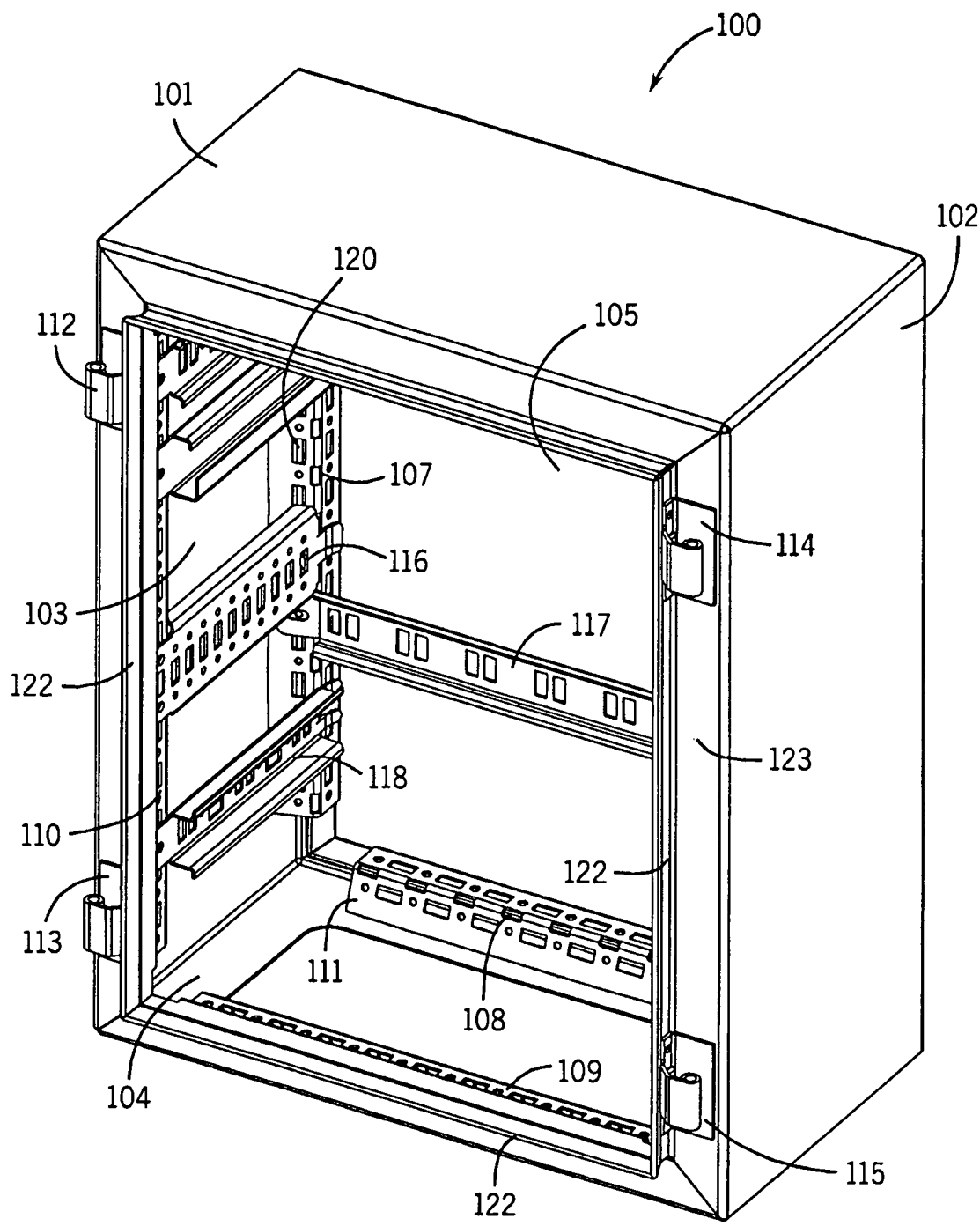
FIG. 8 is a perspective view of an enclosure for electronic components, in accordance with various embodiments of the invention.

FIG. 8 illustrates an enclosure 100 for electronic components, in accordance with various embodiments of the invention. As shown, the enclosure 100 can include four sidewalls 101-104, a backwall 105, and a door 106 (shown in FIG. 11). In one embodiment, at least two of the sidewalls (e.g., 101 and 102) can be formed from the same continuous piece of sheet metal. In another embodiment, all four sidewalls 101-104 can be formed from the same continuous piece of sheet metal.

Advantageously, the enclosure 100 can also include a number of mounting channels, such as mounting channels 107, 108, 109, 110, as well as others not visible in FIG. 8, to which various items may be mounted, including but not limited to fasteners, mounting panels, mounting brackets, side channels, lights, light kits, and electrical components. In one embodiment, at least one mounting channel (e.g., mounting channel 107) can be formed from an edge region of a corresponding sidewall (e.g., sidewall 103) that has been folded inwardly. In addition, flanges 122 created by additional folds of mounting channels positioned opposite the backwall 105 (e.g., mounting channels 109, 110) can create a front perimeter 123 substantially parallel to the backwall 105 with an extruded opening. In some embodiments, the extruded opening created by flanges 122 can be angled outward towards rather than perpendicular to the front perimeter 123.

FIGS. 9A-9B respectively illustrate an perspective view and an end view of mounting channel 108. An inward-facing side 111 of the mounting channel 108 can form an angle φ, as shown. In a some embodiments, the angle φ can be approximately 70°. Such angling of the inward-facing side 111 of the mounting channel 108 can allow more convenient access to fasteners coupled with the mounting channel 111. In other embodiments, the angle φ can be approximately 90 degrees.

With reference again to FIG. 8, in some embodiments, the enclosure 100 can also include a first set of door hinges 112, 113 and a second set of door hinges 114, 115 coupled to the front perimeter 123, which thereby enhance the customizability of the enclosure 100 by allowing the door 106 to be mounted using either the first set of door hinges 112, 113 (where door 106 would open to the left) or the second set of door hinges 114, 115 (where door 106 would open to the right).

Figure 10:
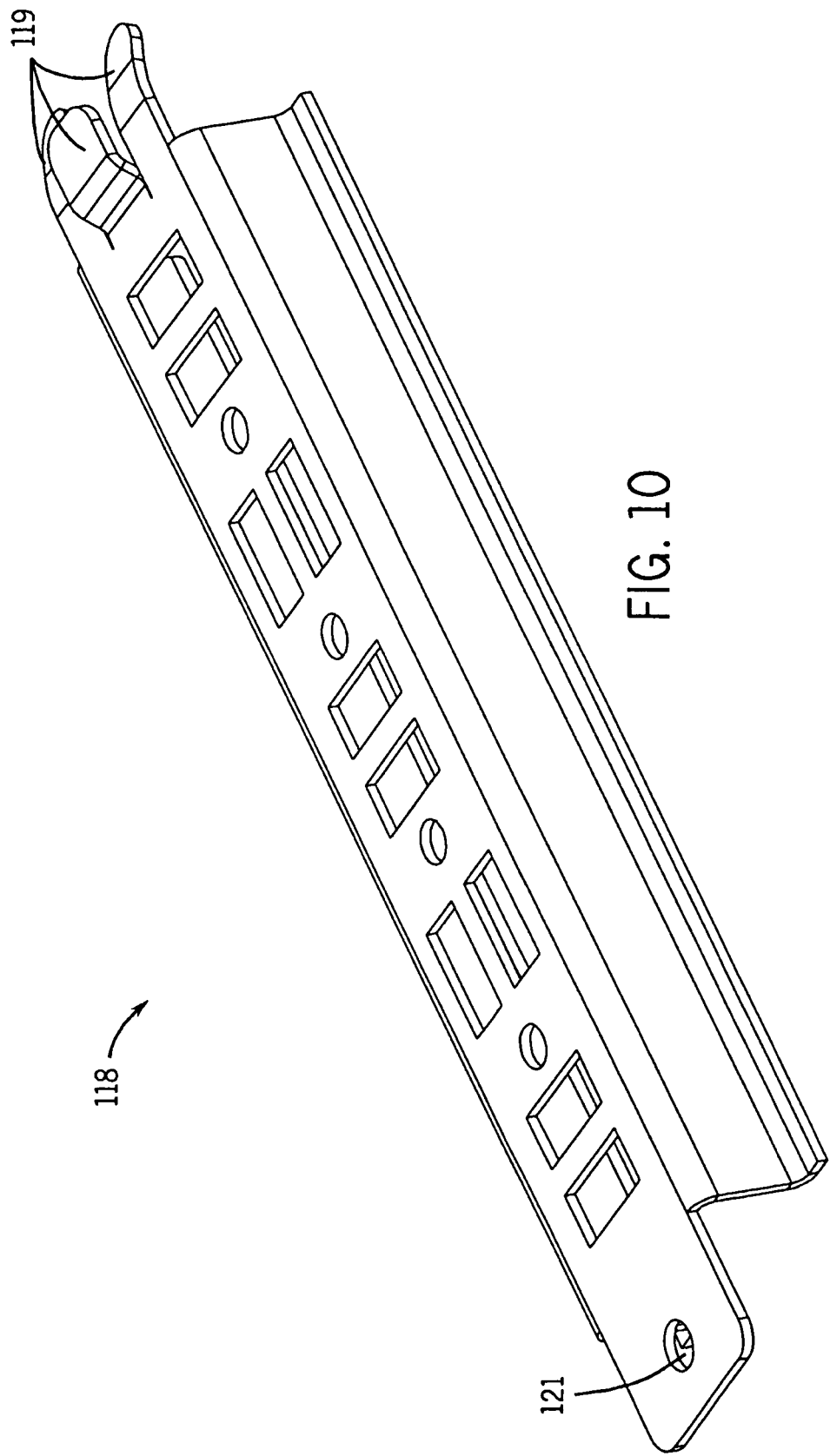
FIG. 10 is an perspective view of a side channel.

The enclosure 100 of FIG. 8 can also include a number of removable side channels or grid straps 116, 117, 118. The side channels 116-118 can be coupled to the mounting channels 107-110 at various locations within the enclosure 100. The side channels 116-118 can also include structural features that allow for more convenient coupling to the mounting channels. For example, FIG. 10 illustrates an perspective view of side channel 118, in accordance with an embodiment of the invention. Advantageously, one end of the side channel 118 can include one or more flanges 119 to enable fastener-less mounting of the side channel 118 to a mounting channel (e.g., mounting channel 107) at the rear of the enclosure 100, which may otherwise be difficult to reach. As shown in FIG. 8, one or more of the flanges 119 can fit through one or more of a plurality of apertures 120 along the mounting channel 107. Additionally, the side channel 118 can include an aperture 121 at an end of the side channel 118 opposite the flanges 119. The aperture 121 on the side channel 118 can be aligned with one of the apertures 120 along a front mounting channel (e.g., mounting channel 110) for mounting with a fastener (not shown).

Figure 11:
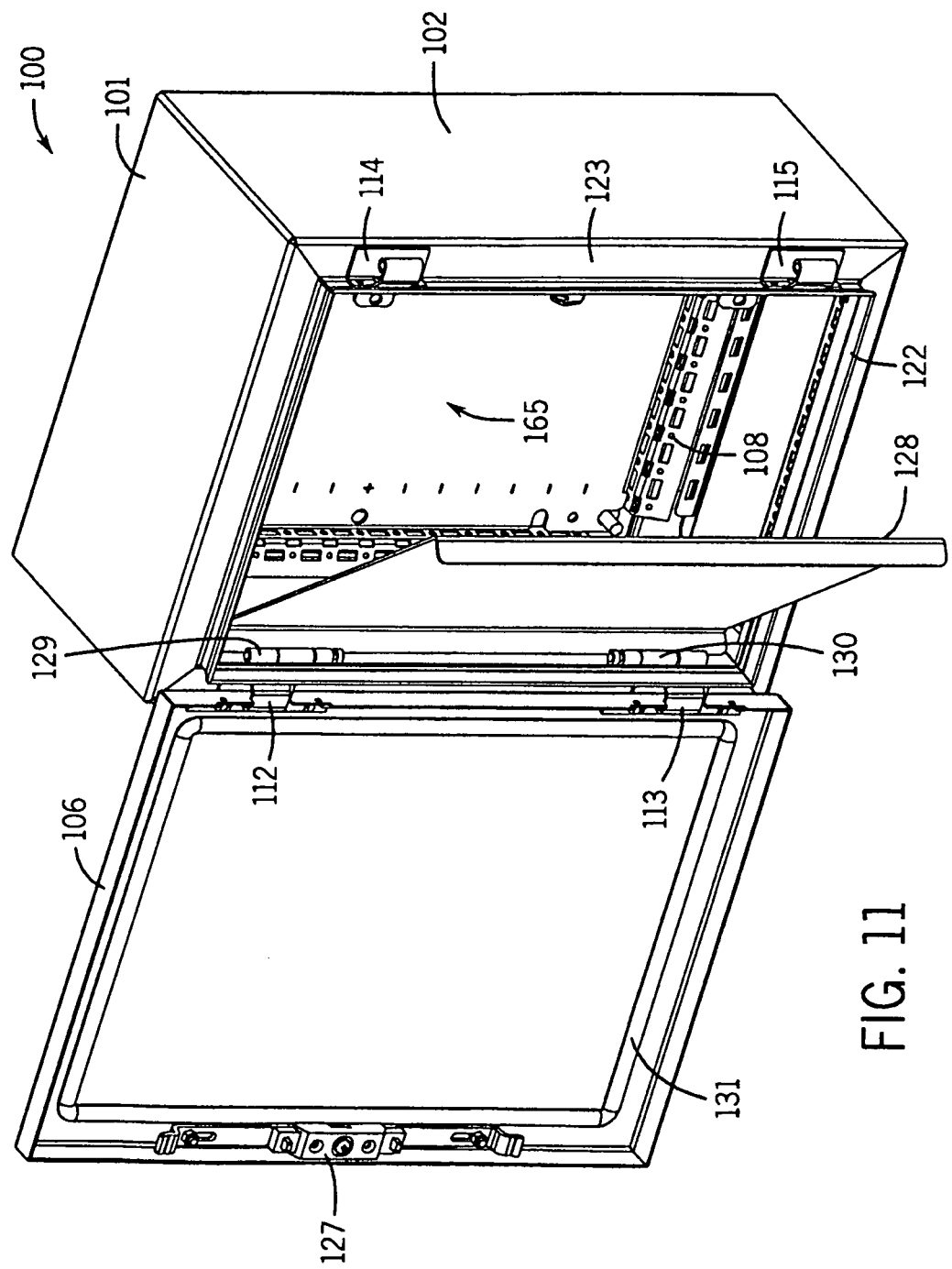
FIG. 11 is a perspective view of the enclosure of FIG. 8 in accordance with various embodiments of the invention.

FIG. 11 illustrates the enclosure 100 including a door gasket 131 on the door 106. The door gasket 131 can be a flexible material that can engage the front flanges 122 when the door is closed to help provide a substantially water-tight barrier to the inside of the enclosure 100. The rounded edge of the flanges 122 caused by folding of the metal can help prevent damage to the door gasket 131. In some embodiments, flanges 122 can be slightly angled away from the enclosure 100 (and therefore not perpendicular to the front perimeter 123) to help deflect water away from the door gasket 131, thereby further helping to prevent water leaks.

Figure 12:
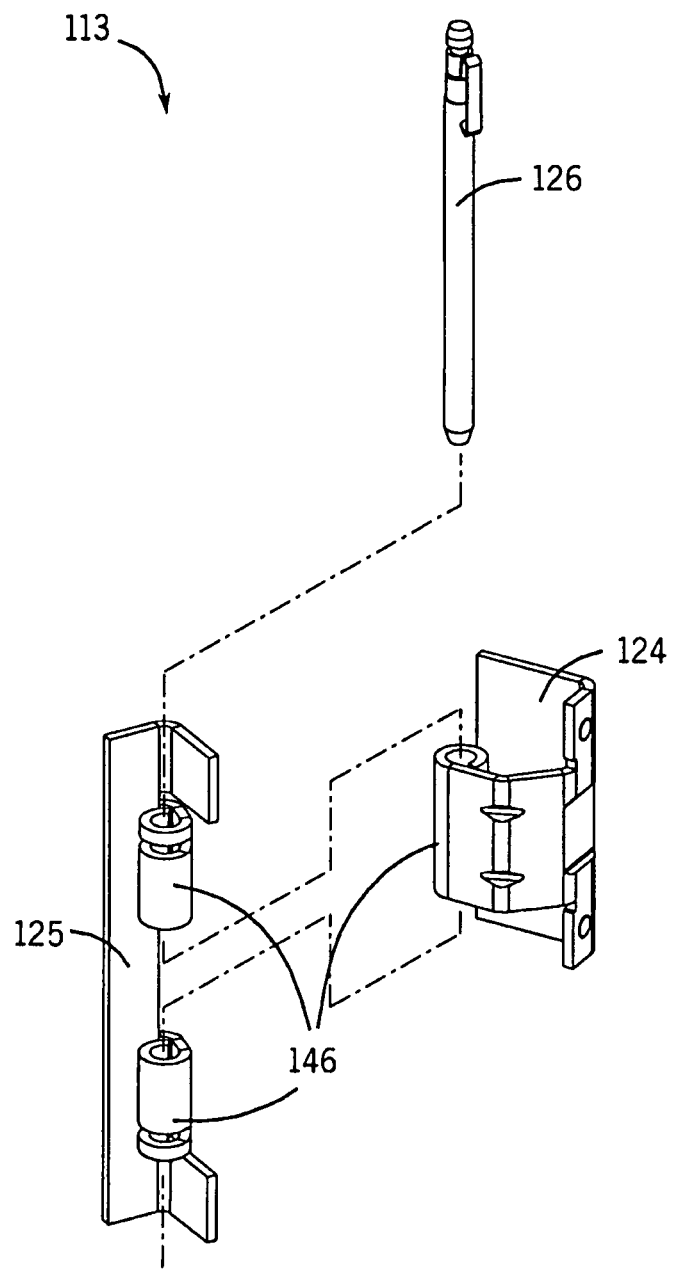
FIG. 12 is a perspective view of a hinge.
Figure 13:
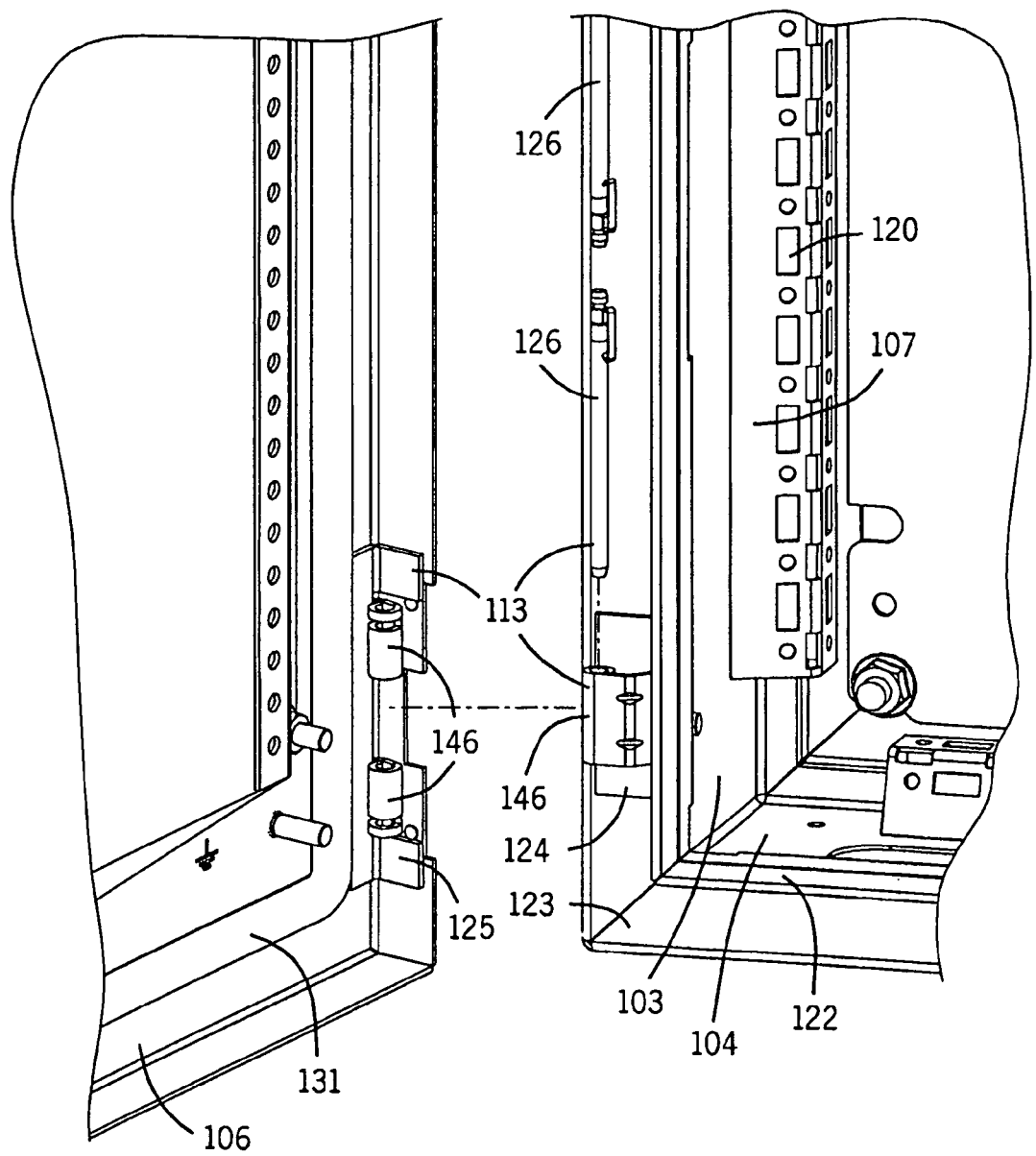
FIG. 13 is a perspective view the hinge of FIG. 12 attached to the enclosure of FIG. 8.

FIG. 12 further illustrates one of the hinges (e.g., 113). The hinge 113 can include a frame wing 124 coupled to the front perimeter 123, a door wing 125 coupled to the door 106, and a hinge pin 126 to engage the frame wing 124 with the door wing 125. The hinge pin 126 can be slid through hinge barrels 146 of the frame wing 124 and the door wing 125. FIG. 13 illustrates a close-up view of the frame wing 124 and the door wing 125 coupled to the front perimeter 123 and the door 106, respectively.

FIG. 11 also illustrates the enclosure 100 including a door latching mechanism 127 and a swing panel 128 (to be discussed later), in accordance with various embodiments of the invention. The latching mechanism 127 and swing panel 128 are mutually exclusive features, and thus the inclusion of one does not necessitate the inclusion of the other.

The latching mechanism 127 can be achieved in a number of ways. For example, in one embodiment, the latching mechanism 127 can be positioned outside of the door gasket 131, so that the latching mechanism 127 does not take up valuable interior space from the enclosure 100. Moreover, in embodiments such as the embodiment illustrated in FIG. 11, where the enclosure 100 includes a second set of door hinges 114, 115, the latching mechanism 127 can form a lock by engaging with the second set of door hinges 114, 115 when the latching mechanism 127 is in a locked position.

The particular mechanism by which a latching mechanism 127 engages with door hinges may be achieved in a number of ways. For example, FIGS. 14A-14B respectively illustrate top and side views of the latching mechanism 127 of FIG. 11 in the locked position, and FIG. 14C illustrates a side view of the latching mechanism 127 in the unlocked position. As shown in FIGS. 14A-14C, the latching mechanism 127 can include a plurality of arms 132, 133 and a knob 134. The arms can extend or contract depending on the direction which the knob 134 is turned. The knob 134 can be turned with a tool or key (not shown). When the arms 132, 133 are fully extended (i.e., the latching mechanism 127 is in the locked position) flanges 135 of the arms 132, 133 slide behind the respective hinge barrels 146 of the frame wings 124 of the door hinges 114, 115, thereby forming a secure lock without requiring additional latching hardware on the surface of the enclosure 100.

FIGS. 15A-15B illustrate the enclosure 100 having an alternative latching mechanism 136 in accordance with various embodiments of the invention. FIG. 15B shows the inside of the door 106 including the latching mechanism 136. FIG. 15A shows the door 106 closed, with the door including a knob 137 of the latching mechanism 136. The knob 137 can snap into a latch housing 237. The latch housing 237 can be coupled to the inside of the door 106. Using a tool such as a screwdriver or key (not shown), a user can rotate the knob 137. Rotating the knob 137 can cause a flange 138 in contact with the knob 137 to rotate. When the flange 138 is positioned vertically, the door 106 can freely close or open. If the door 106 is closed and the flange 138 is positioned horizontally, the door 106 is in its locked position. An attempt to open the door 106 while in its locked position can cause the flange 138 to come in contact with the front perimeter 123.

Figure 16D:
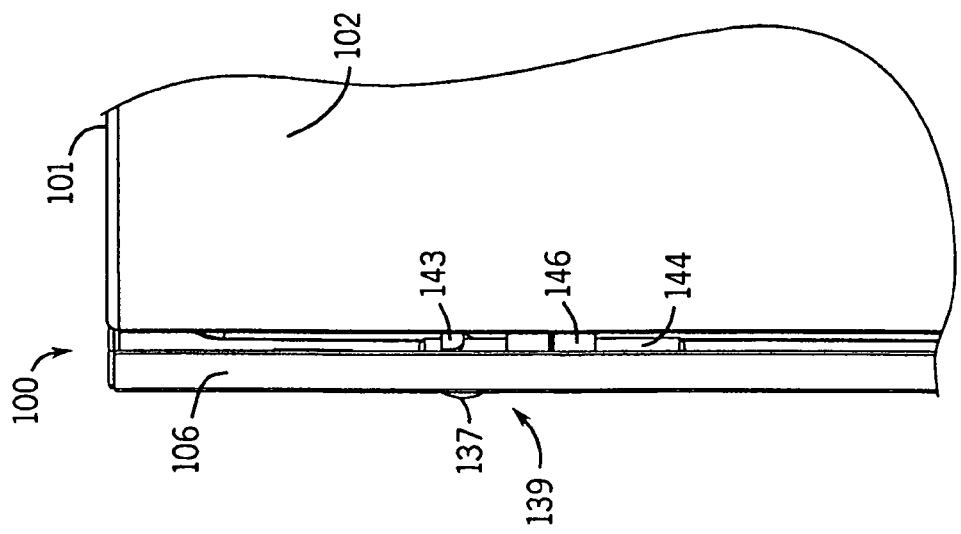
FIG. 16D is a perspective view the latching mechanism of FIGS. 16A-16C in locked position.
Figure 16C:
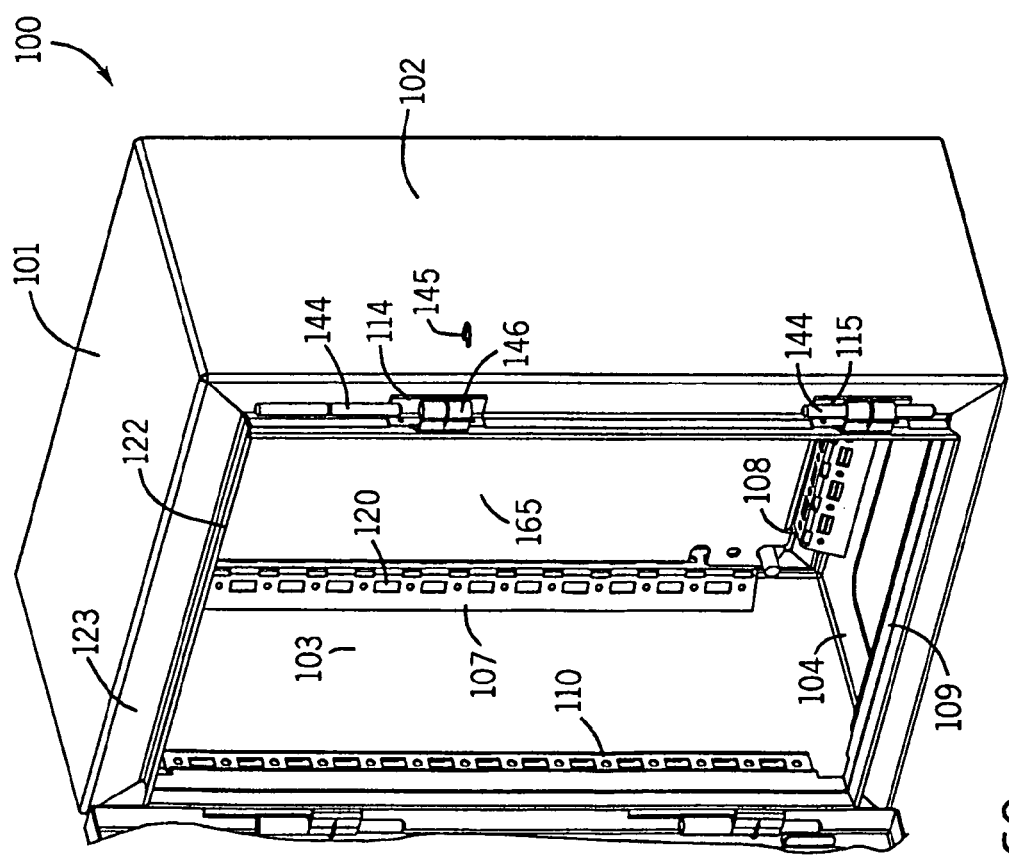
FIG. 16C is an perspective view of the hinge required for the latching mechanism of FIGS. 16A-16B.
Figure 16E:
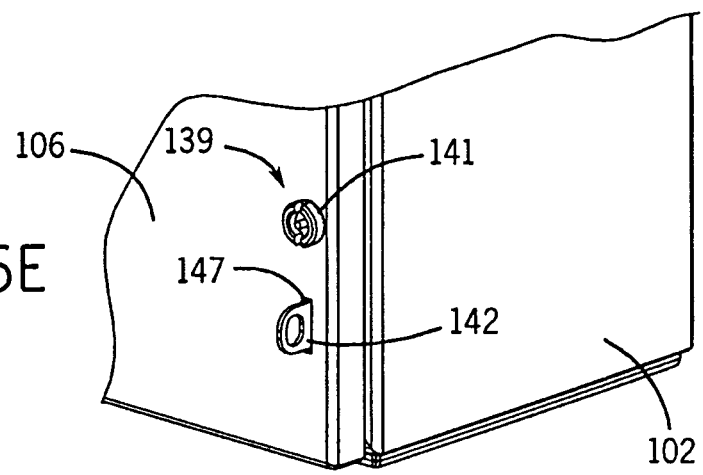
FIG. 16E is a sectional view of the latching mechanism of FIGS. 16A-16D.
Figure 16F:
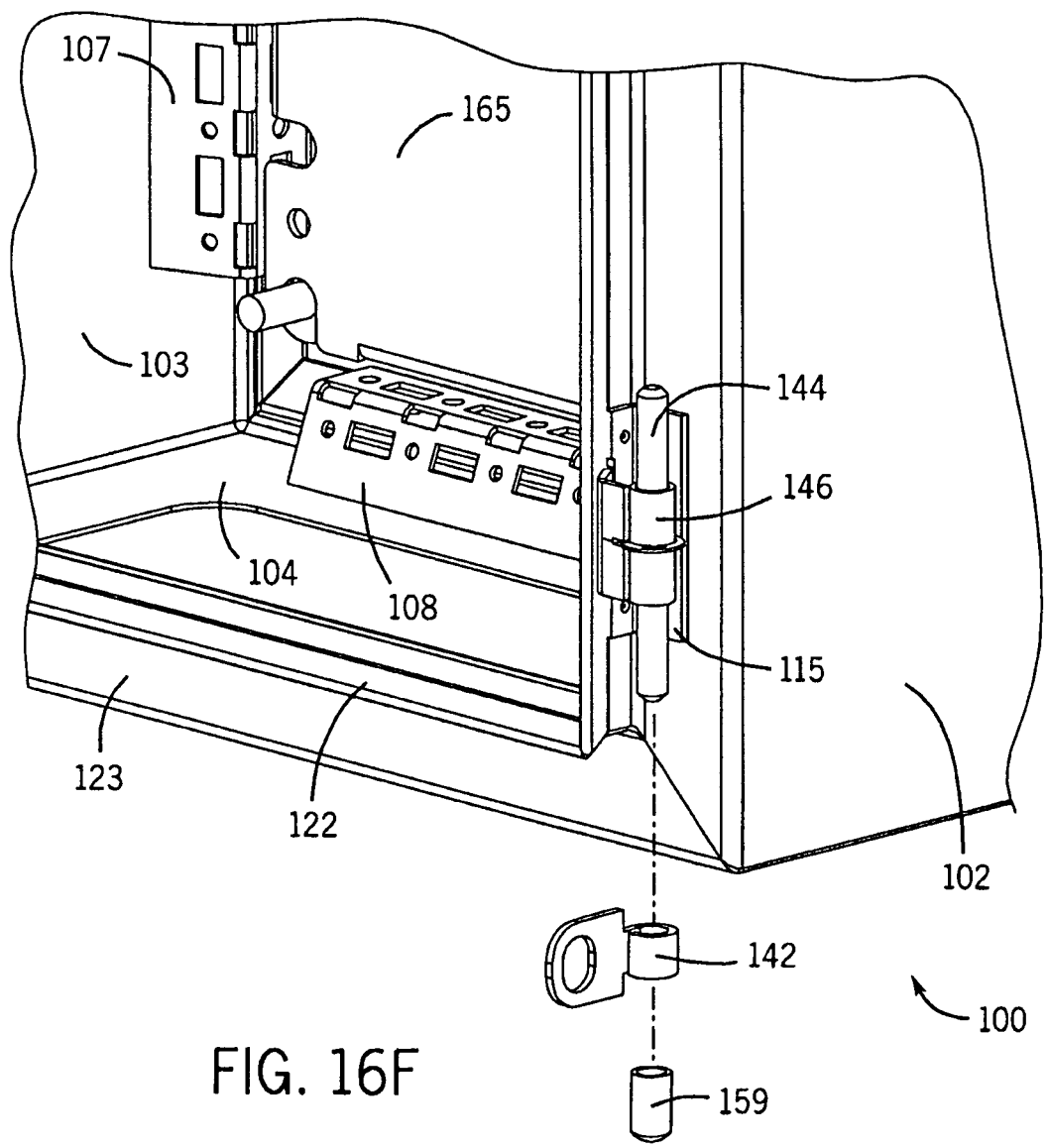
FIG. 16F is an inside sectional view of the latching mechanism of FIGS. 16A-16E.
Figure 18A:
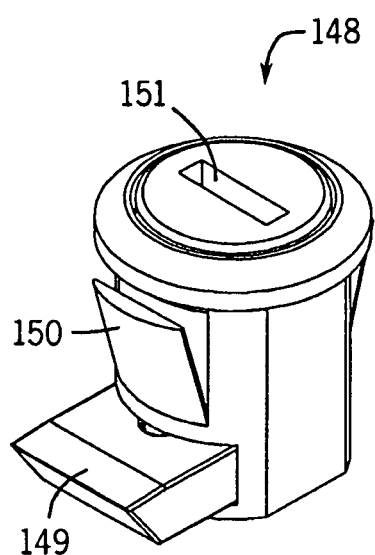
FIG. 18A is an perspective view of another alternative latching mechanism, in accordance with various embodiments of the invention.
Figure 18B:
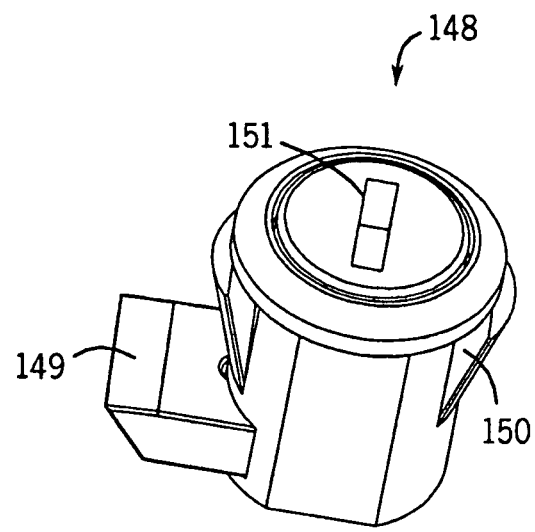
FIG. 18B is a second perspective view of the latching mechanism of FIG. 18A.
Figure 18C:
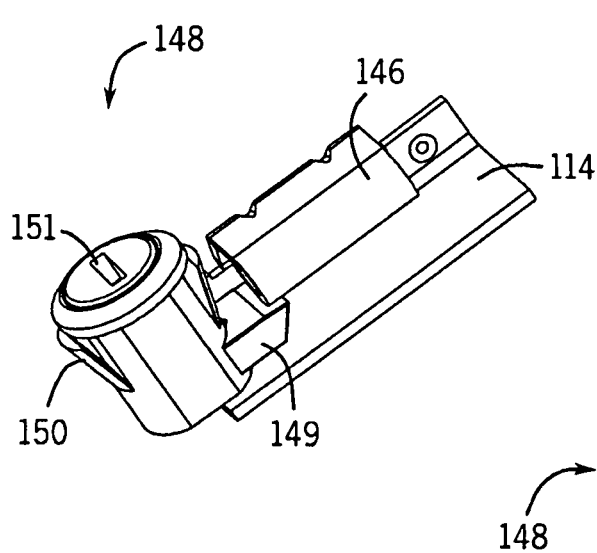
FIG. 18C is an perspective view of the latching mechanism of FIGS. 18A-18B engaging a hinge.
Figure 18D:
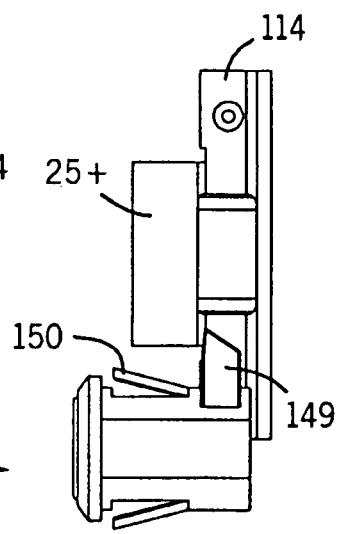
FIG. 18D is a side view of the latching mechanism of FIGS. 18A-18C engaging a hinge barrel.

FIGS. 16A-16E illustrate the enclosure 100 having another alternative latching mechanism 139, in accordance with various embodiments of the invention. FIG. 16A features the enclosure 100 with the door 106 closed. The latching mechanism 139 can include two knobs 137, 141. The knobs 137, 141 can have different keyholes 151 so as to require different tools or keys to turn the knobs 137, 141 to unlock the door 106. The knobs 137, 141 can be rearranged so that knob 141 is above knob 137, or alternatively the latching mechanism 139 can include only knobs 141 or only knobs 137. FIG. 16B illustrates an inside view of the open door 106 of the enclosure 100. Knobs 137, 141 can be coupled to flanges 143 so that rotating the knobs 137, 141 can cause the flanges 143 to rotate. FIG. 16C illustrates the hinge 114 that can be used with the latching mechanism 139. The frame wing 124 of hinge 114 can include a hinge pin 144 that slidably engages within the hinge barrel 146. The hinge pin 144 can be held in place inside the hinge barrel 146 by a retaining ring 145. FIG. 16D illustrates the enclosure 100 with the door 106 closed and the latching mechanism 139 in locked position. The flange 143 is shown rotated so that it extends horizontally behind the hinge pin 144, thus preventing the door 106 from opening. FIG. 16E further illustrates the door 106 including a slit 147 and a padlock ring 142 extending through the slit to engage a padlock (not shown). The padlock ring 142 can be coupled to the hinge pin 144 of hinge 115, as shown in FIG. 16F, by sliding the padlock ring 142 onto the hinge pin 144 and securing the padlock ring 142 using a cap lug 159.

FIGS. 17A-17C respectively illustrate supplemental perspective, rear, and top views of the latching mechanism 139 as depicted in FIGS. 16A-16E. The hinge barrel 146 of the hinge 114 can contain the hinge pin 144 held in place by the retaining ring 145. When the latching mechanism 139 is in the locked position, the flange 143 of latching mechanism 139 can be oriented horizontally behind the hinge pin 144, and thus can form a secure lock, as shown. Rotating the knob 137 (or knob 141) can change the latching mechanism 139 from a locked position to an unlocked position by rotating the flange 143 from the horizontal position behind the hinge pin 144 to a vertical position (not illustrated) parallel with the hinge pin 144.

FIGS. 18A-18D illustrate a fourth design for a latching mechanism 148, in accordance with various embodiments of the invention. The latching mechanism 148 illustrated therein employs a retractable tang 149 that can engage the hinge barrel 146 of the frame wing 124 of hinge 114 when the door 106 is closed. A tool or key (not shown) can be used to engage the keyhole 151 on the latching mechanism 148 to rotate the latching mechanism 148 and change the orientation of the tang 149. If the tang 149 is oriented vertically, it can be engaged behind the hinge barrel 146 to lock the door 106. To change the latching mechanism 148 to the unlocked position, the keyhole 151 can be rotated to orient the tang 149 horizontally so that it does not engage the hinge barrel 146. The latching mechanism 148 can be installed in the door 106 by pressing it through a mounting hole in the door 106 until the tabs 150 on the sides of the latching mechanism 148 spring out and lock it in place.

Figure 19A:
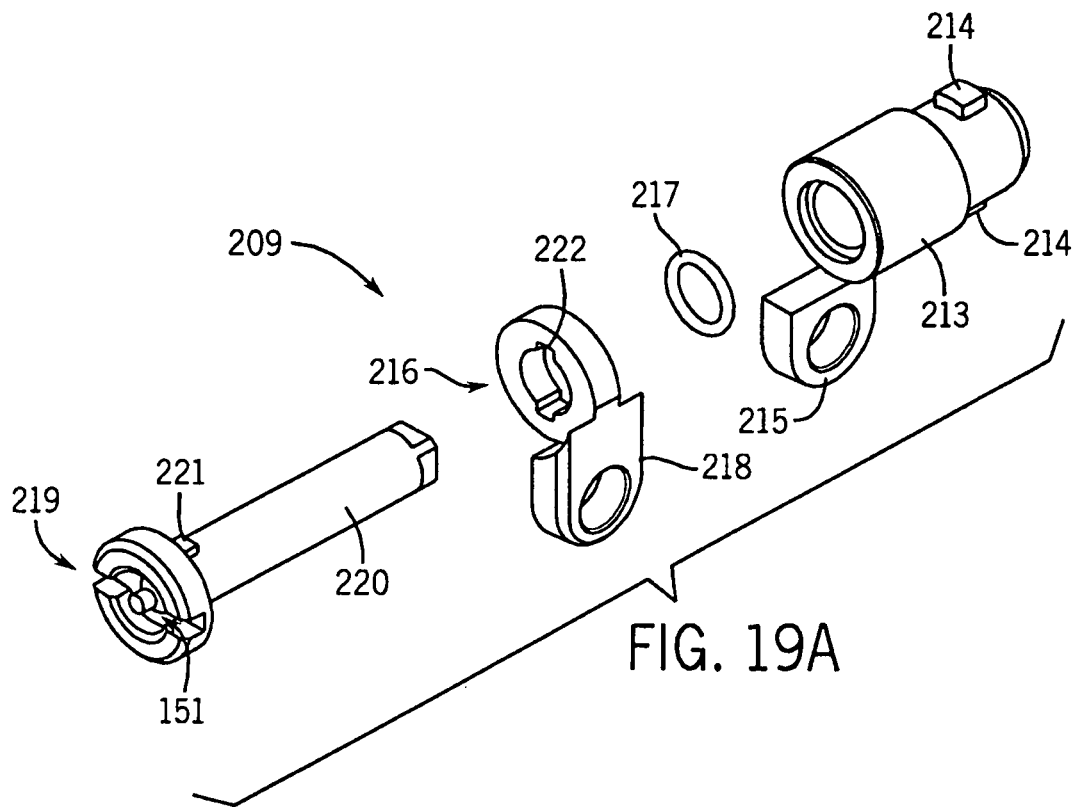
FIG. 19A is an exploded parts view of a locking mechanism, in accordance with various embodiments of the invention.

FIGS. 19A-21C illustrate various locking mechanisms 209-212 that can be used in some embodiments of the invention. The locking mechanisms 209-212 can be interchangeable and can fit into existing housings already in the door 106. For example, the locking mechanisms 209-212 can replace knobs in latching mechanisms 127, 136, 139. FIG. 19A illustrates a padlock-type locking mechanism 209. Locking mechanism 209 can include a housing 213. The housing 213 can further include a padlock ring 215. A reversible insert 216 can also be coupled to the housing 213. An O-ring 217 can fit between the reversible insert 216 and the housing 213. The reversible insert 216 can also include a padlock ring 218. To lock the enclosure 100, a padlock (not shown) can fit through padlock ring 215 and padlock ring 218. The reversible insert 216 can be flipped to allow padlock ring 218 to sit either on the right side or left side of padlock ring 215. Locking mechanism 209 can further include a knob 219 with a knob insert 220, a shoulder 221, and keyhole 151. When the knob insert 220 is properly fit through the reversible insert 216 and the housing 213, the shoulder 221 can engage a notch 222 on the reversible insert 216. With this configuration, turning the knob 219 can then cause the reversible insert 216 to also turn. The knob 219 can be turned by fitting a tool or key into keyhole 151.

Figure 19B:
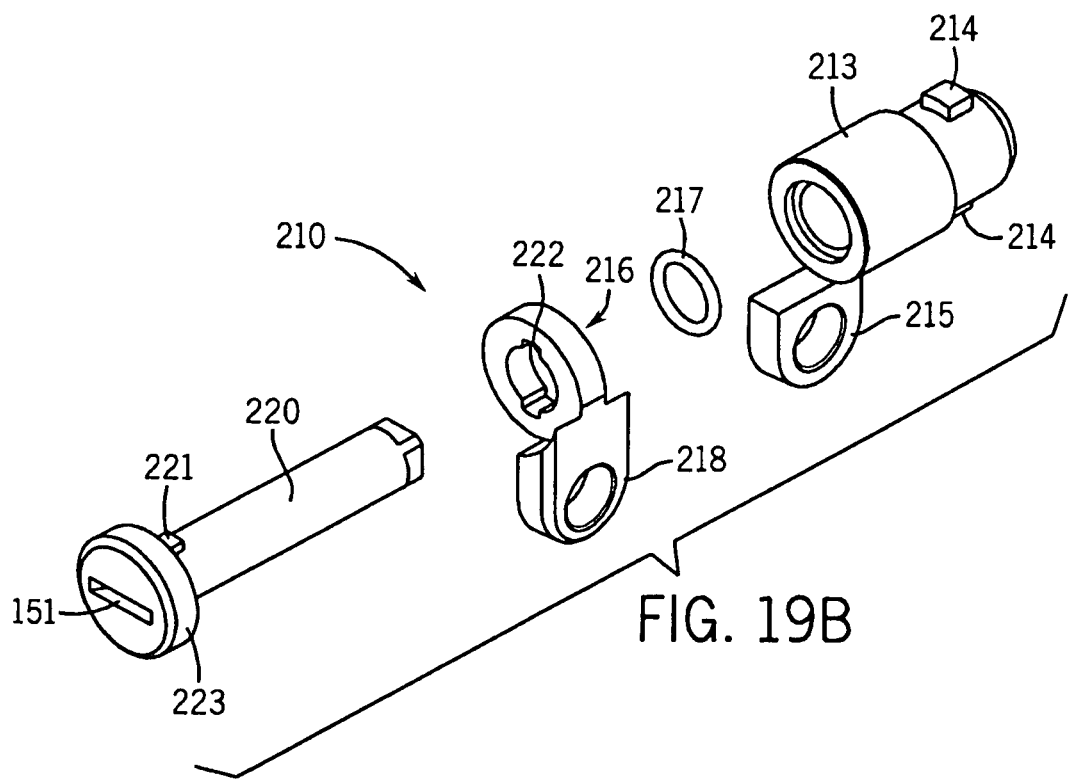
FIG. 19B is an exploded parts view of an alternative locking mechanism, in accordance with various embodiments of the invention.

FIG. 19B illustrates another padlock-type locking mechanism 210. Locking mechanism 210 is similar to locking mechanism 209, except that it includes a knob 223 with a different keyhole 151. FIG. 20 illustrates a padlock-type handle locking mechanism 211. Locking mechanism 211 can be similar to locking mechanisms 209 and 210 from FIGS. 19A-19B, but it can alternatively include a handle 224. The handle 224 can include a handle insert 225 and shoulder 226.

FIGS. 21A-21D illustrates a keylock-type locking mechanism 212. Locking mechanism 212 can include the handle 224 of locking mechanism 211 further containing a hole 226 to engage a keylock 227. The keylock 227 can include keyhole 151 to engage a key 228. The keylock 227 can also include an off-centered pin 236 (shown in FIG. 21C). The locking mechanism 212 can include a housing 229 with tab 214 to fit into door 106 similar to that described for locking mechanisms 209-211. The locking mechanism 212 can further include a bracket 230 that can be coupled to the handle 224 via fasteners 159, a handle insert 225, a rectangular pin 231, and an e-clip 232. The bracket 230 can also be coupled to the housing 229. The O-ring 217 can fit between the bracket 230 and the housing 229. The e-clip 232 can hold the keylock 227 in place once it is fit through the hole 226 and further into the bracket 230. The rectangular pin 231 can sit inside a hole 234 in the bracket 230. When the keylock 227 is rotated, the pin 236 on the keylock 227 can cause the rectangular pin 231 in the bracket 230 to move up or down. When the rectangular pin 231 is in its upward position, it can sit within a hole 235 in the housing 229. The rectangular pin 231 can then engage the handle insert 225 and prohibit it from turning, therefore keeping the door 106 in a locked position. When the rectangular pin 231 is in its downward position, the handle insert 225 can turn freely and the door can be in an unlocked position.

Figure 21D:
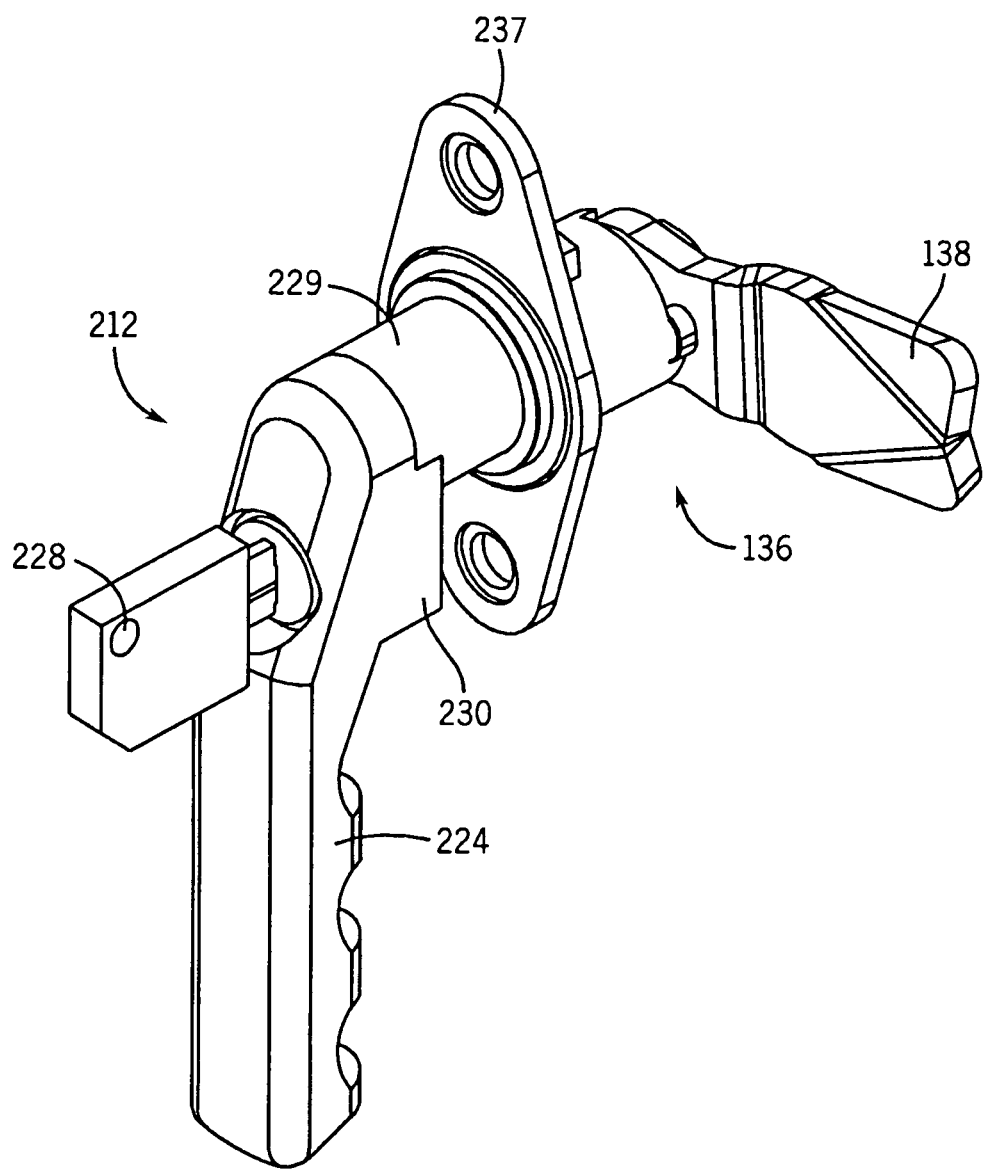
FIG. 21D is an perspective view of the locking mechanism of FIG. 21A with the latching mechanism of FIGS. 15A-15B.

In some embodiments of the invention, the locking mechanisms 209-212 can replace knobs 137, 141 in latching mechanisms 127, 136, or 139. For example, as illustrated in FIG. 21D, the locking mechanism 212 can replace knob 137 of latching mechanism 136. The housing 229 of locking mechanism 212 can be installed in the door 106 by pressing it through the latch housing 237 coupled to the door 106 until the tabs 214 on the top and bottom of the housing 229 spring out and lock it in place in the latch housing 237. Therefore, when the locking mechanism 212 is unlocked, turning the handle 224 can cause the flange 138 to rotate to a locked (shown) or unlocked position.

Figure 22:
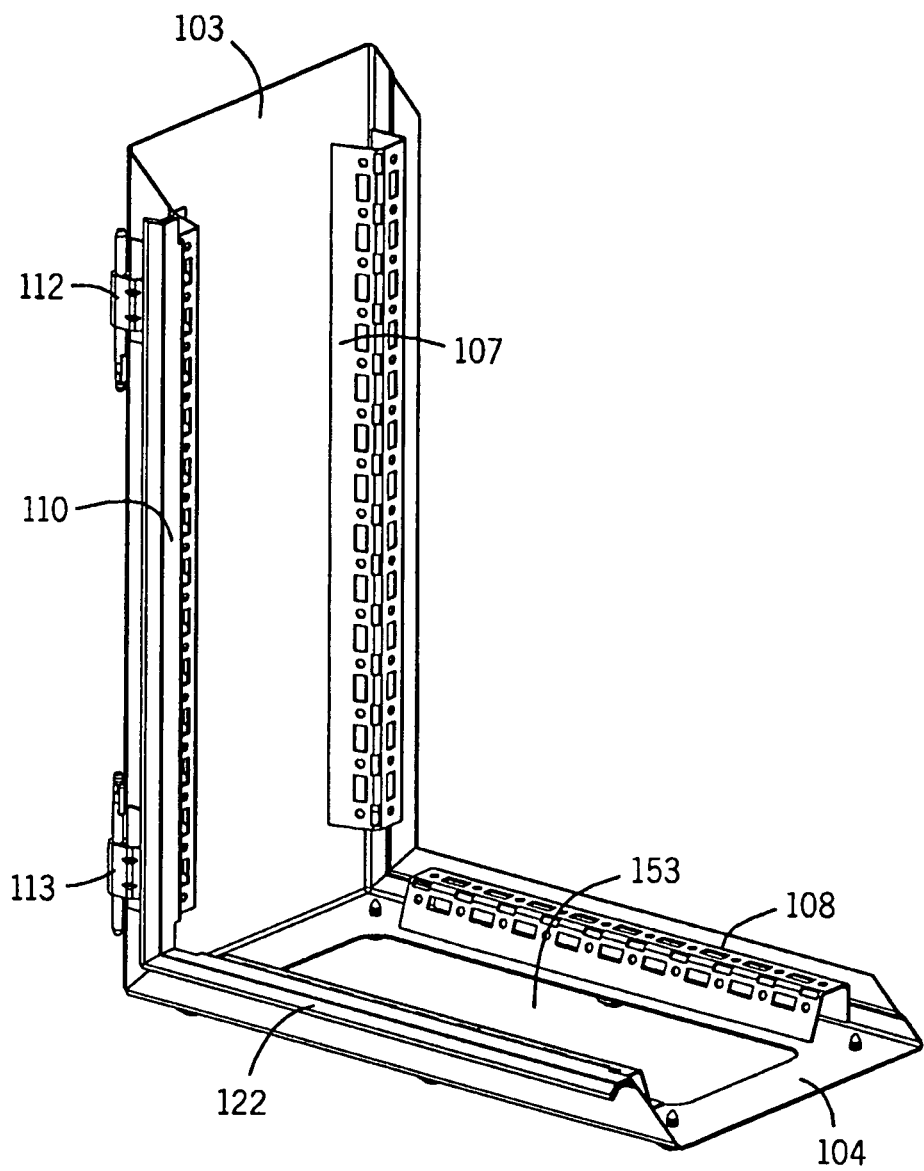
FIG. 22 is a sectional perspective view of the enclosure of FIG. 8 including a gland opening, in accordance with various embodiments of the invention.
Figure 23A:
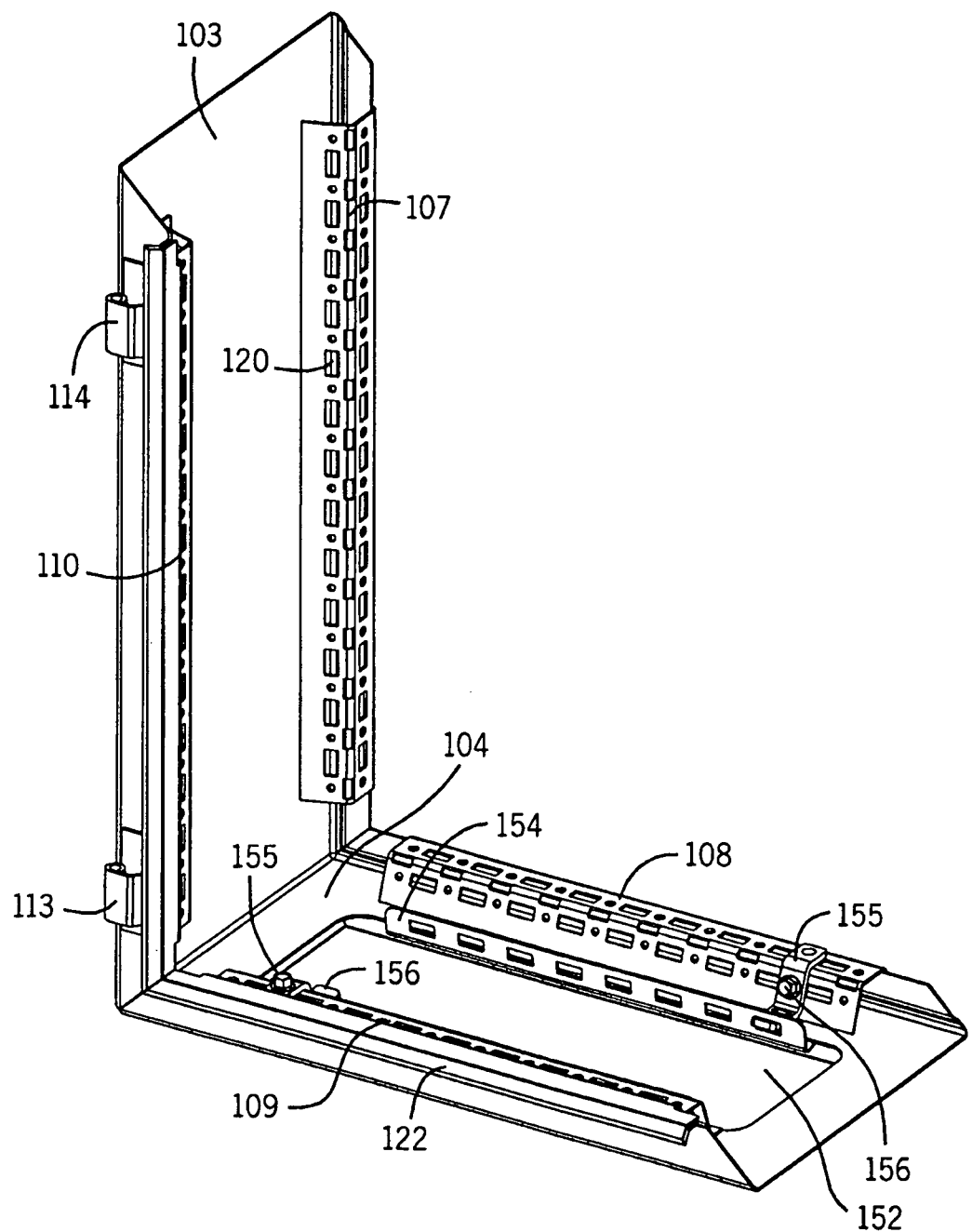
FIG. 23A is a sectional perspective view of the enclosure of FIG. 8 including a gland plate, in accordance with various embodiments of the invention.
Figure 23B:
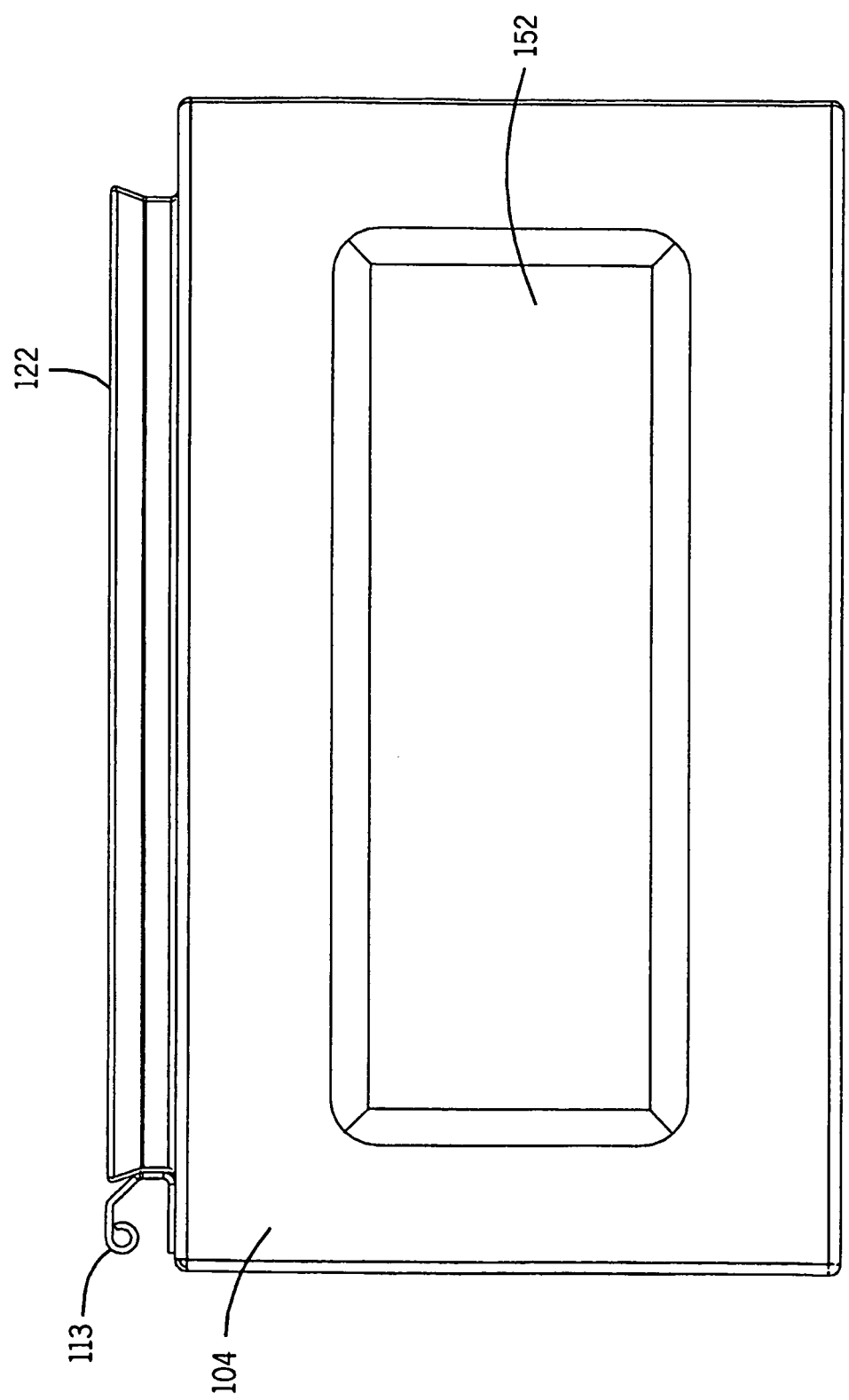
FIG. 23B is a bottom view of the enclosure of FIG. 23A.
Figure 23C:
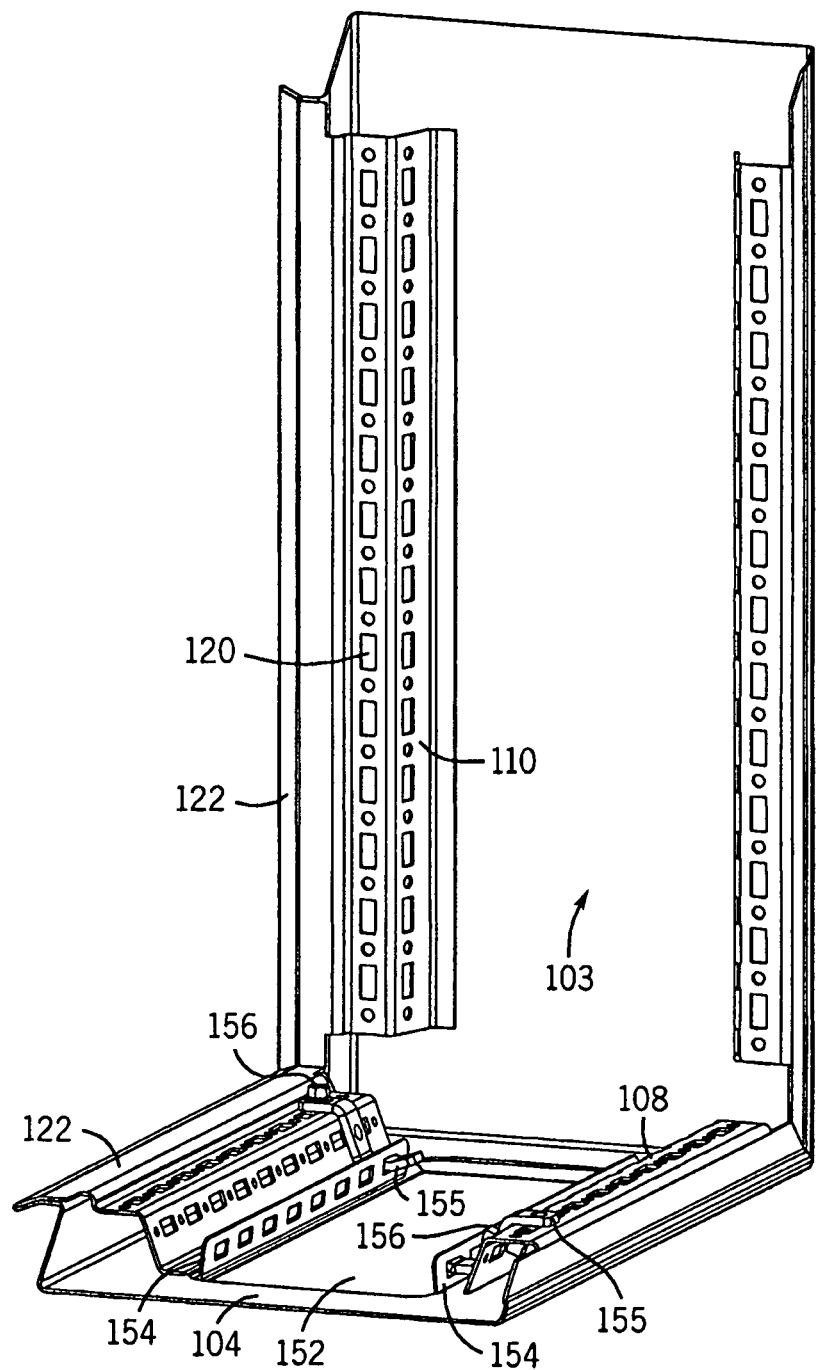
FIG. 23C is a sectional perspective view of the enclosure of FIGS. 23A-23B.

In certain circumstances, it may be desirable for the enclosure 100 to have a gland plate 152, which is a removable section of the enclosure 100, typically located on the bottom sidewall 104, that may be removed for the purpose of allowing the easy fitting of cable glands. FIG. 22 illustrates two sidewalls 103, 104, with bottom sidewall 104 containing an opening 153 for the fitting of cable glands. FIGS. 23A-23C respectively show a first sectional perspective view, a bottom view, and a second sectional perspective view of an enclosure having gland plate 152, in accordance with various embodiments of the invention. In order to maintain the security of the enclosure, the gland plate 152 can be mounted to the enclosure without having any mounting hardware exposed on the exterior surface of the gland plate 152 or the sidewall 104. Accordingly, the gland plate 152 can include inward-facing flanges 154, which may be coupled with the mounting channels 108, 109 via mounting hardware 155, 1156. Thus, in the illustrated embodiment, the gland plate 152 may only be removed from the sidewall 104 by first accessing the interior of the enclosure 100.

Additionally, FIG. 23C further illustrates an embodiment in which the mounting channel 109 is recessed relative to the door opening, which is defined by the outward extending flange 122. In one embodiment, the mounting channel 109 can be recessed sufficiently to allow fastening hardware such as hardware 155, 156 to clear the door opening and the flange 122. This can allow for uninhibited access to the interior of the enclosure 100 through the door opening.

Other gland plate designs may be achieved in addition to the gland plate of FIGS. 23A-23C. For example, a gland plate 157 or 158 may also be screw-mounted or stud-mounted to the sidewall 104, such as that shown in FIGS. 24A-24D (gland plate 157) and FIGS. 25A-25B (gland plate 158). FIG.

Figure 24C:
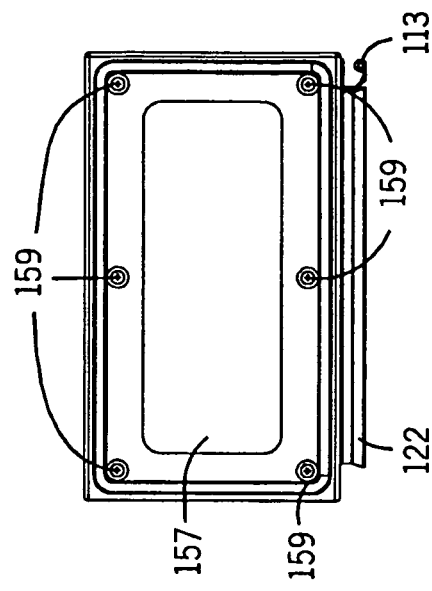
FIG. 24C is a bottom view of the gland plate of FIGS. 24A-24B.
Figure 24B:
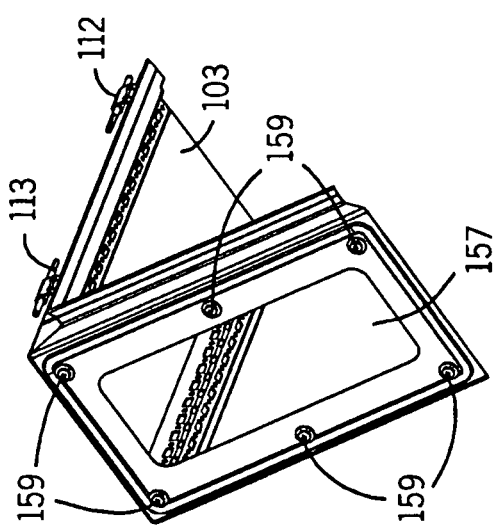
FIG. 24B is a second sectional perspective view of the gland plate of FIG. 24A.
Figure 24A:
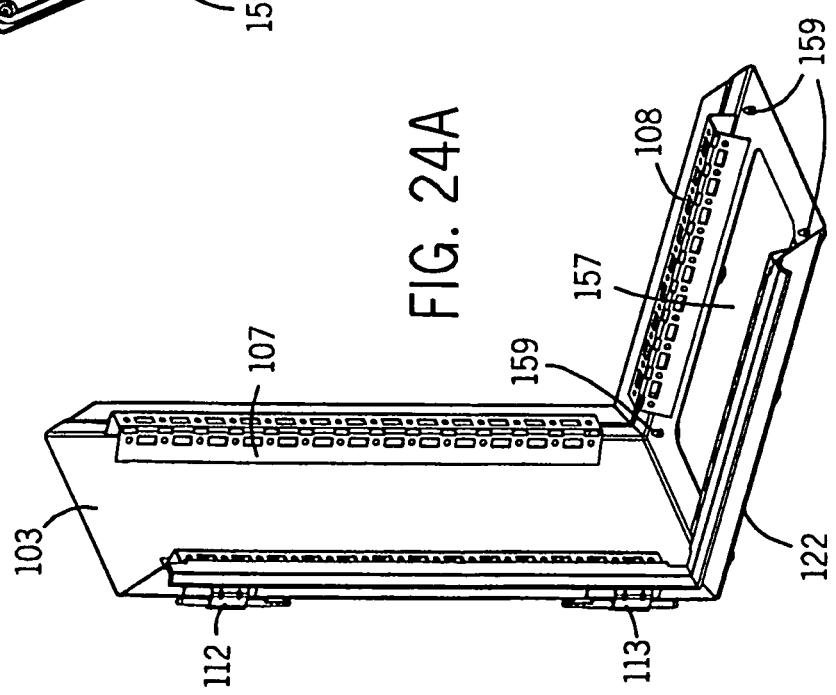
FIG. 24A is a sectional perspective view of the enclosure of FIG. 8 having an alternative gland plate in accordance with various embodiments of the invention.

24A illustrates two sides walls 103, 104 of the enclosure 100, where the gland plate 157 is coupled to the sidewall 104 by fasteners (e.g., screws) 159. FIGS. 24B-24C illustrate alternate bottom views looking up through sidewall 104 and gland plate 157. As shown in FIGS. 24B-24C, the fasteners 159 can be fastened from outside the enclosure 100. FIG. 24D illustrates an exploded parts view of the sidewalls 103, 104, the gland plate 157, the fasteners 159, and also washers 160, which may be used in conjunction with the fasteners 159.

Figure 25A:
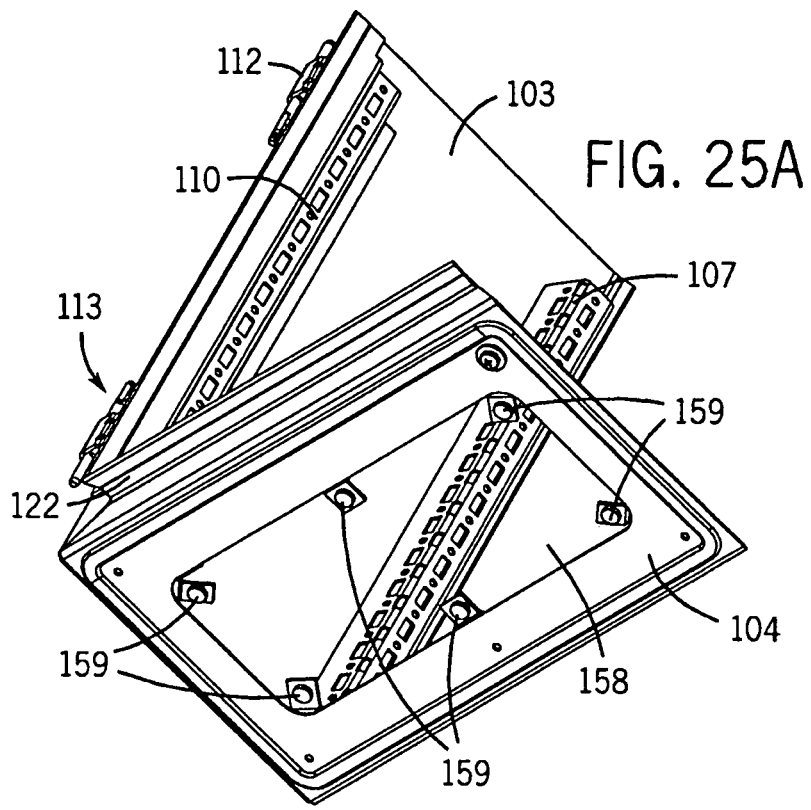
FIG. 25A is a sectional perspective view of the enclosure of FIG. 8 having an alternative gland plate in accordance with various embodiments of the invention.
Figure 25B:
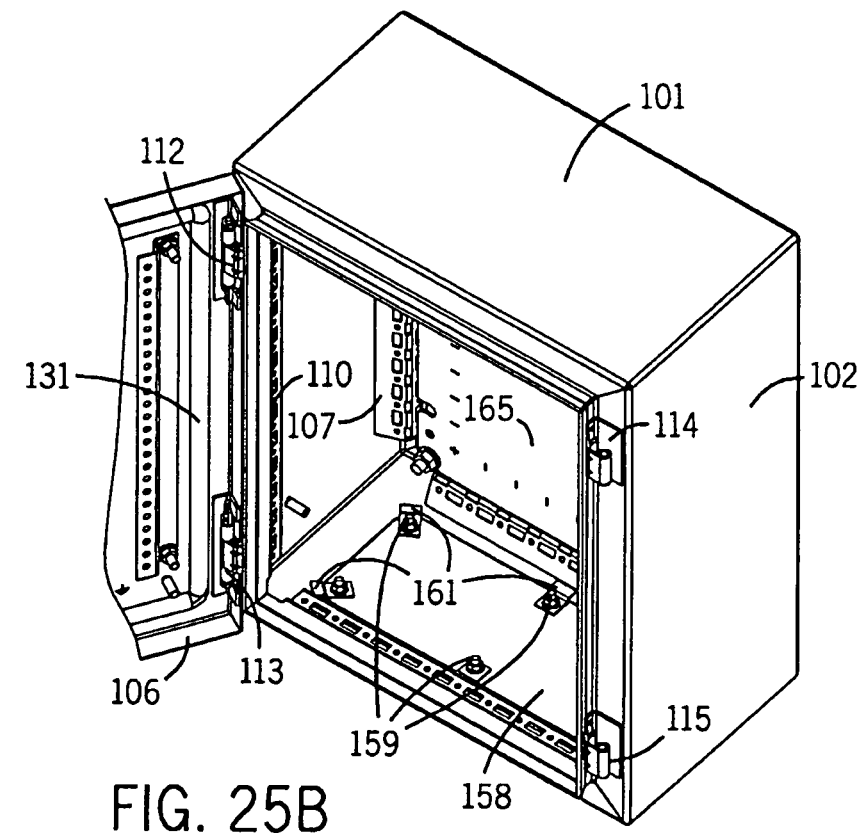
FIG. 25B is an inside view of the enclosure of FIG. 8 including the gland plate of FIG. 25.

FIG. 25A illustrates a bottom view looking up through sidewall 104 and gland plate 158. FIG. 25B illustrates a view looking into the enclosure 100. As shown in FIGS. 25A-25B, the gland plate 158 can be substantially the same size as the opening 153 in the sidewall 104 and can be coupled to sidewall 104 via a plurality of wing elements 161 coupled (e.g., welded) to sidewall 104 and fasteners 159 fastening the wing elements 161 to the gland plate 158. In this embodiment, fasteners 159 may be bolts with accompanying nuts. Wing elements 161 can be recessed downward through the opening of sidewall 104 such that the gland plate 158 or the fasteners 159 do not interfere with the interior of the enclosure 100.

Figure 26A:
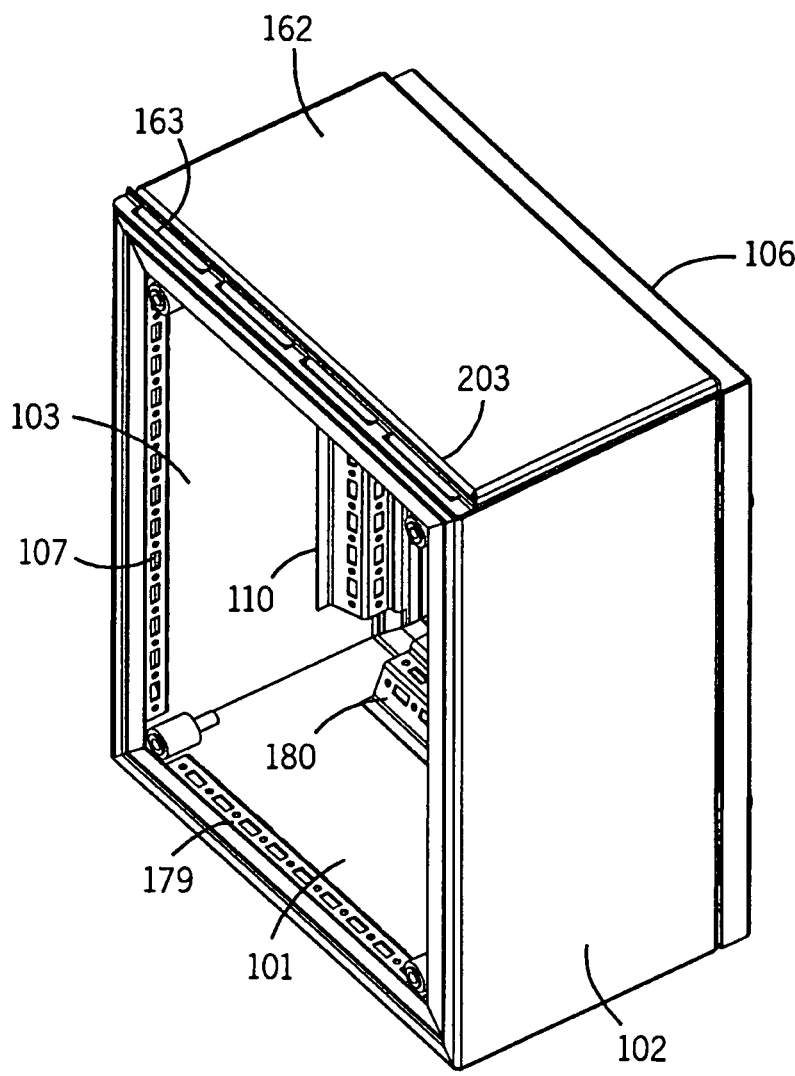
FIG. 26A is an perspective view of the enclosure of FIG. 8, with backwall removed, including an alternative gland plate in accordance with various embodiments of the invention.
Figure 26B:
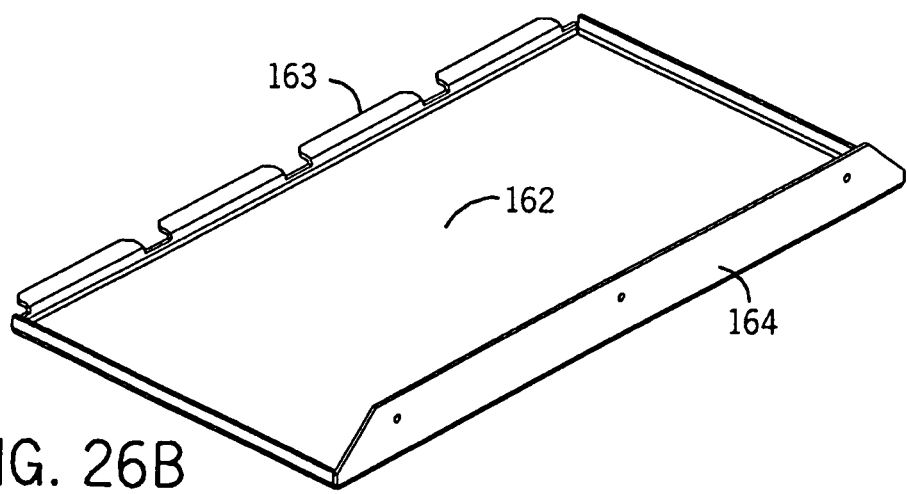
FIG. 26B is a perspective view the gland plate of FIG. 26A.
Figure 26C:
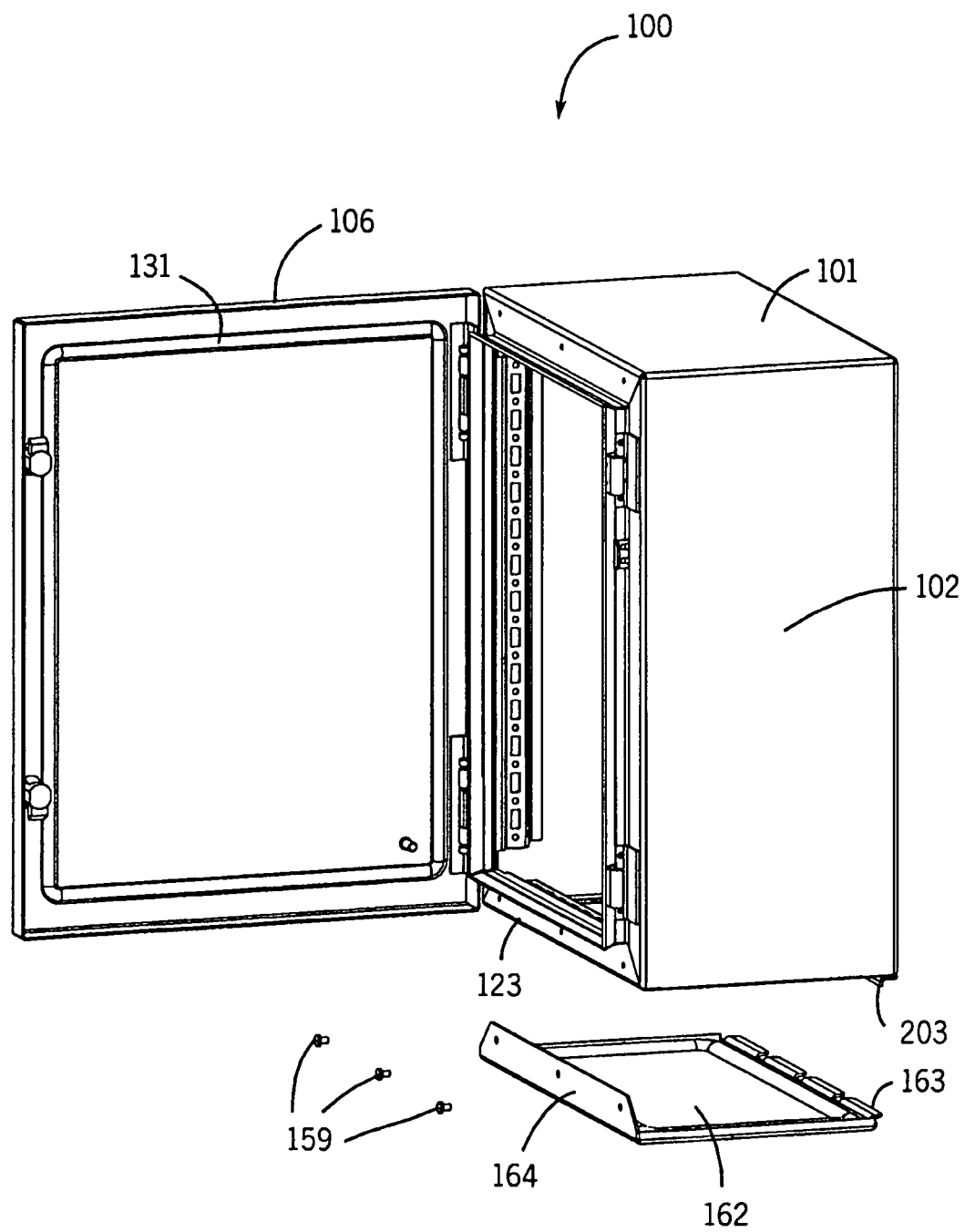
FIG. 26C is a first exploded parts view of the enclosure and gland plate of FIGS. 26A-26B.
Figure 26D:
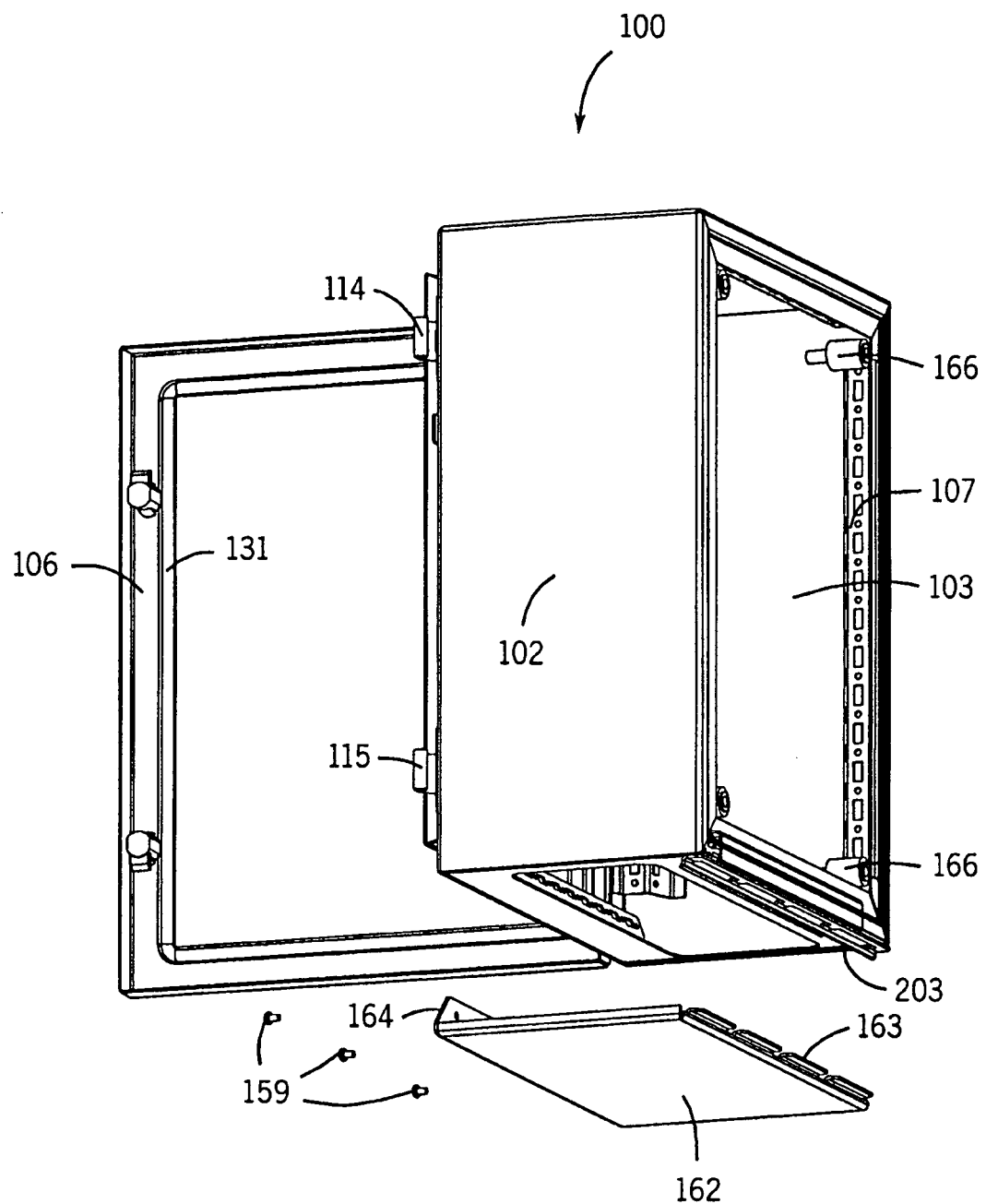
FIG. 26D is a second exploded parts view of the enclosure and gland plate of FIGS. 26A-26C.
Figure 27A:
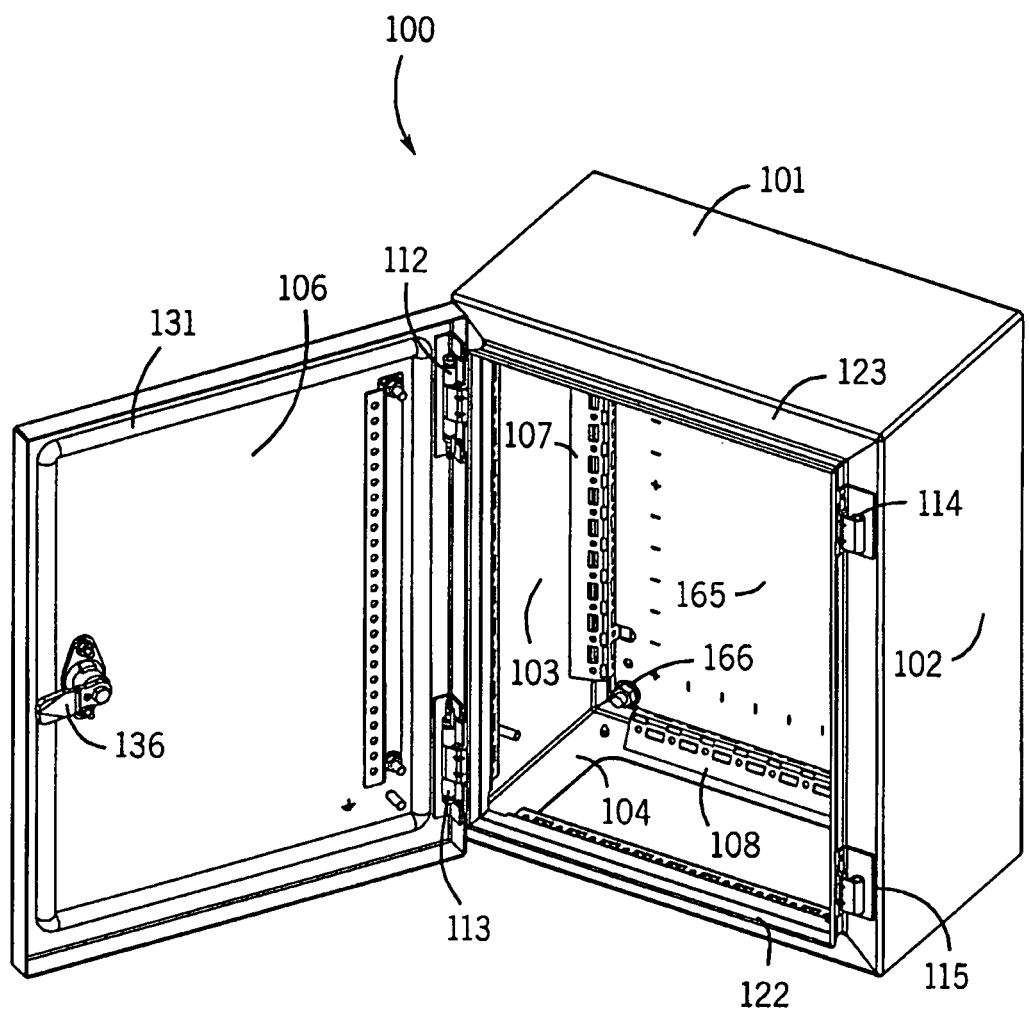
FIG. 27A is an inside view the enclosure of FIG. 8 in accordance with various embodiments of the invention.
Figure 27B:
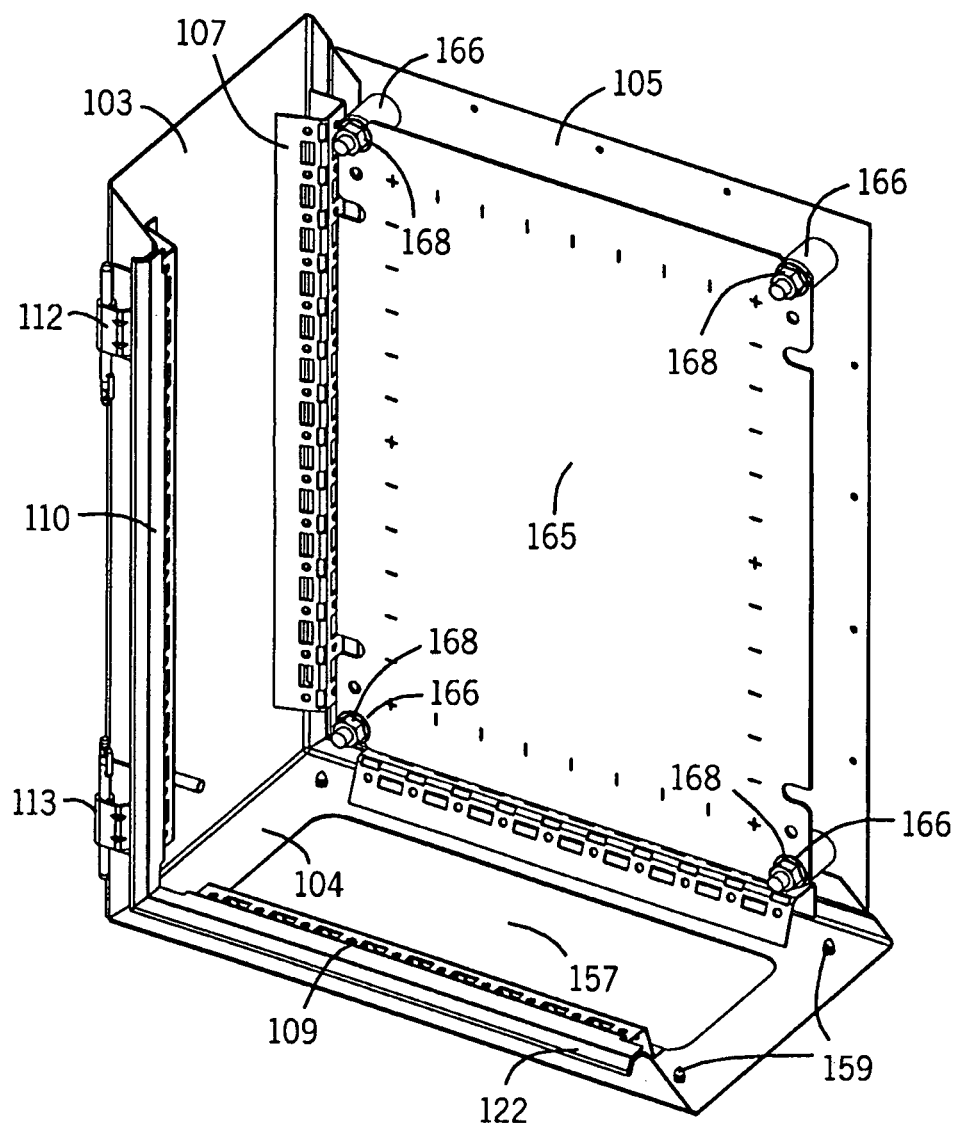
FIG. 27B is a sectional perspective view of the enclosure of FIG. 27A.

Additionally, FIGS. 26A-26C illustrate the enclosure 100, with the back wall 105 removed, including another design of a gland plate 162, in accordance with various embodiments of the invention. The gland plate 162 illustrated therein can be externally mounted to sidewall 104 by engaging a flange feature 163 on the gland plate 162 through holes of an extension 203 below the enclosure 100. The gland plate 162 can then be pressed up against the bottom perimeter 123 of the enclosure 100 and secured with fasteners 159 (e.g., screws) passing through an extension 164 formed at the front of the gland plate 162 and into the front face of the bottom perimeter 123. With this configuration, the fasteners 159 holding the gland plate 162 in place can be secured behind the closed door 106, preventing anyone from tampering with the gland plate 162 attachment. Also, as shown, gland plate 162 can substantially cover all of bottom sidewall 104.

FIGS. 27-30C illustrate a series of mounting panels than can be used with various embodiments of the invention. FIGS. 27A-27B illustrate a full backside mounting panel 165. The full backside mounting panel 165 can be coupled to a plurality of standoffs 166. Standoffs 166 can be coupled (e.g., welded) to the back wall 105 near each corner. The full backside mounting panel 165 can include mounting holes 167 to engage standoffs 166. Nuts 168 or similar can be used to prevent the backside mounting panel 165 from sliding off the standoffs 166. FIGS. 28A-28B illustrate partial backside mounting panels 169, 170. Partial backside mounting panels 169, 170 can be coupled to the enclosure 100 via mounted standoffs 171. Mounted standoffs 171 can be coupled to the mounting channels 107-110 rather than the back wall 105. In addition, mounted standoffs 171 can be coupled to side rails 116 to allow the partial backside mounting panels 169, 170 to be mounted at different depths within the enclosure 100. Partial backside mounting panels 169, 170 can include mounting holes 167 and also a plurality of perforations 172 to temporarily engage standoffs 166 or mounted standoffs 171.

Figure 28A:
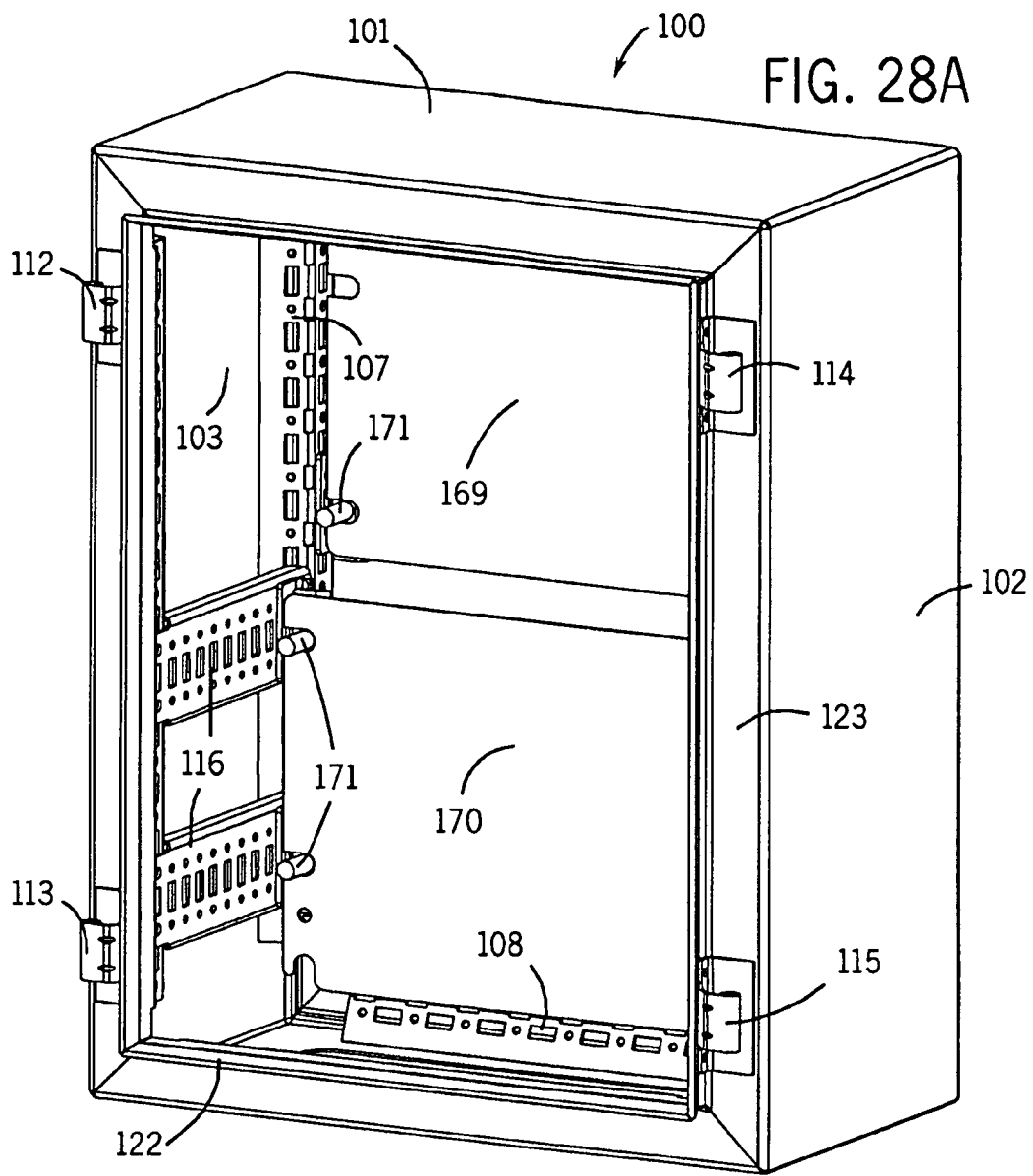
FIG. 28A is an inside view the enclosure of FIG. 8 in accordance with various embodiments of the invention.
Figure 28B:
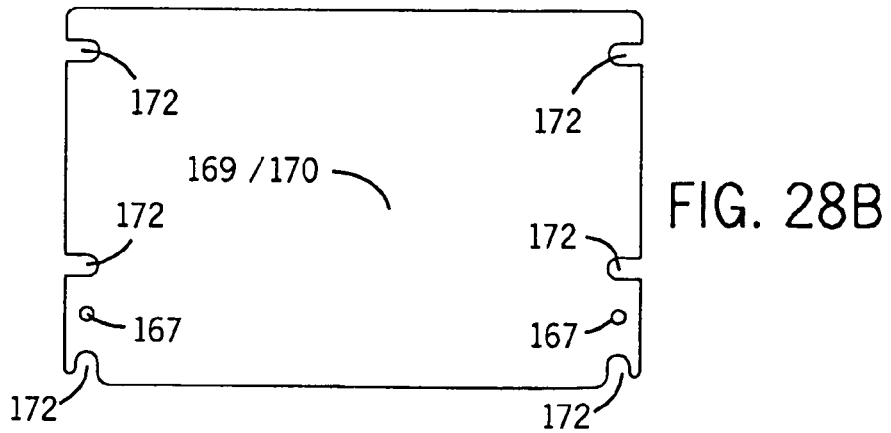
FIG. 28B is a top view of a partial backside mounting panel.
Figure 29A:
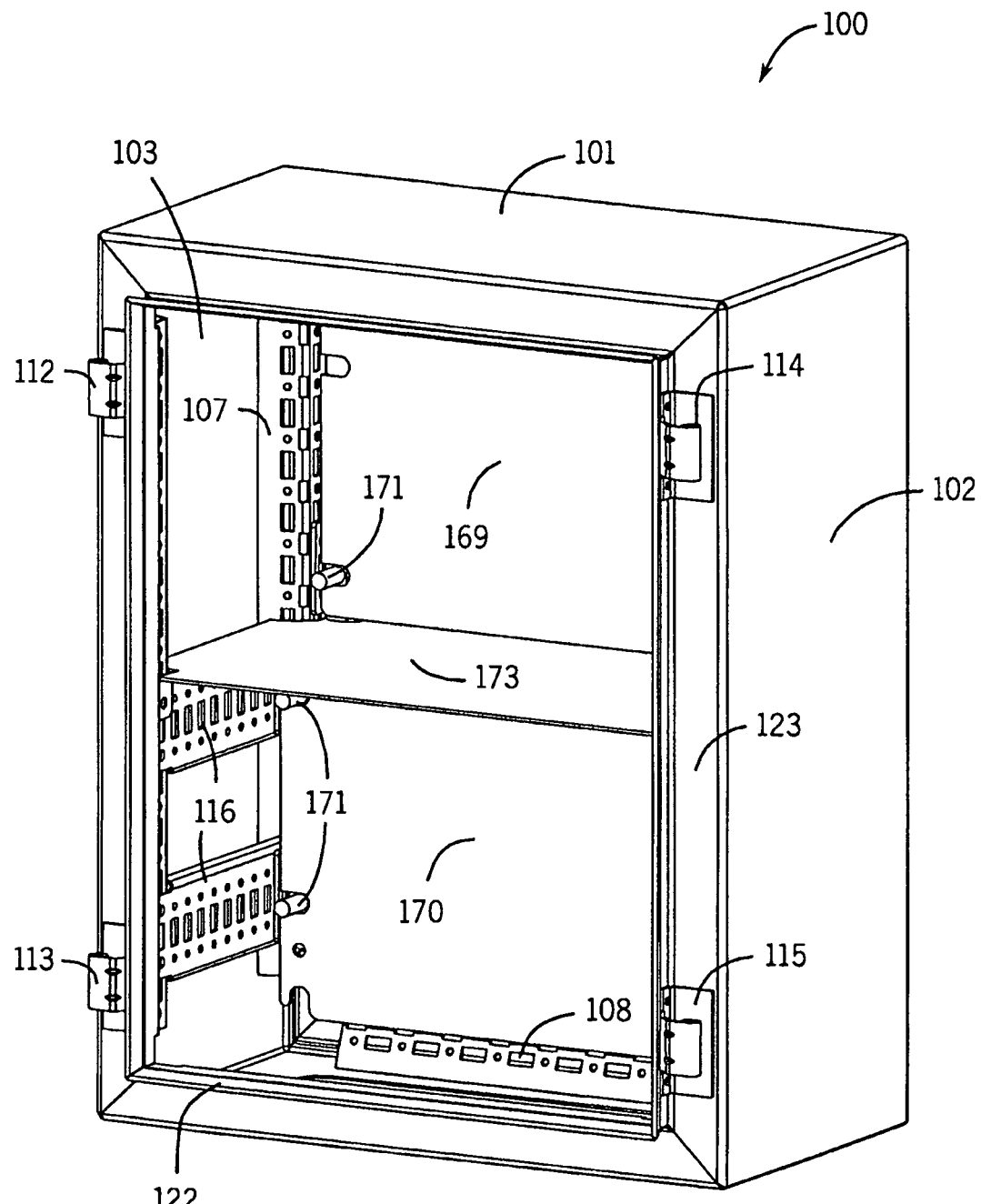
FIG. 29A is an inside view the enclosure of FIG. 8 in accordance with various embodiments of the invention.
Figure 29B:
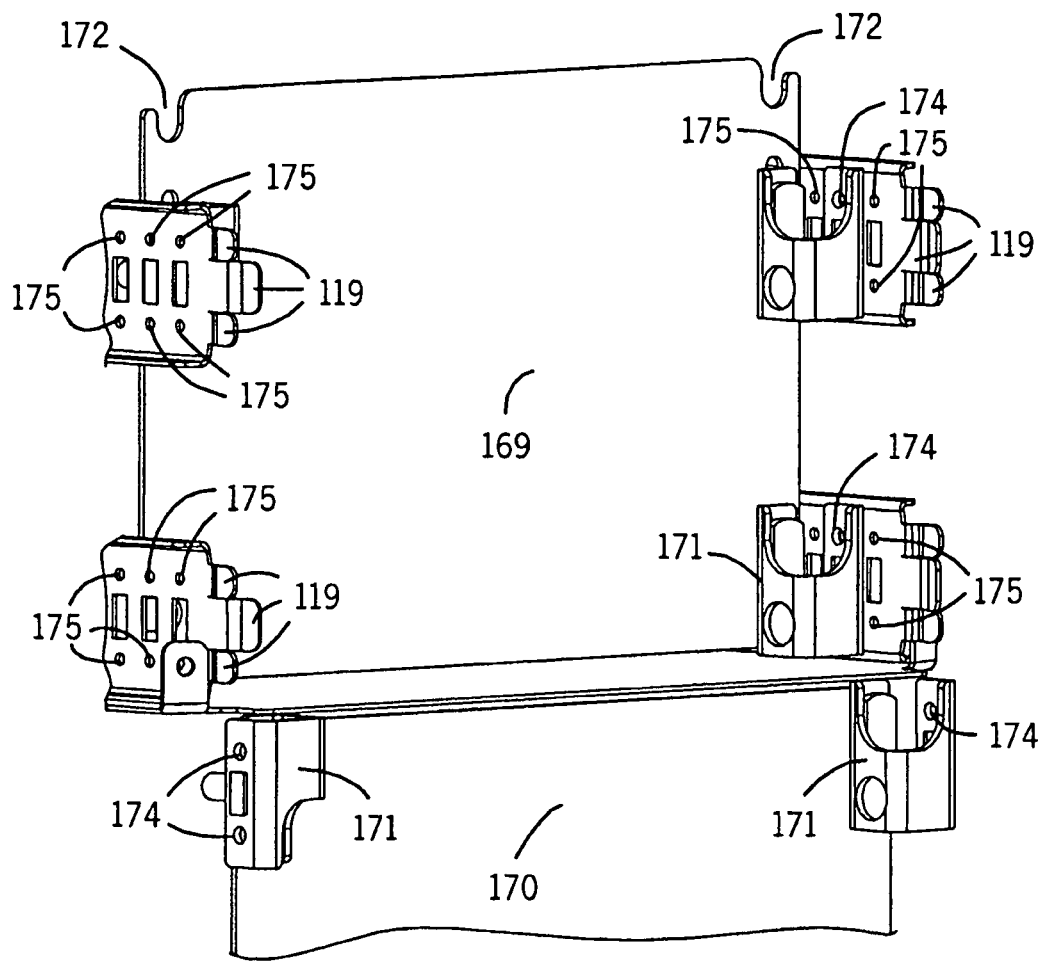
FIG. 29B is a back view of partial backside mounting panels and a divider mounted to side rails.

FIGS. 29A-29E illustrate the enclosure 100 as shown in FIG. 28A further including a split panel or divider 173 that can divide the inside of the enclosure 100. FIG. 29B offers a backside view of the partial backside mounting panels 169, 170 coupled to mounted standoffs 171. The view of FIG. 29B illustrates how the mounted standoffs 171 can be coupled to the side rails 116 by aligning an aperture 174 on the mounted standoff 171 to an aperture 175 on the side rail 116 and fastening them together with a fastener (not shown). Mounted standoffs 171 can similarly be coupled to the mounting rails 107-110 by aligning apertures 174 on the mounted standoffs 171 to apertures 120 on the mounting rails 107-110.

Figure 29C:
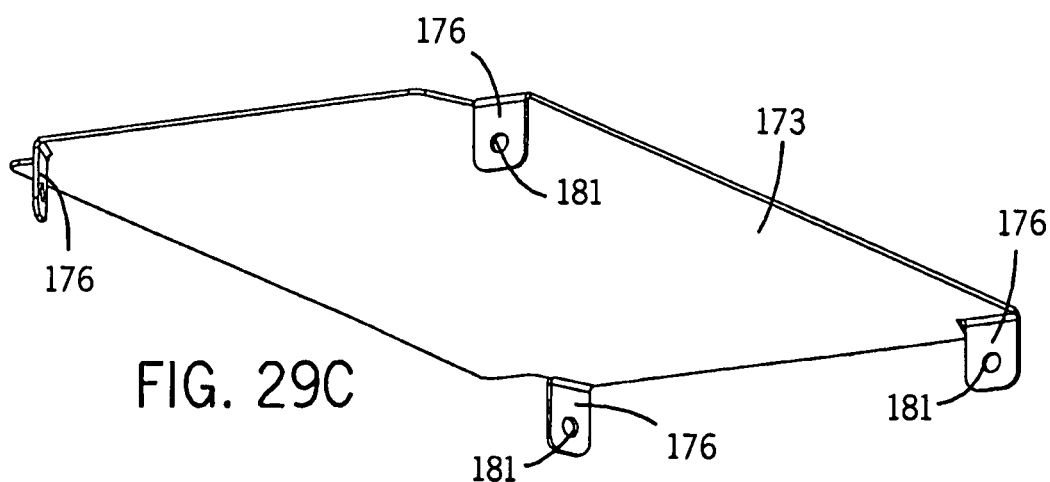
FIG. 29C is a perspective view the divider in FIG. 29B.
Figure 29D:
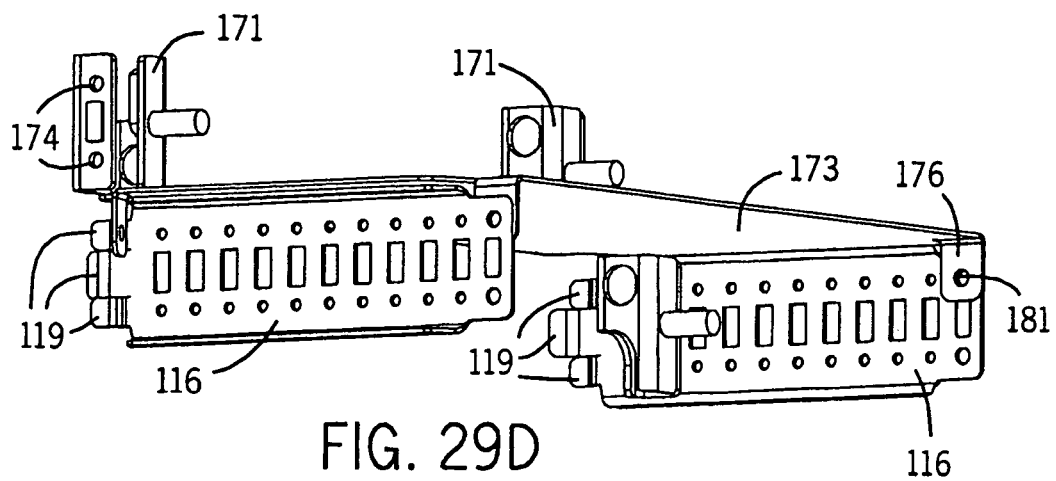
FIG. 29D is a perspective view the divider of FIGS. 29B-29C mounted to side rails.
Figure 29E:
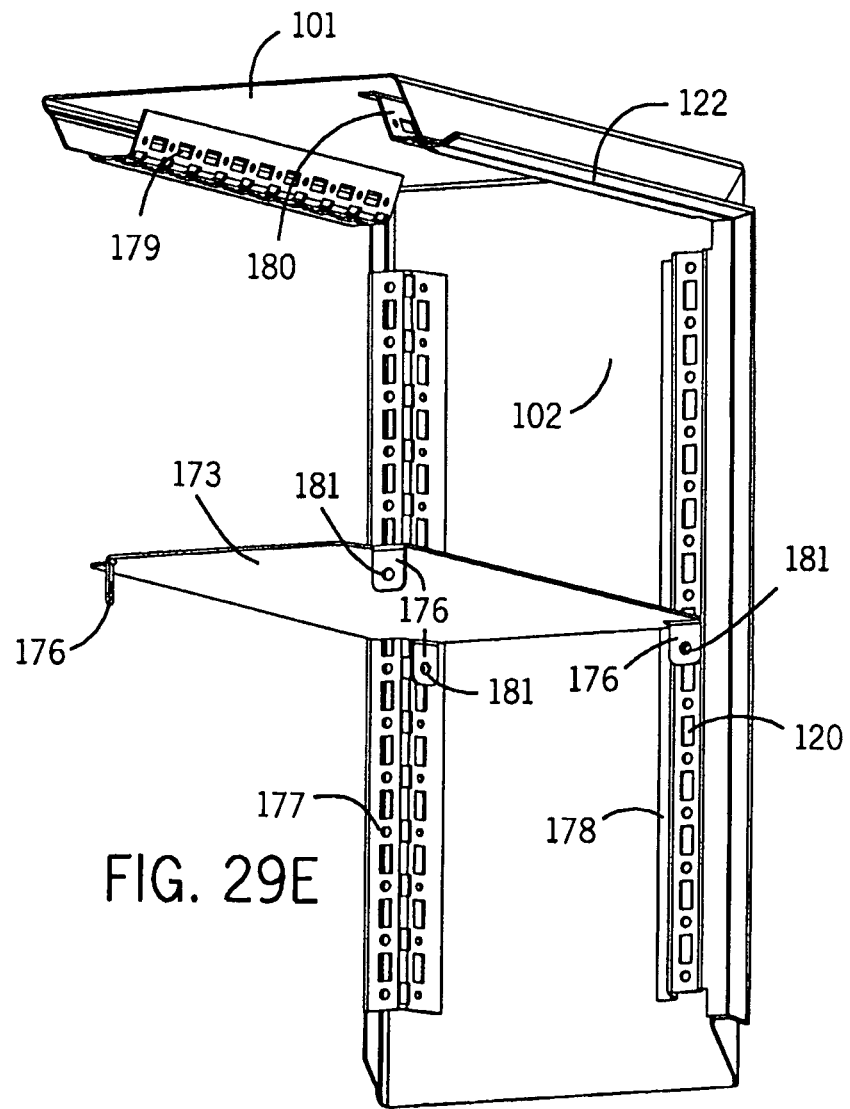
FIG. 29E is a sectional perspective view the divider of FIGS. 29B-29C mounted in the enclosure of FIG. 29A.

FIGS. 29C-29E each illustrate the same view, but include different parts of the enclosure 100. FIG. 29C shows the divider 173, which can include notches 176. FIG. 29D shows the divider 173 resting on mounted standoffs 171, which can be coupled to side rails 116. If mounted standoffs 171 are not used, the divider 173 can be coupled to the mounting rails 107, 110 and mounting rails 177, 178, as shown in FIG. 29E. FIG. 29E illustrates two sidewalls 101, 102 with mounting rails 177, 178, 179, 180. Holes 181 on the notches 176 of the divider 173 can be aligned with apertures 120 on the mounting rails 107, 110, 177, 178 and fastened to the mounting rails 107, 110, 177, 178 with fasteners (not shown).

Figure 30A:
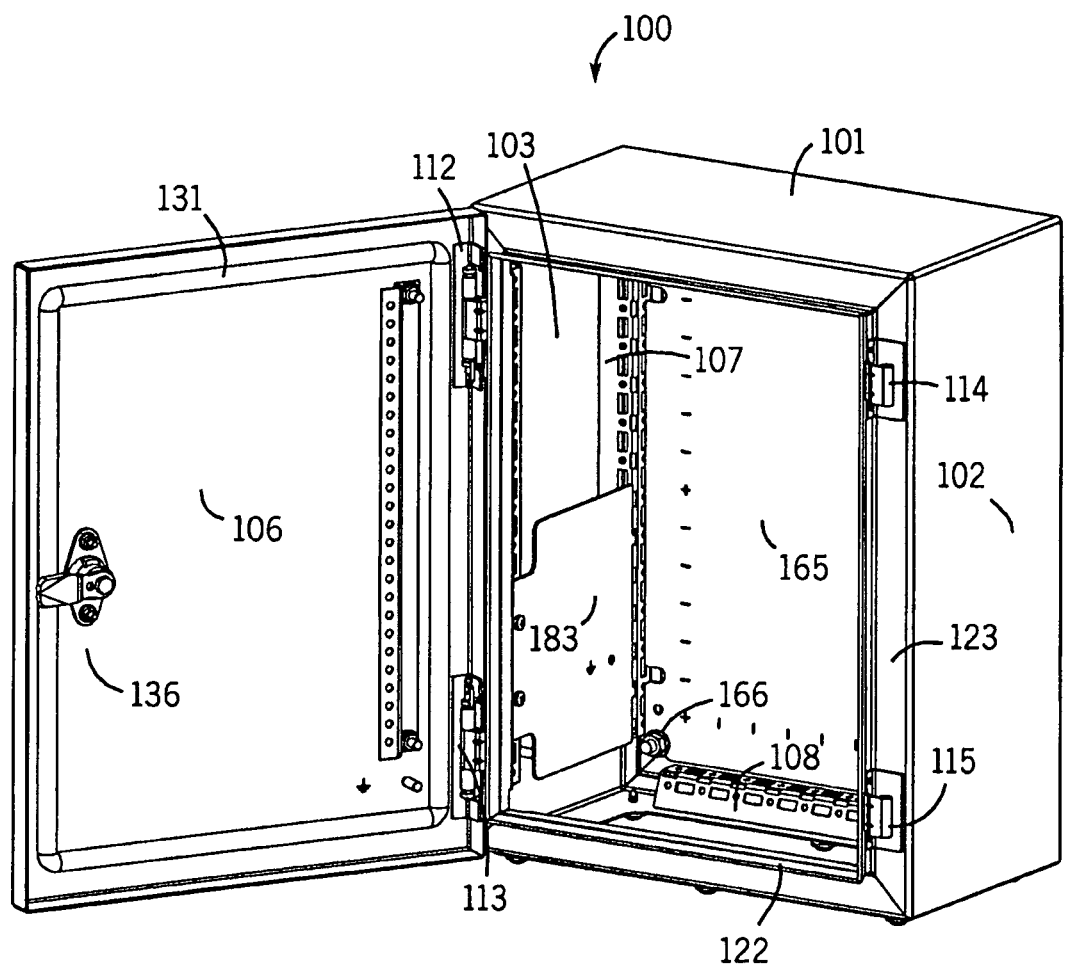
FIG. 30A is an inside view the enclosure of FIG. 8 in accordance with various embodiments of the invention.
Figure 30B:
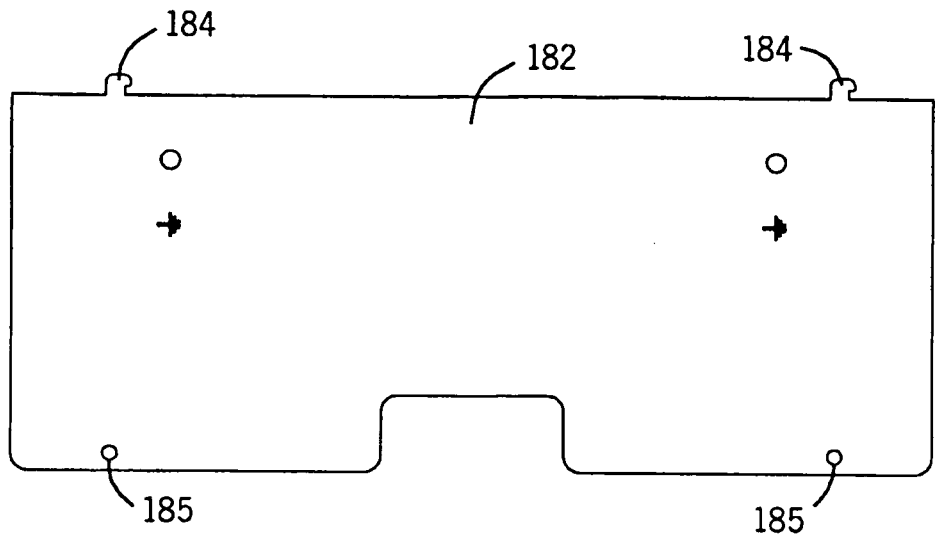
FIG. 30B is a top view of a full side mounting panel.
Figure 30C:
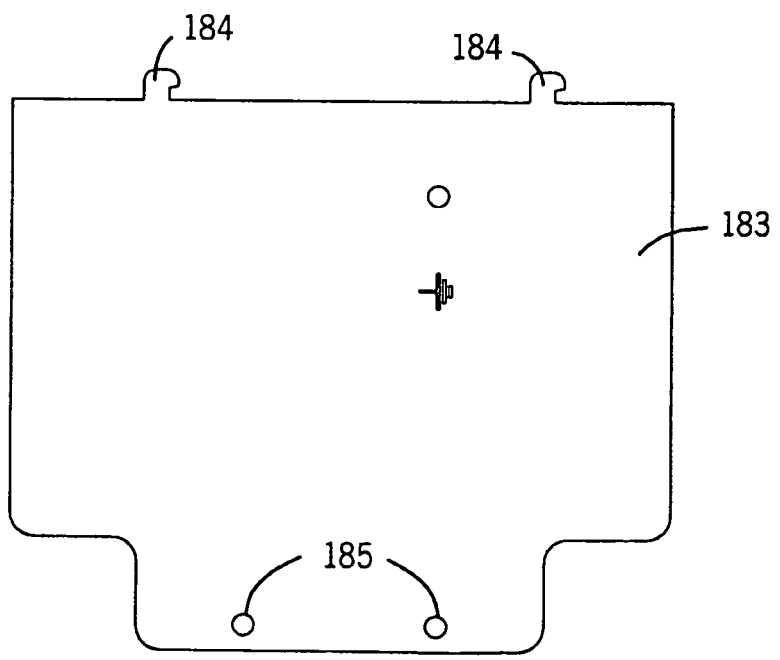
FIG. 30C is a top view of a partial side mounting panel.

FIGS. 30A-30C illustrate side mounting panels 182, 183. As shown in FIG. 30A, partial side mounting panel 183 can be coupled to mounting rails 107, 110 on sidewall 103. For convenient installment, the back of the partial side mounting panel 183 (to be installed towards the rear of the enclosure 100) can include hooks 184 to hook into apertures 120 on the rear mounting rail 107. The front of the partial side mounting panel 183 can include holes 185 to align with apertures 120 on the front mounting rail 110 to couple the partial side mounting panel 183 to the mounting rail 110 with fasteners 159. FIG. 30B illustrates a full side mounting panel 182, which can be coupled to sidewall 103 similar to the coupling described for partial side mounting panel 183 in FIG. 30A. FIG. 30C further illustrates the partial side mounting panel 183.

Figure 31A:
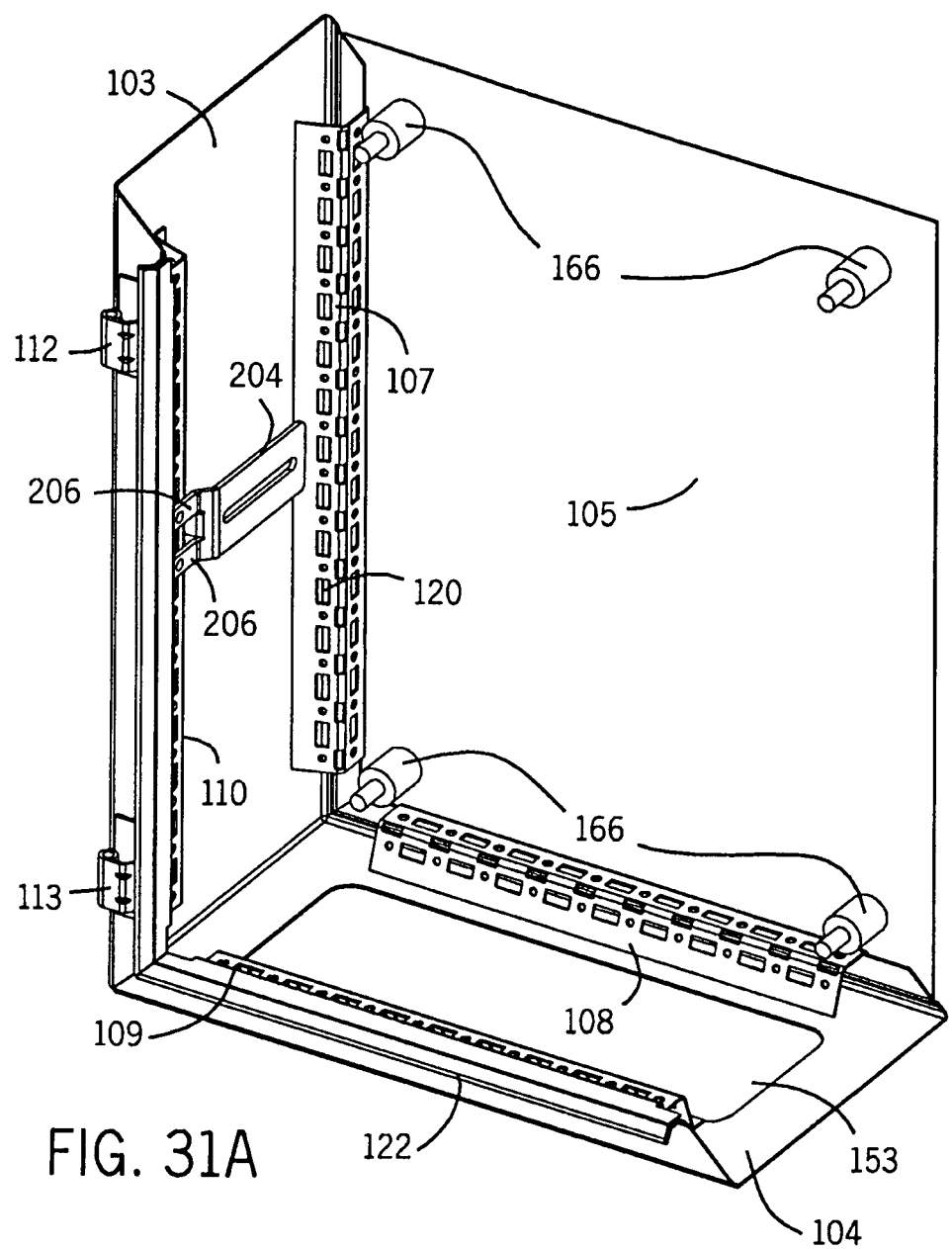
FIG. 31A is a section perspective view the enclosure of FIG. 8 in accordance with various embodiments of the invention.
Figure 31B:
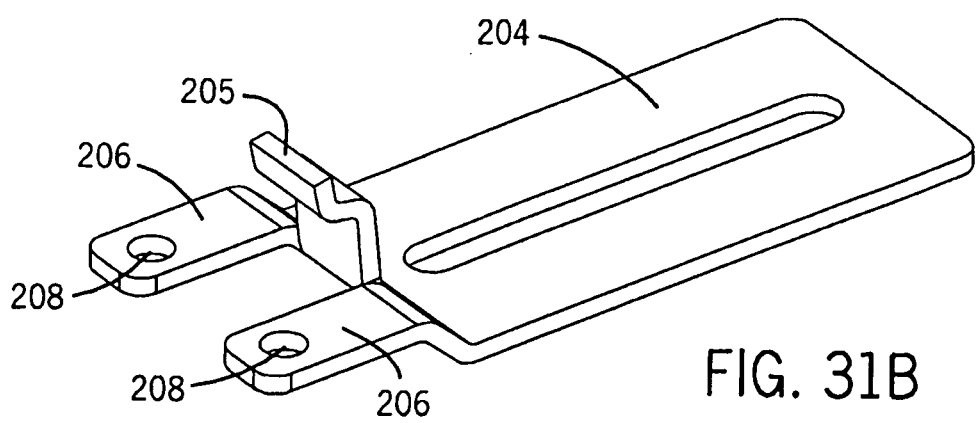
FIG. 31B is an perspective view of a mounting bracket.

FIGS. 31A-31B illustrate a mounting bracket 204. The mounting bracket 204 can be coupled to a mounting channel 110, as shown in FIG. 31A. The mounting bracket 204 can include a flange 205 and two notches 206 for coupling the mounting bracket 204 to a mounting channel 110. The flange 205 can fit through an aperture 120 on the mounting channel 110, while fasteners (not shown) through holes 208 on notches 206 and subsequently through apertures 120 on the mounting channel 110 can fasten the mounting bracket 204 to the mounting channel 110.

Figure 32A:
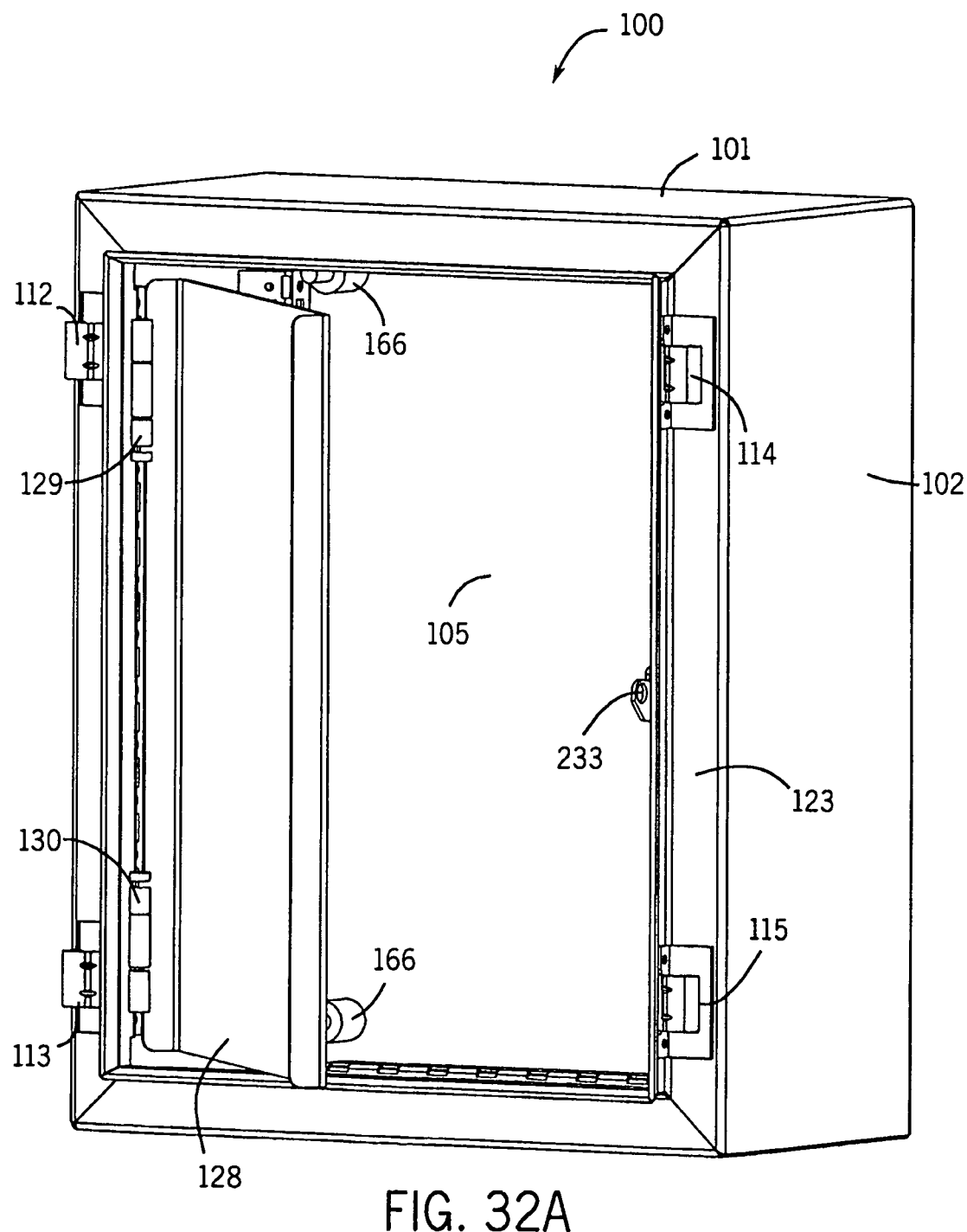
FIG. 32A is a sectional perspective view of a swing panel mounted to the enclosure of FIG. 8, in accordance with various embodiments of the invention.
Figure 32B:
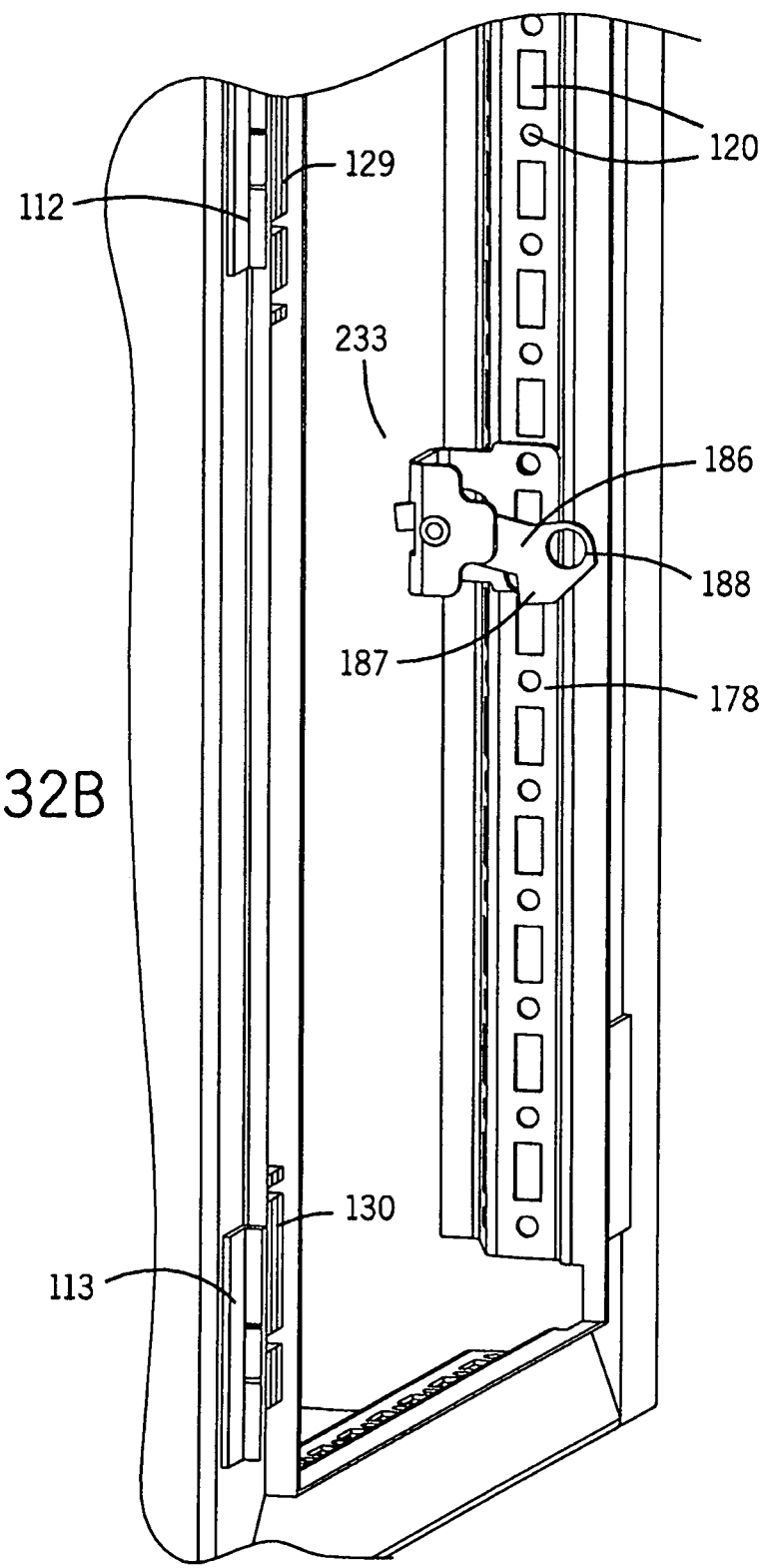
FIG. 32B is a sectional perspective view of the enclosure having a rotatable latch, for use with the swing panel of FIG. 32A.

FIG. 32A illustrates the enclosure 100 including the swing panel 128. The swing panel 128 can be hingedly mounted via hinges 129, 130 to side channels or mounting channels within the enclosure 100. Hinges 129, 130 can be structured similar to hinges 112-115. The swing panel 128 can be used to discourage users from accessing electronics in the rear of the enclosure 100. The swing panel 128 can be locked by latching mechanism 233, shown in FIG. 32B. The latching mechanism 185 can include a rotatable latch 186 with a notch 187 including a padlock ring 188 to engage a padlock (not shown). A slit (not shown) in the swing panel 128 can receive the rotatable latch 186 when the swing panel 128 is closed so that the notch 187 extends out past the swing panel 128. The rotatable latch 186 can be rotatable such that once completely received through the slit on the swing panel 128, the rotatable latch 186 will rotate downward until it rests on the slit. To open the swing panel 128, a user can lift up the rotatable latch so that the notch 187 can pass through the slit on the swing panel 128. Hinges 189 for the swing panel as well as the latching mechanism 185 can be coupled to mounting channels 110, 180 by fasteners 159 (not shown). Alternatively, the swing panel 128 can be fixedly mounted (not illustrated) within the enclosure 100, by means of side channels 118 for example.

Figure 33:
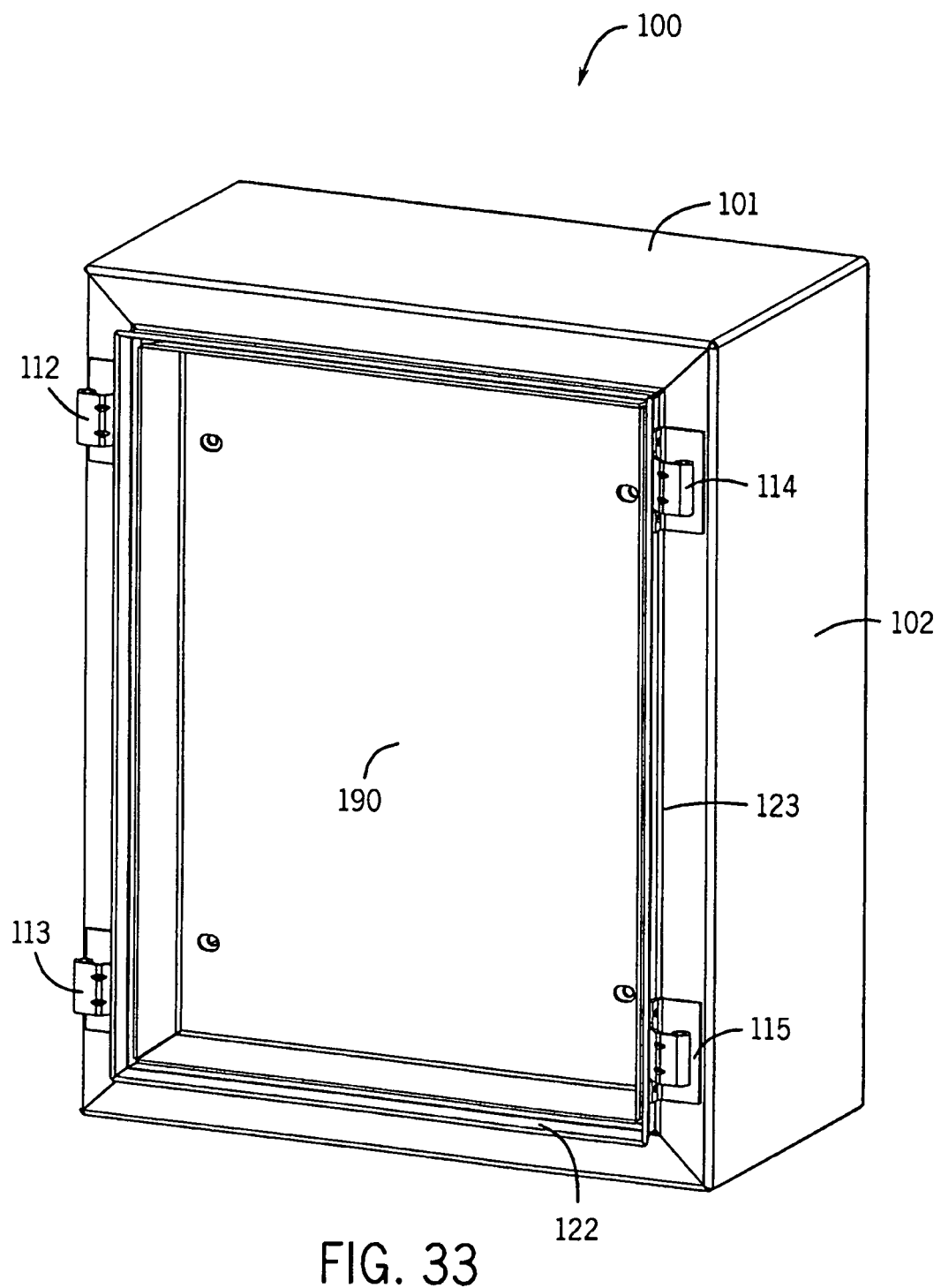
FIG. 33 is a perspective interior view of the enclosure of FIG. 8 including a dead front in accordance with various embodiments of the invention.

FIG. 33 illustrates the enclosure 100 including a dead front panel 190. The dead front panel 190 can be a more permanent mechanism to protect the electronics at the rear of the enclosure from a user. The dead front panel 190 can be coupled to standoffs 166 or mounted standoffs 171 and secured via nuts or similar (not shown).

FIGS. 34-39B illustrate various designs for mounting feet 191-194 in accordance with various embodiments of the invention. Mounting feet 191-194 can be used for mounting the enclosure 100 to a surface (not shown). Mounting feet 191-194 can be stamped out of mild steel or stainless steel, for example.

Figure 34:
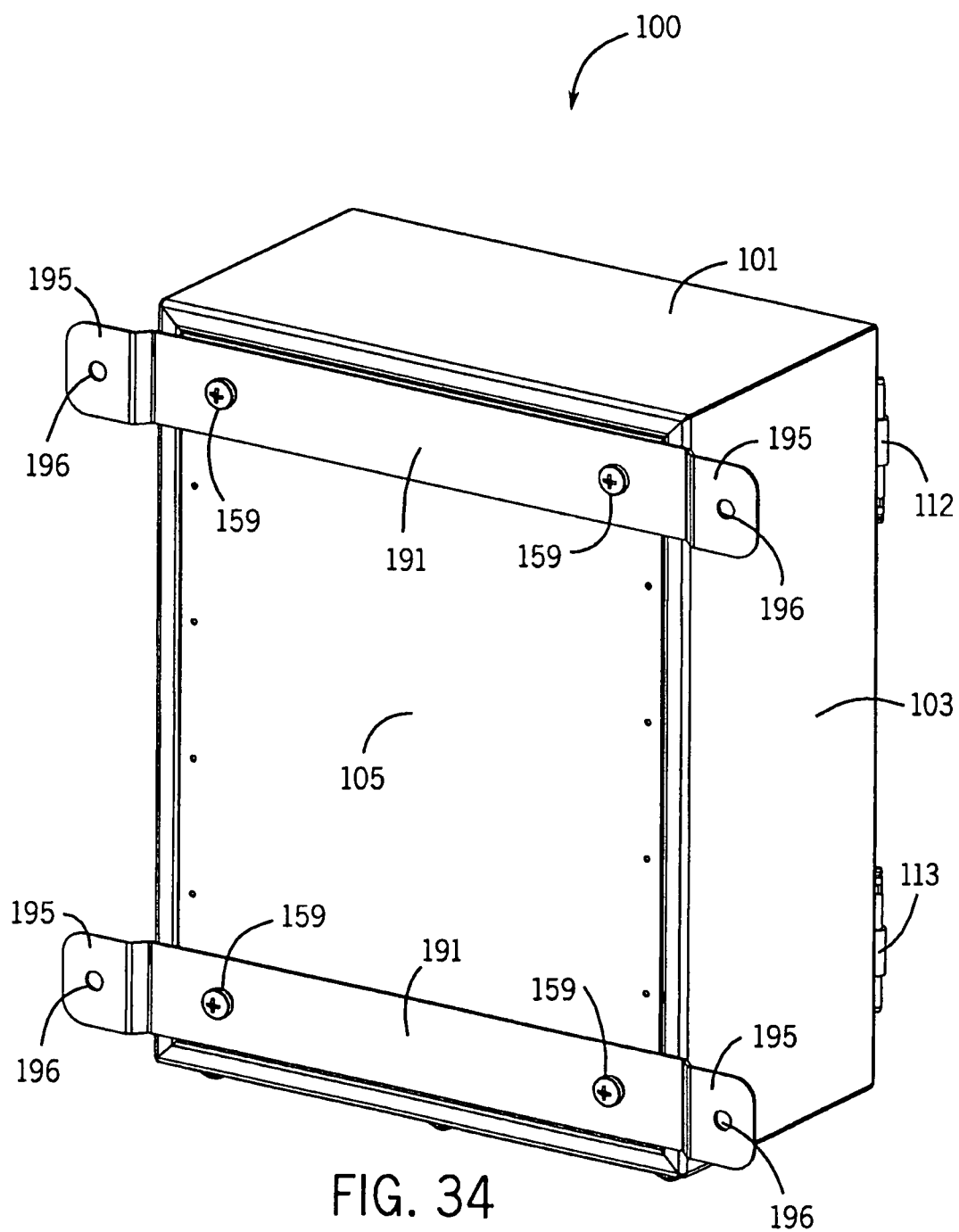
FIG. 34 is an backside view the enclosure of FIG. 8 including mounting feet in accordance with various embodiments of the invention.
Figure 35:
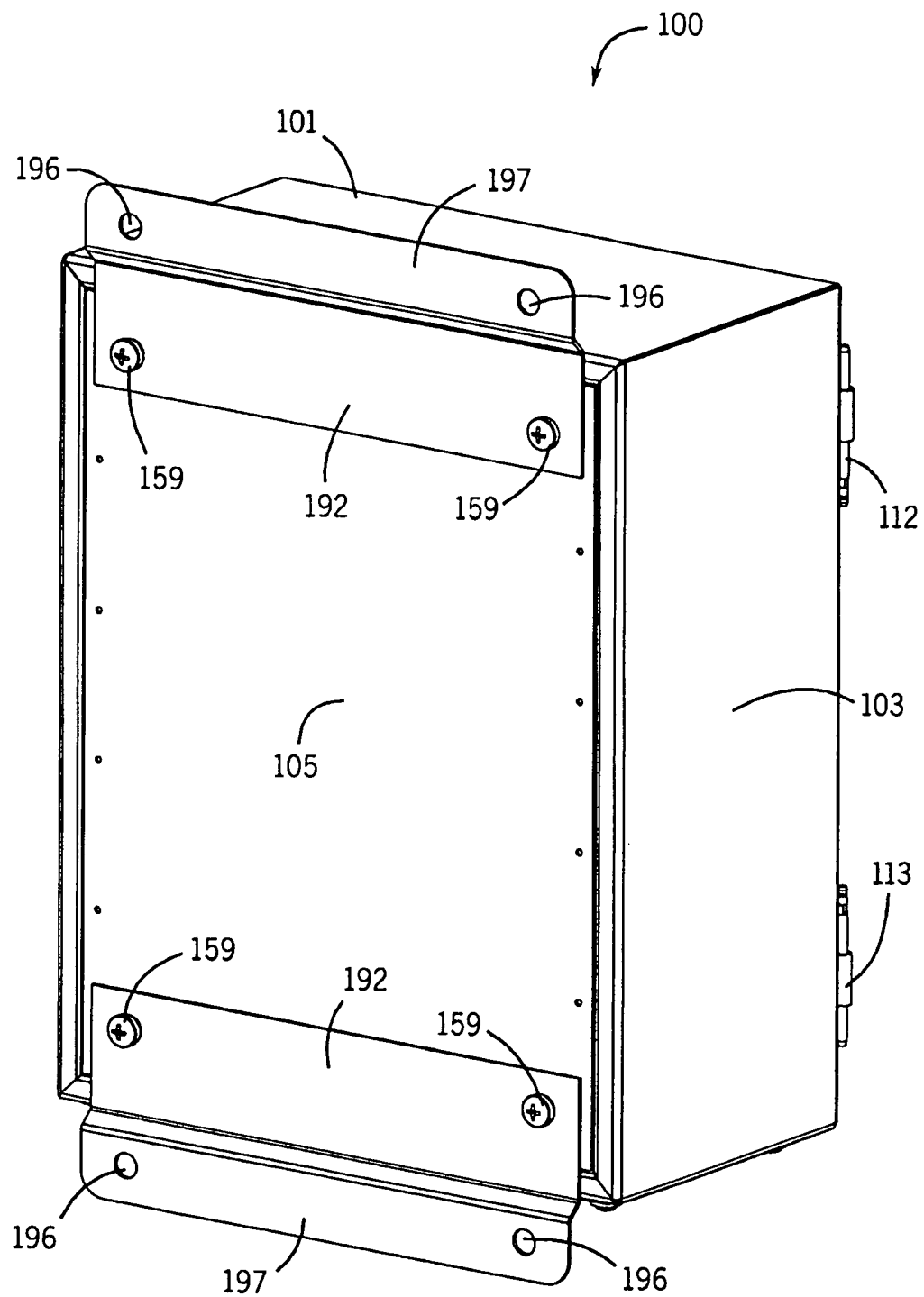
FIG. 35 is an backside view the enclosure of FIG. 8 including alternative mounting feet in accordance with various embodiments of the invention.
Figure 36A:
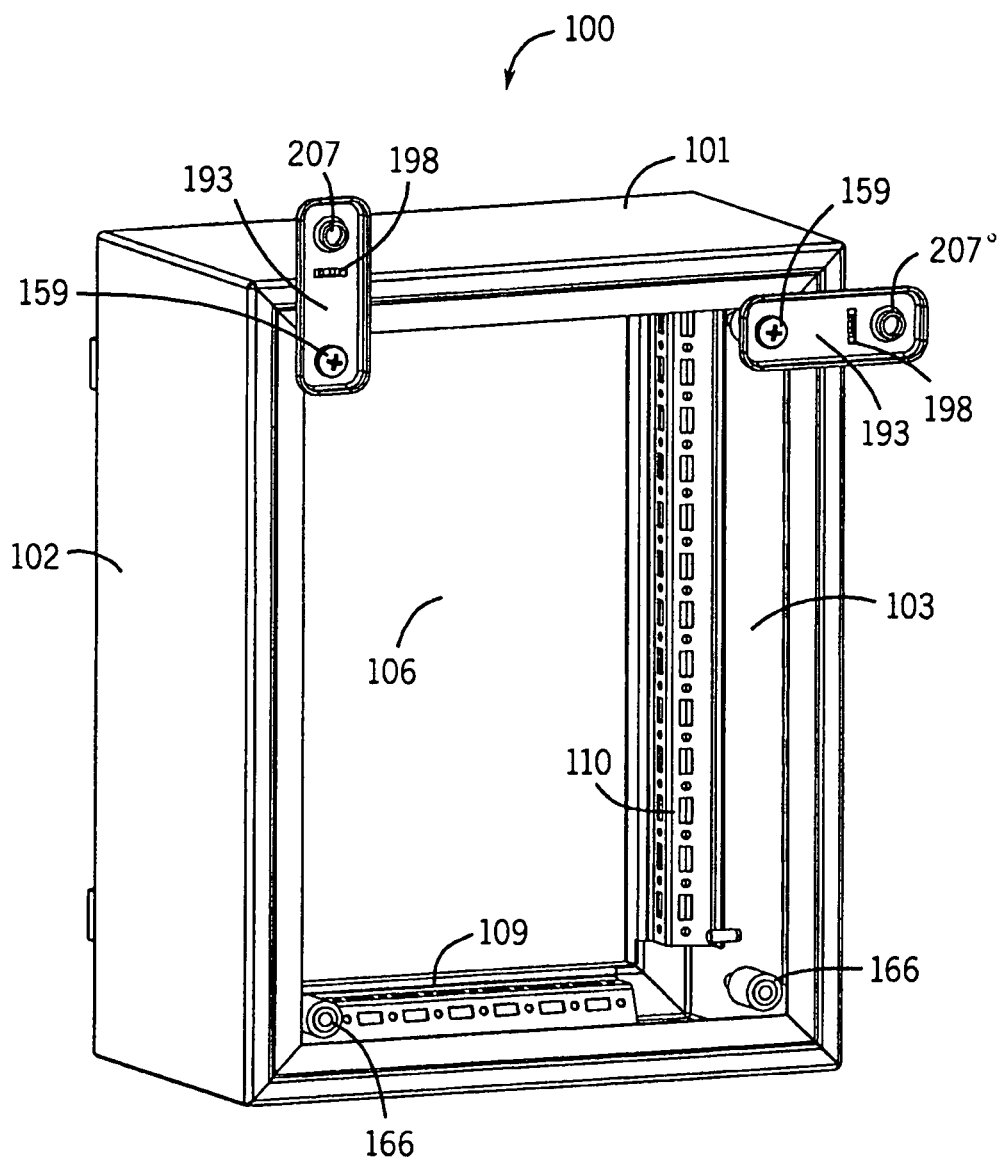
FIG. 36A is an backside view the enclosure of FIG. 8 including alternative mounting feet in accordance with various embodiments of the invention.
Figure 36B:
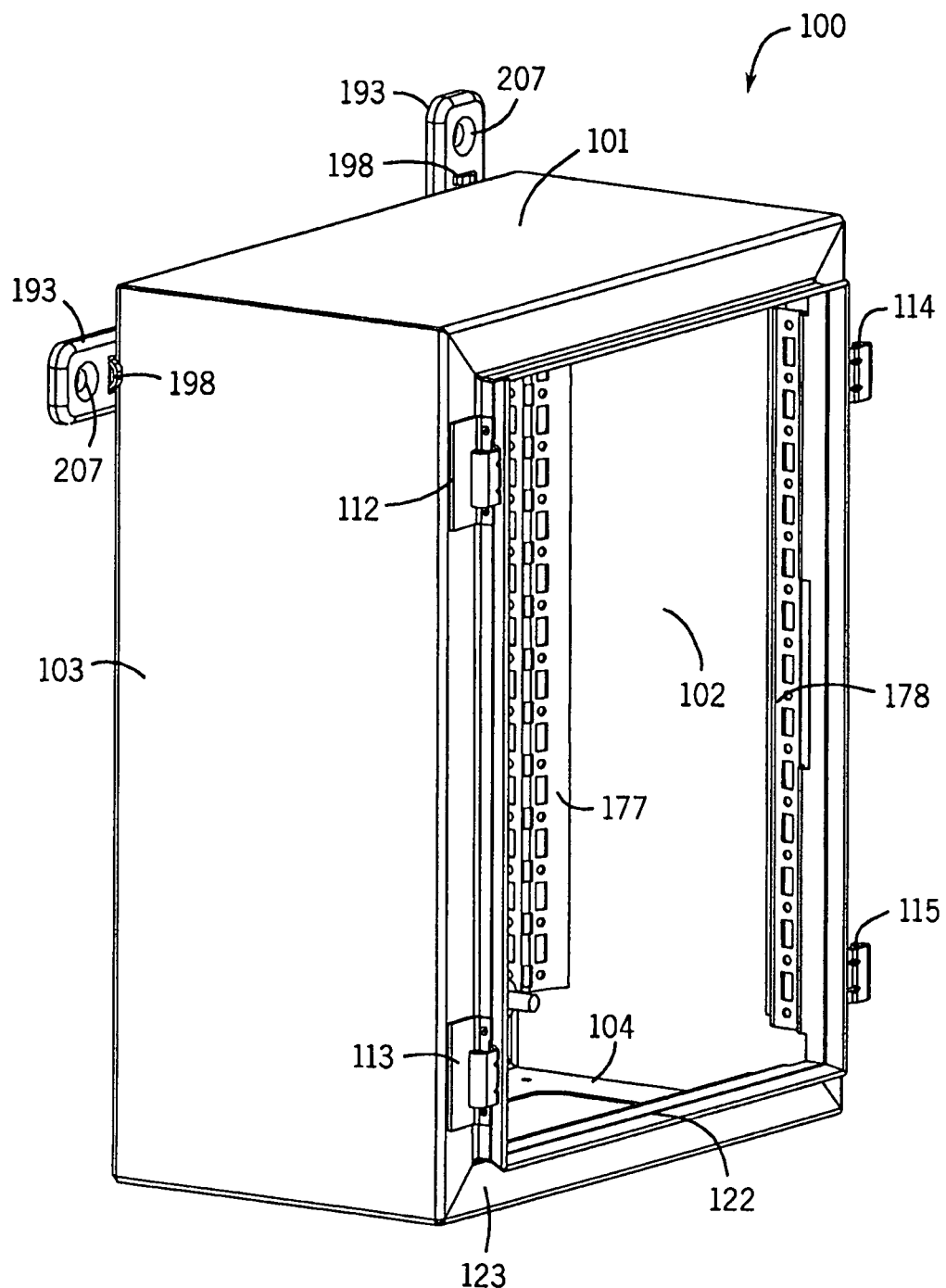
FIG. 36B is an inside view the enclosure of FIG. 8 including the mounting feet of FIG. 36A.
Figure 37A:
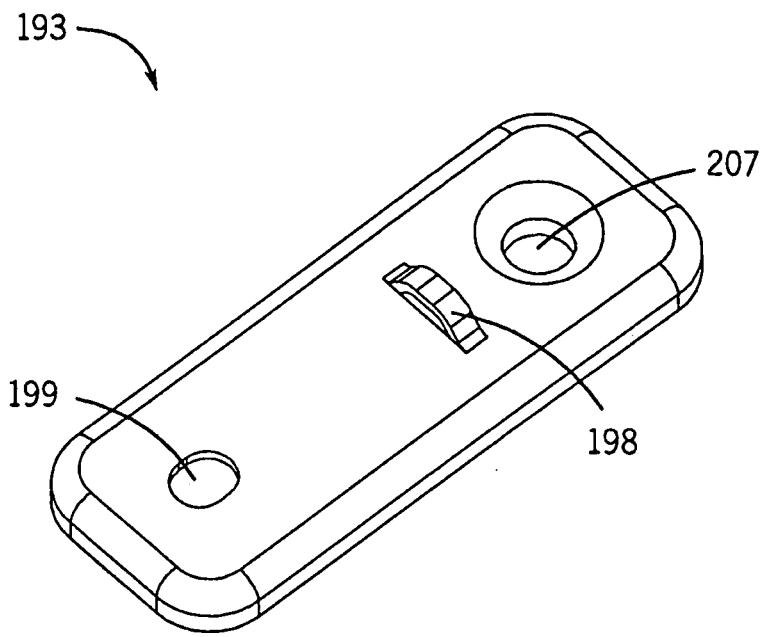
FIG. 37A is a first perspective view of the mounting feet of FIGS. 37A-37B.
Figure 37B:
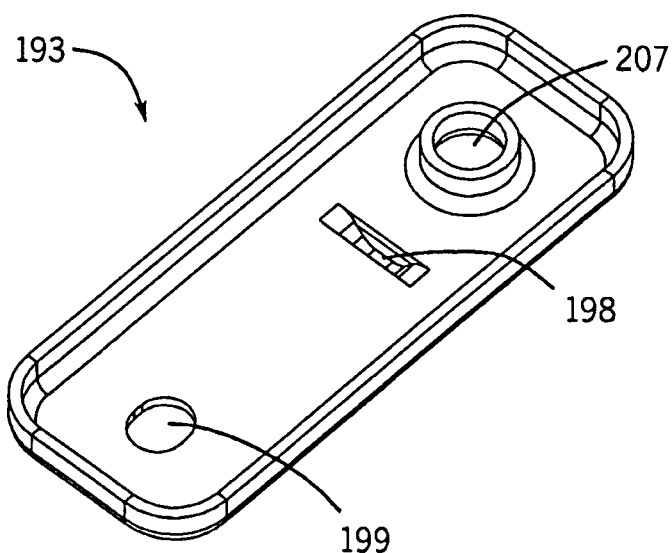
FIG. 37B is a second perspective view of the mounting feet of FIGS. 37A-37B.

With reference to FIG. 34, mounting feet 191 can be strips that extend along the top and bottom of the back wall 105, such that two mounting feet can be sufficient to mount the enclosure 100 to a surface. Mounting feet 191 can have notches 195 with holes 196 to couple mounting feet 191 to surfaces on either side of the enclosure 100. The mounting feet 191 can be coupled to the back wall 105 via fasteners 159. FIG. 35 illustrates mounting feet 192. The mounting feet 192 can again be strips that extend along the top and bottom of the back wall 105 and can be coupled to the back wall 105 via fasteners 159. However, mounting feet 192 can include flanges 197 spanning the entire length of the enclosure 100 and extending from the top and bottom of the enclosure 100. The flanges 197 can include holes 196 to couple mounting feet 192 to surfaces above and below the enclosure 100. In some embodiments 197, the flanges do not span the entire length of the enclosure 100.

As illustrated in FIGS. 36A-37B, mounting feet 193 can be coupled to each corner of the back wall 105 (not shown), according to various embodiments of the invention. In some embodiments, only one, two, or three mounting feet 193 can be used. Mounting feet 193 can be coupled to the backwall 105 via fasteners 159 through holes 199. Mounting feet 193 can be coupled to surfaces either above, below, or beside the enclosure 100. Further, a lance form 198 protruding from the face of the mounting foot 193 can prevent the mounting foot 193 from rotating when it is coupled to enclosure 100 in the desired orientation. An extruded hole 207 can prevent the mounting foot 193 from collapsing or deforming when a fastener 159, such as a bolt, coupling the mounting foot 193 to a wall or other surface is tightened down.

Figure 38:
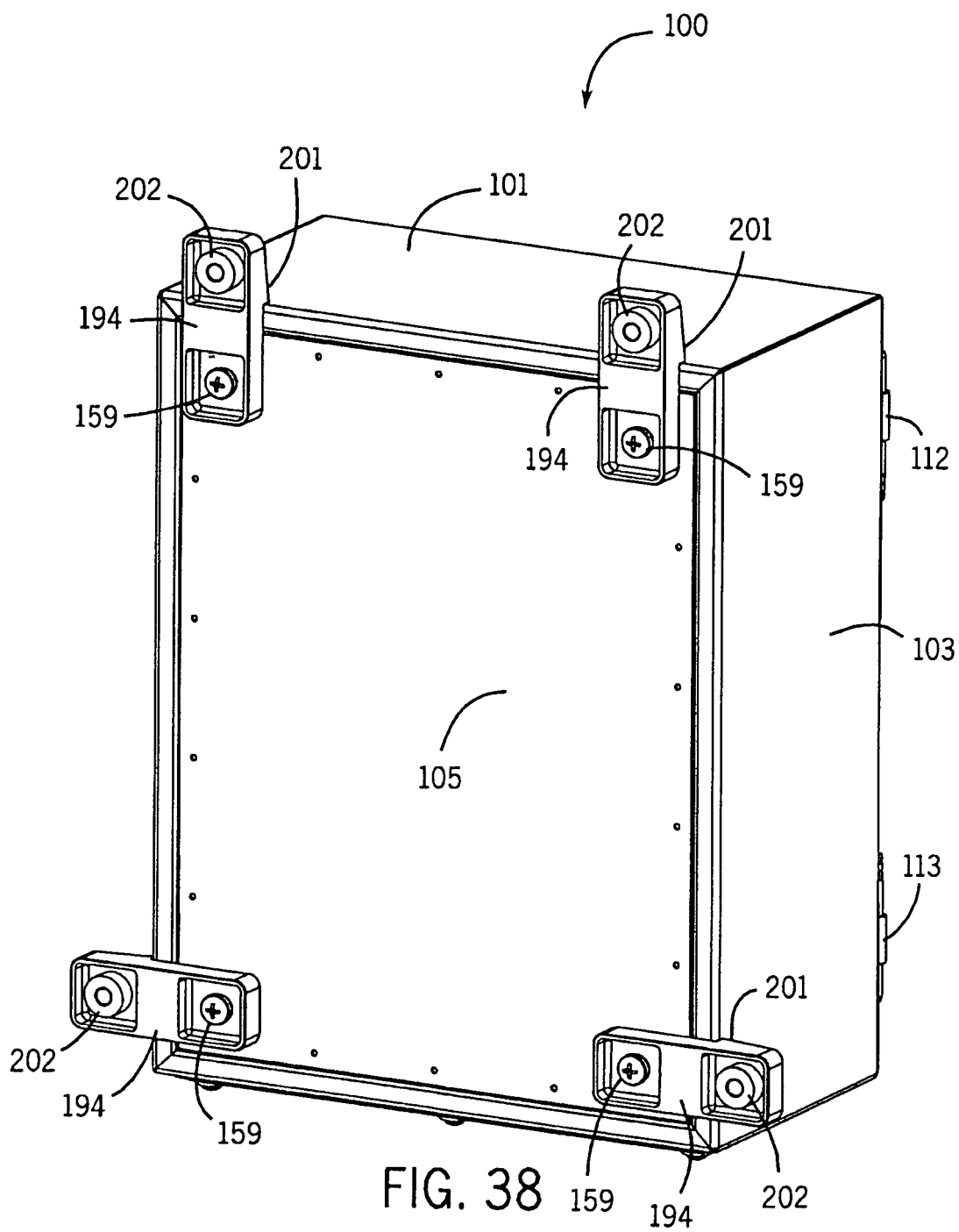
FIG. 38 is an backside view the enclosure of FIG. 8 including alternative mounting feet in accordance with various embodiments of the invention.
Figure 39A:
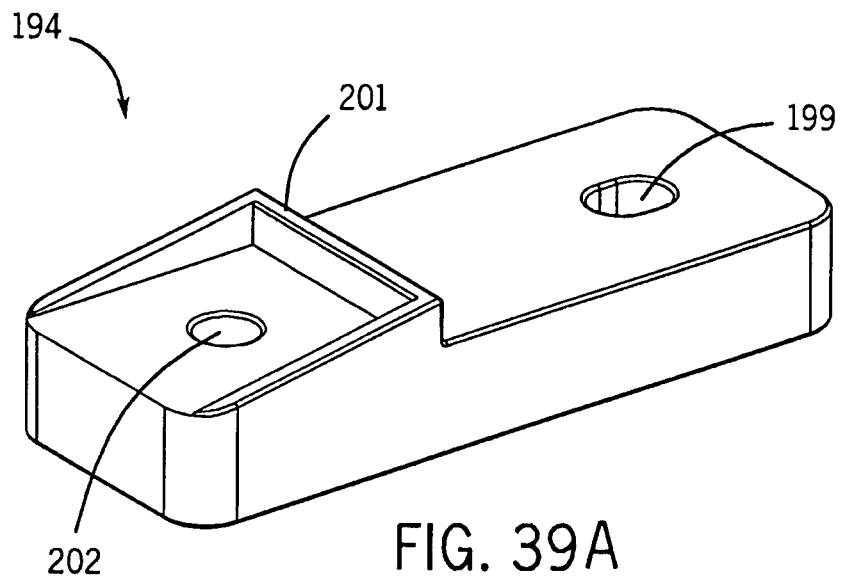
FIG. 39A is a first perspective view of the mounting feet of FIG. 38.
Figure 39B:
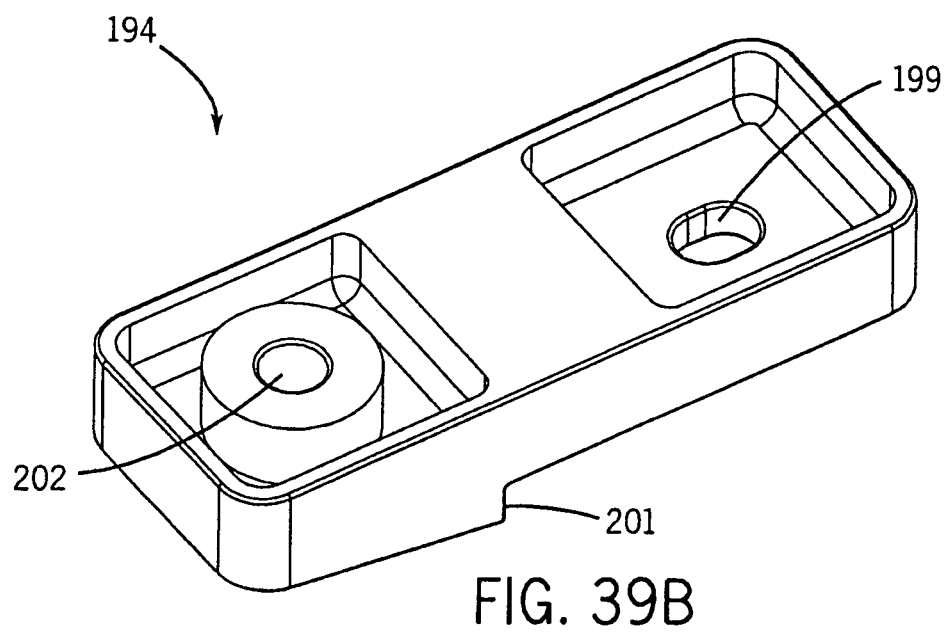
FIG. 39B is a second perspective view of the mounting feet of FIG. 38.

FIGS. 38-39B illustrates a fourth mounting foot 194 design. Similar to mounting feet 193, mounting feet 194 can be coupled to four (or less) corners of the backwall 105 and can be oriented appropriately to be coupled to a surface above, below, or beside the enclosure 100. As shown in FIGS. 39A-39B, mounting foot 194 can be a more block form design and can include a more reinforced lance form 201 and an extruded hole 202. Hole 199 can be used to couple the mounting foot 194 to the back wall 105 via fasteners 159.

Thus, embodiments provide for a highly configurable enclosure for electronic components. Through the inclusion of various customizable features, such as mounting brackets, side channels, gland plates, multiple sets of door hinges, etc., users of enclosures according to various embodiments are able to achieve numerous different configurations, customized to the user's particular needs. Additionally, having mounting channels within the enclosure that are formed from a same continuous piece of sheet metal as the corresponding sidewall enhances the rigidity and overall structural integrity of the enclosure. Moreover, embodiments provide for methods of manufacturing enclosures that minimize the scrap generated therefrom, leading to significant savings in the cost of materials.

The previous description of the disclosed embodiments is provided to enable any person skilled in the art to make or use the invention. Various modifications to these embodiments will be readily apparent to those skilled in the art, and the generic principles defined herein may be applied to other embodiments without departing from the spirit or scope of the invention. Thus, the invention is not intended to be limited to the embodiments shown herein but is to be accorded the widest scope consistent with the principles and novel features disclosed herein.

The invention claimed is:

1. An enclosure for electronic components, the enclosure comprising:
   a first sidewall, a second sidewall, a third sidewall, and a fourth sidewall defining an interior space of the enclosure, the first sidewall being opposite from the third sidewall, and the second sidewall being opposite from the fourth sidewall;
   a door hingedly coupled to a front edge of one of the first sidewall, the second sidewall, the third sidewall, and the fourth sidewall, the door covering a door opening leading into the interior space;
   a first front mounting channel and a first rear mounting channel coupled to the first sidewall, wherein the first front mounting channel has a first mounting face that is oriented substantially perpendicular to the door opening and recessed relative to the door opening in a direction parallel to the door opening a first amount sufficient to allow first fastening hardware attached to the first mounting face to clear the door opening; and
   a first grid strap having a first plurality of attachment points spaced along a length of the first grid strap to accommodate mounting of components within the interior space of the enclosure, the first grid strap having a rear end and a front end, the rear end including a flange insertable into a first rear aperture formed in the first rear mounting channel and the front end including a first front aperture to receive a first fastener to mount the front end to the first front mounting channel.

2. The enclosure of claim 1 and further comprising:
   a second front mounting channel and a second rear mounting channel coupled to the third sidewall, wherein the second front mounting channel has a second mounting face that is oriented substantially perpendicular to the door opening and recessed relative to the door opening in the direction parallel to the door opening a second amount sufficient to allow second fastening hardware attached to the second mounting face to clear the door opening; and
   a second grid strap having a plurality of attachment points spaced along a length of the second grid strap to accommodate mounting of the components within the interior space of the enclosure, the second grid strap having a rear end and a front end, the rear end including a flange insertable into a second rear aperture formed in the second rear mounting channel and the front end including a second front aperture to receive a second fastener to mount the front end to the second front mounting channel.

3. An enclosure for electronic components, the enclosure comprising:
   a first sidewall, a second sidewall, a third sidewall, and a fourth sidewall defining an interior space of the enclosure, the first sidewall being opposite from the third sidewall, and the second sidewall being opposite from the fourth sidewall;
   a door hingedly coupled to a first edge of one of the first sidewall, the second sidewall, the third sidewall, and the fourth sidewall, the door covering a door opening leading into the interior space;
   a first mounting channel and a second mounting channel coupled to each one of the first sidewall, the second sidewall, the third sidewall, and the fourth sidewall, the first mounting channel having a mounting face that is oriented substantially perpendicular to the door opening and recessed relative to the door opening in a direction parallel to the door opening an amount sufficient to allow fastening hardware attached to the first mounting channel to clear the door opening;

a side channel removably coupled to the first mounting channel and the second mounting channel; and a mounting panel removably coupled to the side channel, the mounting panel providing a flat surface extending away from the side channel and the second sidewall toward the fourth sidewall electronic components being coupled to the flat surface of the mounting panel;

the side channel including a grid strap with a plurality of attachment points spaced along a length of the side channel, the plurality of attachment points enabling selective positioning of the mounting panel at a plurality of depths within the interior space in order to accommodate various sizes of electronic components attached to the mounting panel, the side channel including a first end and a second end, the first end including at least one flange to mount the first end to the first mounting channel near a front portion of the enclosure, the second end including at least one aperture to receive a fastener to mount the second end to the second mounting channel near a rear portion of the enclosure.

4. The enclosure of claim 3 and further comprising a first set of hinge posts mounted to the first edge of one of the first sidewall, the second sidewall, the third sidewall, and the fourth sidewall; and a second set of hinge posts mounted opposite to the first set of hinge posts; wherein the door is selectively coupleable to the first set of hinge posts and the second set of hinge posts.

5. The enclosure of claim 3 wherein the first mounting channel and the second mounting channel each include an inward-facing side that include apertures to serve as mounting locations, the inward-facing sides being angled to allow access to fasteners.

6. The enclosure of claim 5 wherein the inward-facing side forms an angle of approximately 70 degrees with respect to the first sidewall, the second sidewall, the third sidewall, and the fourth sidewall.

7. The enclosure of claim 3 wherein the mounting panel is hingedly coupled to the side channel to allow the mounting panel to swing open to reveal electronic components normally concealed by the mounting panel.

8. The enclosure of claim 3 wherein the at least one flange mounts the first end of the side channel to the first mounting channel without additional hardware by the at least one flange being received in an aperture along the first mounting channel.

9. The enclosure of claim 3 and further comprising a gland plate removably coupled to the first mounting channel and the second mounting channel, the gland plate forming a section of one of the first sidewall, the second sidewall, the third sidewall, and the fourth sidewall.

10. The enclosure of claim 3 and further comprising a backwall coupled to second edges of the first sidewall, the second sidewall, the third sidewall, and the fourth sidewall.

11. The enclosure of claim 3, wherein the mounting panel is removably coupled to the side channel by engaging at least one mounted standoff, the at least one mounted standoff being removably coupled to the side channel.

12. The enclosure of claim 11, wherein the mounting panel includes at least one perforation, the at least one perforation engaging the at least one mounted standoff.

13. The enclosure of claim 11, wherein the mounting panel includes at least one mounting hole.

\* \* \* \* \*